United States Patent [19]
Reeb

[11] Patent Number: 5,294,290
[45] Date of Patent: Mar. 15, 1994

[54] COMPUTER AND ELECTROMAGNETIC ENERGY BASED MASS PRODUCTION METHOD FOR THE CONTINUOUS FLOW MAKE OF PLANAR ELECTRICAL CIRCUITS

[76] Inventor: Max E. Reeb, Helfensteinstrasse 7, D-7336 Uhingen, Fed. Rep. of Germany

[21] Appl. No.: 954,455

[22] Filed: Sep. 30, 1992

Related U.S. Application Data

[63] Continuation of Ser. No. 726,633, Jul. 1, 1991, abandoned, which is a continuation of Ser. No. 539,697, Jun. 18, 1990, abandoned, which is a continuation-in-part of Ser. No. 155,154, Feb. 11, 1988, Pat. No. 4,935,093, which is a continuation-in-part of Ser. No. 908,901, Sep. 18, 1986, Pat. No. 4,792,790, which is a continuation of Ser. No. 589,086, Jan. 31, 1984, abandoned.

[30] Foreign Application Priority Data

Jun. 7, 1982 [DE] Fed. Rep. of Germany ....... 3221500

[51] Int. Cl.$^5$ .......................... B44C 1/22; C23F 1/00
[52] U.S. Cl. .......................... 156/630; 156/634; 156/643; 156/659.1; 156/902; 156/645
[58] Field of Search .................. 156/629–634, 156/643, 645, 656, 659.1, 242, 272.6, 901, 902; 29/846, 847; 428/209, 901; 174/250, 254, 259; 219/121.85

[56] References Cited

U.S. PATENT DOCUMENTS

| | | | |
|---|---|---|---|
| 2,849,298 | 8/1958 | Werberig | 156/634 |
| 2,943,966 | 7/1960 | Leno et al. | 156/901 X |
| 3,215,574 | 11/1965 | Korb | 156/634 X |
| 3,526,573 | 9/1970 | Kepple et al. | 156/630 X |
| 4,935,093 | 6/1990 | Reeb | 156/643 X |

Primary Examiner—William A. Powell

[57] ABSTRACT

The new method concerns the custom designed lowcost mass production of flexible planar circuits which suit particu-larly for one time use and carry complex prints on at least one face thereof, as may be e.g. RF sensitive tickets or marker tags for electronic security systems. The construction both of planar electrical circuit and printed outfit elements in mutual alignment with each other is based on continuous light printing routines in combination with a production carrier protection and a post etching routine. Light printing may be of the LASER, LED, LCS or like type. The method is computer orchestrated and rolls off prior art barriers in view of limits for custom designs of shape, face, outfit, electrical, and even RF properties of such circuits. Custom designs are easily layouted onscreen of a modern personal computer. The data obtained thereof are downloaded to the production line. Changing, hopping sweeping and tuning custom circuit and print designs, without any format restriction and at full process speed is unprecedentedly introduced. Forming tools have been abandoned. As an exclusive longlife production tool electromagnetic wave energy is extensively used. The production web can be selected from a wide choice of materials and thus define circuit properties from flexible printed circuit wafers over tear-resistive spunbond labels to paper-like tags or stickers which may even be washed and sewn and nicely go one way with a pretty commercial face.

72 Claims, 17 Drawing Sheets

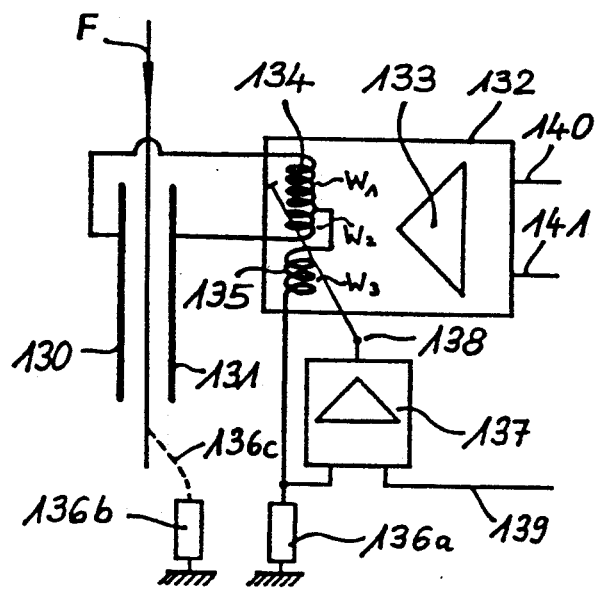
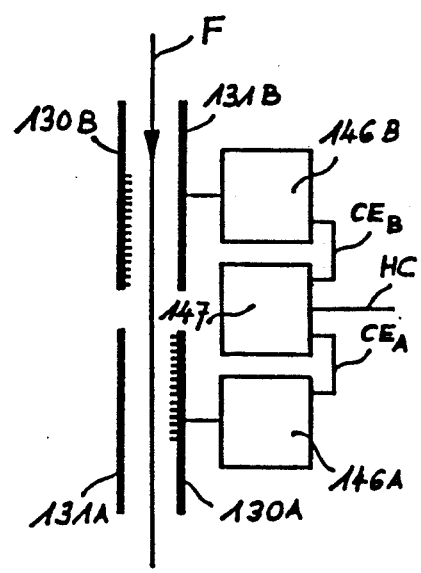
FIG. 4A    FIG. 4B
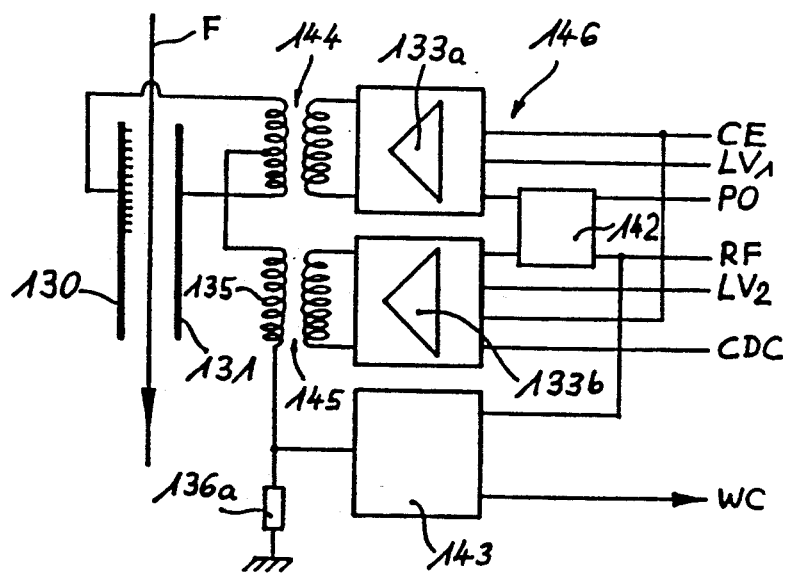
FIG. 4C

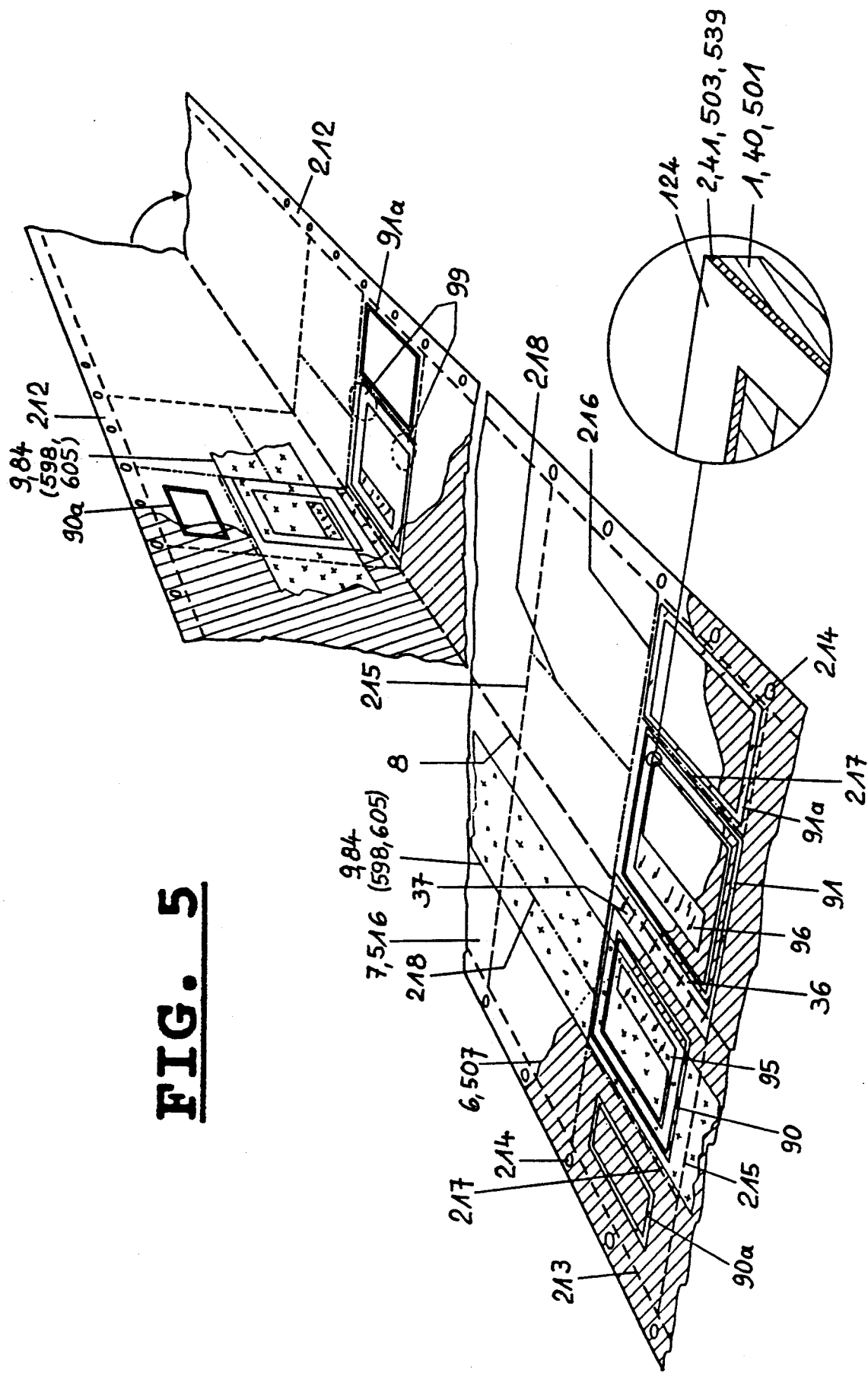

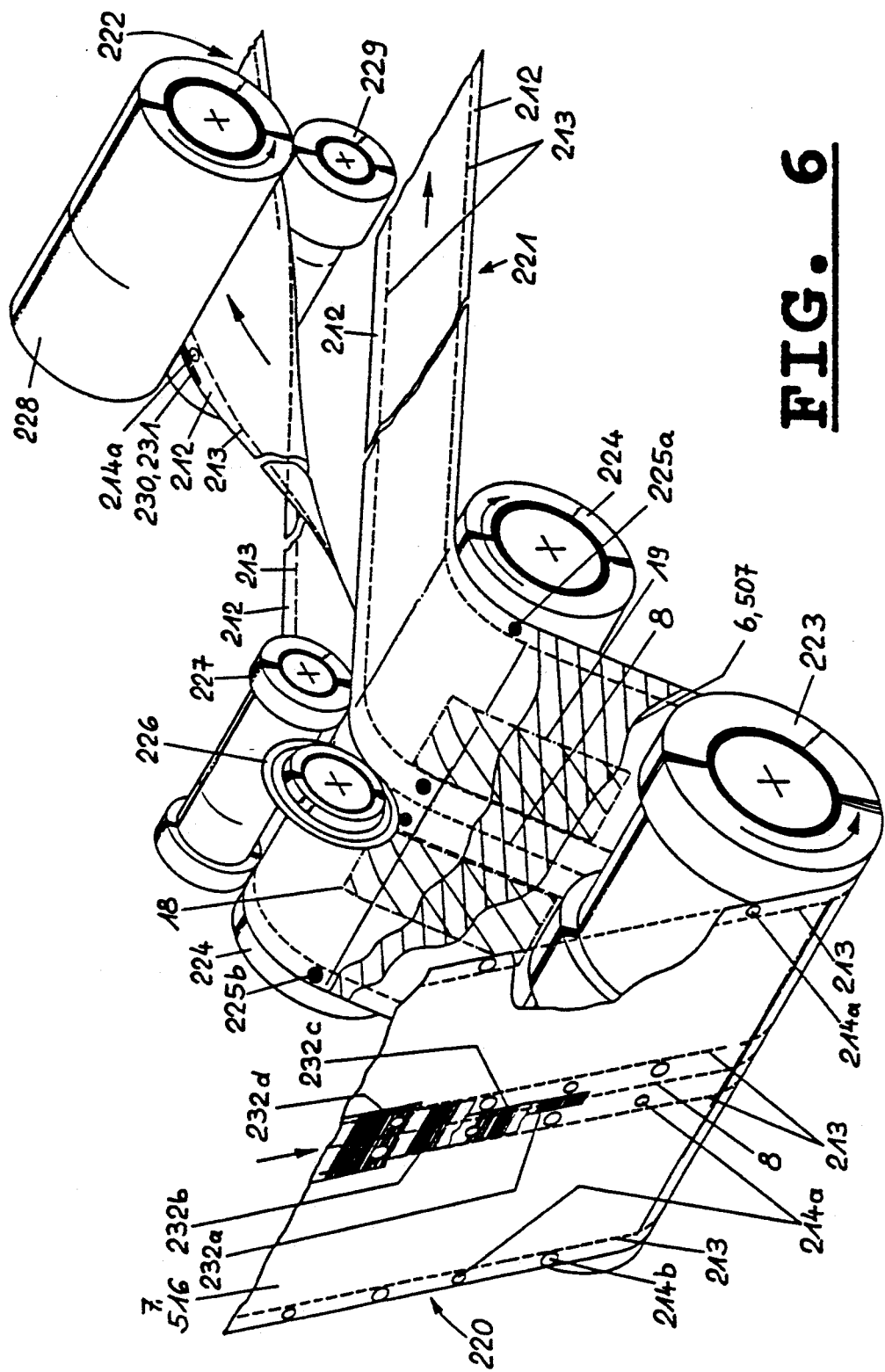

COMPUTER AND ELECTROMAGNETIC ENERGY BASED MASS PRODUCTION METHOD FOR THE CONTINUOUS FLOW MAKE OF PLANAR ELECTRICAL CIRCUITS

This patent application is a continuation of U.S. Ser. No. 07/726,633 filed Jul. 01, 1991 (abandoned), which is a continuation of U.S. Ser. No. 07/539,697 filed Jun. 18, 1990 (abandoned), which is a continuation in part of U.S. Ser. No. 07/155,154, filed Feb. 11, 1988, now U.S. Pat. No. 4,935,093, which is a continuation in part of U.S. Ser. No. 06/908,901 filed Sep. 18, 1986, now U.S. Pat. No. 4,792,790, which is a continuation of U.S. Ser. No. 06/589,086 filed Jan. 31, 1984 (abandoned), claiming priority German patent application P 32 21 500.2, filed Jul. 06, 1982, and PCT patent application DE 83/00102, filed Jul. 06, 1983.

INFORMATION DISCLOSURE STATEMENT

Reference is made to the following applications and publications, the disclosure of which is hereby incorporated by reference:

U.S. Pat. No. 4,694,283, based on Ser. No. 513,970, filed Jun. 29, 1983, Inventor REEB, claiming priority German Application P 31 43 208.5, filed Oct. 30, 1981, to which PCT Application DE 82/00210 corresponds;

U.S. Ser. No. 07/902,406 filed Jun. 19, 1992, which is a continuation of U.S. Ser. No. 07/611,313 filed Nov. 13, 1990, which is a continuation of U.S. Ser. No. 07/488,403, filed Feb. 28, 1990, abandoned, which is a continuation of U.S. Ser. No. 934,601 filed Nov. 7, 1986, Inventor REEB, claiming priority German Application P 35 08 369.7, filed Mar. 8, 1985 and PCT Application DE 85/00098, filed Apr. 17, 1985;

U.S. Pat. No. 2,943,966, based on U.S. Ser. No. 474,566, filed Dec. 10, 1954, Inventors LENO and SEARLE;

U.S. Pat. No. 2,849,298, based on U.S. Ser. No. 505,791, filed May 3, 1955, Inventor WERBERIG;

U.S. Pat. No. 3,215,574, based on U.S. Ser. No. 267,664, filed Mar. 25, 1963, Inventor KORB;

U.S. Pat. No. 3,526,573, based on U.S. Ser. No. 832,097, filed Jun. 11, 1969, which is a continuation in part of U.S. Ser. No. 533,026, filed Mar. 9, 1966, Inventors KEPPLE et al.;

U.S. Pat. No. 3,913,219, based on U.S. Ser. No. 473,187, filed May 24, 1974, Inventor LICHTBLAU;

U.S. Pat. No. 4,369,557, based on U.S. Ser. No. 176,061, filed Aug. 6, 1980, Inventor VANDEBULT, corresponding with PCT publication WO 82/00541;

U.S. Pat. No. 4,482,874, based on U.S. Ser. No. 385,008, filed Jun. 4, 1982, Inventors RUBERTUS & TAIT;

European Patent Application No. 84104174.2 (Publication No. 122 619), filed Apr. 13, 1984, Inventors SALAMONE, HOOVER & VANDEBULT, claiming priority U.S. application Ser. No. 485,328, filed Apr. 15, 1983;

U.S. Pat. No. 4,598,276, based on U.S. Ser. No. 667,607, filed Nov. 6, 1984, Inventor TAIT;

U.S. Pat. No. 4,658,264, based on U.S. Ser. No. 669,752, filed Nov. 9, 1984, Inventor BAKER.

BACKGROUND OF THE INVENTION

1. Field of the Invention

The present invention relates to the mass production of thin, flexible lowcost circuits of arbitrarily definable shape. More particularly, the process according to the present invention is useful for the customized mass make of thin, planar Radio frequency [RF] resonant circuits including inductive and capacitive elements, as are commercially desired as marker means in Electronic Article Surveillance [EAS] systems, in Electronic Personnel Access Control [EPC] systems, in Electronic Anti-Counterfeit [EAC] systems, and in most modern Object Handling Control [OHC] systems, e.g. electronic document safe systems, clinical supply systems, electronic flight baggage and ticket control systems, and the like.

The invention further concerns the computerized nonstop mass production of such circuits for one time use, and breaks down prior art barriers in view of limitations for custom designs of shape, face, and resonant properties of such circuits. Custom designs of circuits are easily layouted onscreen of a modern personal computer The data obtained thereof are downloaded to the process line Hopping custom circuit and face designs with ease is unprecedentedly introduced. Forming tools have been abandoned. As an exclusive longlife production tool electromagnetic wave energy is extensively used. The circuits may be washed and sewn and attract their user with a pretty face.

U.S. Pat. No. 3,913,219 (LICHTBLAU) describes a production process for the make of planar electrical circuits comprising a dielectric sheet and having an inductively reacting conductive spiral path made from an appropriate metal foil and bonded to one side of said dielectric sheet. Said spiral path terminates, at each end, via at least one connection means, into first and second conductive areas being in a mutually aligned opposition and spaced by said dielectric sheet, thus forming a discrete capacitor. Said capacitor and said conductive spiral thus cooperate to form an LC resonant circuit The production method is tied to stringent problems and limitations, as follows:

Production starts up with a special trilayer material resulting from a difficult collamination process of two aluminum layers of widely differing thickness (typical 8 $\mu$m and 50 $\mu$m) with a polyethylene layer. The latter must exhibit very close tolerances in view of thickness (normally about of 25 $\mu$m±5 $\mu$m) and dielectric permittivity, and hence has to be produced off-line, in a special apparatus, at extra speed, and thus is expensive. First waste results between its shock cooled high density extrusion and its heated collamination between said aluminum layers, at a considerably low speed. Then, applying known roto-printing techniques, etching resist patterns are printed, mutually in register, on both faces of the composition and dried, at high speed. Due to the roto-printing technique, the print is of the fixed formatted type, which means, the circuit patterns repeat at a constant pitch or spacing on the circumference of the printing cylinder. Though printing is performed with a high repetitive register accuracy of the resist structures defining the resonator to be constructed, a repetitive in-register condition is maintained only for a very short time from the following reason.

When etching, the entire processing web starts up shrinking, owing to strains frozen in the polyethylene during recrystallization in the early moment of its collamination with said aluminum layers aided by heat. These strains get active, once wide areas and spirally turn-to-turn spacings have been removed, and thus cancel a previously achieved in-register condition on the yet unetched web both in its along and across direction.

Further, etching taken alone is a slow process step, since modern fast etching techniques—due to their inherent poor overetch protection—cannot be utilized. This is from the following reason. Etching must take place on both faces of the composition simultaneously, meaning, that the etching of aluminum layers having a widely different thickness (e.g. 8 μm and 50 μm) should be finished right at the same time. Overetching and out-of-register waste is the result.

Shrinking encounters the problem, that the endless processing web representing a plurality of resonant structures cannot be combined, as circuit's face, with an endless cover material preprinted with an individual outline per circuit repeating at a constant resonator pitch or space, since due to lost in-register condition no precise alignment of a resonantor and a preprinted circuit face (so as to mate and cover each other) can be maintained. Further, since the inconsistent multilayer construction of the fully finished circuit from other reasons can be printed merely asynchronously by aid of low quality rubber-flex techniques, this known process neither yields standard circuits printed in a fixed print-to-resonator register, nor yields circuits according to changing or hopping custom design specifications, e.g. including an attractive color print.

Further problems encounter with that method, since immediately a upon etching the processing web, due to its filigree shape, is most complicated to handle, to advance and to position, just in a state in which such should be facilitated and carried out quickly. Again waste is a result. For an improvement, it is not allowed to thicken the polyethylene layer for stabilization, otherwise the RF performance of resonators would dramatically drop provided such circuit should be made as small as possible which is, however, a common desire. Further problems encounter with the need, that the two metal layers have to be contacted through said polyethylene layer's normal thickness of 25 μm. Such thru-contacts proved to be unreliable; "dead" circuits use already to appear among good ones when shipped from the factory.

Chemical agents as being in worldwide use with the recreation of fashions and garments not only destroy these contacts. These agents dissolve and float off the roto-printable etchant resistive pattern, which is left back surplus in the circuit construction once etched. Hence, circuits of this make may even mediate or cause heavy degradations and deteriorations of suchlike treated fashions in a much later state, provided such circuits are made just for one way use for walking away with customer's buy. Moreover, though said polyethylene layer is considerable costly and its properties are essentially needed merely in a considerable small place of the entire resonator construction, this layer is very inefficient, since wasted over the entire circuit area (wasted precision is wasted money). As an overall result, these problems and the restrictions for the finished product concluded thereof qualifies this method as inapplicable for making disposable one way RF marker circuits, which also serve for quite other functions, a variety thereof having been disclosed in more recent patent applications of applicant.

U.S. Pat. Nos. 4,482,874 (RUBERTUS & TAIT) and U.S. Pat. No. 4,598,276 (TAIT) describe a method of producing novel high efficiency marker devices the unique design scheme of which having been taught in U.S. Pat. No. 4,694,283 granted to applicant. This method is based on a complex stamping routine which utilizes a most delicate domino stamping tool. It has a fixed design and requires steady performance control, service, and exchange on elapse of its short lifetime. This means, that such production cannot be run continuously 24 hours/365 days a year, at a minimum dead time. However, a minor advantage is obtained with this method over that mentioned above, so far as the pitch or spacing between resonators may be influenced at some degree, however, by encountering complex mechanics along the production line, provided such resonators should be covered in register with a paper face already on-line. However, owing to a limited dimensional precision of any cover material to join the endlessly produced resonator web, preprinting such cover material harvests all the same out-of-register problems with an attempt to have individual resonator structures superpose in a perfect alignment individual cover face prints.

U.S. Pat. No. 4,658,264 (BAKER) also repeats the basic construction scheme of the planar stripline resonator as disclosed in U.S. Pat. No. 4,694,283. However, it is not taught how to assign to such resonator a precisely registered print on its usable outer face, or how to design such resonator for facilitating its fitting between most modern cover materials, for giving it even a tex-like appearance or the capability of being washed and sewn. Oppositely, this Patent centers merely on the task of how to fold over a substantially filigree and inconsistent substrate for a registered alignment of folded over portions with a precision of alignment sufficient enough, as has been likely reflected in applicant's prior publications.

U.S. Pat. No. 4,369,557 (VANDEBULT) repeats major portions of the LICHTBLAU process, however, with an important distinction so far as the trilayer compound as a production carrier is exchanged for a dual layer one Thus, etching of a constant thickness metal layer is carried out merely on one face of a thin and dimensionally unstable dielectric layer which, however, again and all the same has to serve for production carrier's function. Consequently, all other problems and restrictions of the LICHBTLAU process are imported and maintained. Hence, that Patent does not teach how to produce one way RF marker circuits offering a modern cover face designed according to whatsoever customer's specifications.

European Patent Application No. 84104174.2 (SALAMONE, HOOVER & VANDEBULT) discloses a method of fabricating respective circuits by electrolytically depositing and growing up resonator structures. The process applies fixed format silk screen printing electrically conductive patterns on a thin dielectric film, as may be of polyester. Then, this film and patterns are subjected to a very slow electrolytic deposition routine. Since this method, too, does not yield a marketable product rather than mere (bare) resonators, it is also in conflict with the described out-of-register drawback, so that this process has also to be considered as off-limits for the mass production of RF marker circuits going both one way and customized, reading with a whatsoever pretty commercial face.

U.S. Pat. No. 2,943,966 (LENO and SEARLE) describes an inductive element formed by folding over an insulative sheet provided with conductive paths so that upon folding said paths configure as a coil which turns continuously. For this purpose, a conductive path may turn thru in its respective plane by 360 degrees. The insulative sheet is utilized for preventing short circuits between superposed conductive paths. The Patent does not refer to a fabrication of said insulative sheet, and refers neither to a dielectric layer provided on a face of conducutive paths nor to a precisely rated capacitance of a circuit, hence to no resonant feature of a finished circuit. No printed face as a "commercial face" is being referred to and definitely aligned with an "electrical face" of a carrier material.

U.S. Pat. No. 2,849,298 (WERBERIG) describes a process utilizing etching for forming conductive paths on a tenaceously adhering plastic film particularly in a way so that a slow compression betwewen heated platens leaves said conductive paths "embedded and locked in the laminate in flush relation thereto". The Patent does not refer to the make of a capacitor's dielectric layer, and hence refers neither to a dielectric layer provided on a face of conducutive paths nor to a precisely rated capacitance of a circuit, hence to no resonant feature of a finished circuit. No printed face as a "commercial face" is considered and definitely aligned with an "electrical face" of a carrier material. Obviously, Werberig did not think in terms of designing whatsoever condutor path patterns asynchronously, meaning, with a size an integer multiple of which does not equal a ion drum's circumference.

U.S. Pat. No. 3,526,573 (KEPPLE et al) describes a way of making flexible flame retardant foil-clad laminates having one or more printed circuits adhesively bonded to a flexible sheet made from a fibrous base material. Said base material may be impregnated and covered with a fully curved synthetic resin insulating material; the printed circuit composition does not deform when subjected to heat and exhibits an excellent dimensional stability.

U.S. Pat. No. 3,215,574 (KORB) describes a method for making thin flexible plastic-sealed printed circuits which utilizes, in a discontinuous additive manner, the temporary adherence (presence) of a fibrous material for stabilizing circuits under manufacture, for then beeing completely removed from the product in a later step.

The present invention not only accomplishes the object of overcoming the aforedescribed shortcomings and limitations.

It opens a new horizon for making mass marketable electrical circuits which feature custom designs and outfits to fill catalogs. Therefore, the present invention breaks with prior art methods, for thus defining a new reference standard of the state of the art, which becomes obvious from the listing of objects of the present invention, as follows:

Producing a continuous flow at constant process speed, no acceleration or deceleration of the production web, no rolling and unrolling of component materials;
Abandoning spoolers;
Abandoning forming tools;
Abandoning the waste of precise and/or precious materials;
Abandoning the production of construction materials off-line for having them imported on-line;
Abandoning etching of metal layers having different thicknesses, once at a time;
Abandoning out-of-register waste due to a shrinking or creasing production web;
Abandoning unreliable electrical contacts;
Abandoning close tolerance raw materials;
Reducing heat stressings of the production carrier;
Allowing less close tolerances of materials and/or structural components, thus utilizing inexpensive materials or components;
Reusing waste to be recycled;
Generating and/or feeding on-line vulnerable construction materials in a most late production state;
Producing dielectric layers on-line on demand with properties just as currently required, and not accepting circuit's performance drop by misuse of such layers for carrier functions;
Boosting thereby circuit's RF performance over prior art;
Throwing off circuit all surplus materials which could lead to deterioration of fashions or garments due to their recreation;
Utilizing a production carrier which can be handled precisely, at high speed, in any production step, under perfect position and register control;
Allowing novel and modern cover materials in fashion and inexpensive paper as well as a production carrier;
Making circuits having a tex- or tissue-like appearance and being resistive to attempts of tearing;
Making RF marker circuits which can be washed and sewn;
Registering an electrical circuit and a cover face print of such circuit thru the entire production line;
Custom designing RF marker circuits with arbitrary shape, dimension, field layout and print face;
Economically producing even smallest lots of circuits (e.g. a few hundreds) according to customer's specifications;
Changing and fine-tuning designs of circuits in a short period of time or even at full production speed;
Overcoming idea papers, drafts & drawings, scratch pads, models, layouts, films, microfiches for the design of whatsoever customized planar electrical circuit, and doing all of the design onscreen of a personal computer, and downloading for execution designs at full process speed;
Utilizing graphics design & construction software (e.g. a desktop publishing software) on whatsoever personal computer on customer's site, and receiving customer's layout and design ideas as data frames via a communication line, and feeding customer personal designs into the production line, for a quick turnaround and shipment of customized circuits on same day or night; and
Changing and hopping circuit designs at a freedom which is just the freedom to change News in the New York Times.

SUMMARY OF THE INVENTION

Abbreviations and Marks used

CPC: Central Process Computer
DC: Design Computer
FFT: Fast Fourier Transform
LC: Inductive/Capacitive
MW: Microwave
POS: Point Of Sale
PW: Production Web
RAM: Random Access Memory
RF: Radio Frequency
ROM: Read Only Memory
RPM: Revolutions Per Minute
SPC: Sub-Process Controller
SC: Scan Composer TC: Tuning Controller
TW: Transfer Web
  GEM TM of Digital Research Inc., USA
  KEVLAR TM of E. I. Du Pont de Nemours & Co. (Inc.), USA
  Macintosh TM of Apple Computer Inc., USA
  TYVEK TM of E. I. Du Pont de Nemours & Co. (Inc.), USA
  THERMOTHEN TM of Maria Soell GmbH, FRG
  VAX TM of DIGITAL EQUIPMENT Corp., USA The present invention accomplishes the above objects in a single stroke, by way of uniquely "light printing", in connection with a postetching routine, both a metal and an insulative coat on top onto a pretreated, sufficiently rigid, and dimensionally stable production carrier which can be transported and processed with high positional accuracy and speed. This operation is carried out with reference to a defined register means. The material for the insulative coating is selected so that it serves both for a necessary etchant resist and a desirable electrical function. The production carrier material is chosen as circuits later face material. On its rear face, the production carrier may be printed with state of the art high resolution multi-color prints. Registering prints to join and mate electrical circuits is automatically picked up and maintained under a CPC's control for carrier's positioning and advance, so that both electrical structures and covering prints may be generated in locally offset stations without lacking or loosing a print-to-circuit register, even under longitudinal drifts of the production carrier thru the production line, over its full input-output span.

Therefore, in an early station of the production line at least a marginal track of the carrier is provided with an endless pilot means. In a simple embodiment of the invention, such pilot means may be suitably brought in grip holes, which at least in a pattern scheme or in succession periodically repeat, the position of which holes may be read out either mechanically, optically or inductively. However, since grip holes may encounter a bottleneck for production carrier's speed, or may encounter, under an etching condition, a degradation of specific production carriers in the periphery of such holes (intrusion of etchant into the carrier) and hence might call for enhanced rinsing and cleansing efforts (which also slow down production speed), the invention includes a grip-holeless blank-carrier high speed management scheme for the production carrier.

According to this scheme, at least on a special carrier track, an endless and periodically repeating pilot code is deposited, which code may be read out in every processing station for its feedback to said CPC. Fed back positional data are submitted therein to an interpolation routine according to a moving track and hunt scheme (e.g. applying FFT of time deviations) for precisely interpolating any point on and the current location and position of the production carrier as well. Said CPC further compiles, by virtue of a management program, a position map in the kind of a column shift register. For each of the plurality of mating prints and circuits currently in creation along the entire line (that is for each later finished circuit) a special register column is implemented by software. At least two, however, preferably more than two different register informations are being deposited in specific cells of such column. Preferably the constant absolute carrier position code assigned at carrier's line entry and a continuously updateable deviation measure or coefficient either in the time or carrier's longitudinal position domain are entered. A respective update may be executed after each reading out of the actual carrier position in whatsoever processing station which requires successive register control (such deviation term normally obtained as a normalized value resulting from a continuous calculation in the CPC).

By way of this scheme, said CPC is fully "informed" on the production carrier position status along the line, that means, on all local deviations from its normal carrier speed (which deviations encounter either looping tendencies or strains), which call for a servo compensation in terms of carrier's advance or cylinder RPM speed of either next processing station. Hence, by aid of this "column shift register" any circuit print or electrical structure to arrive in whatsoever processing station may be real-time announced and assigned one to each other, at any time, same as the location of individual parts thereof, produced at different times. Thus, every circuit's respective column containing its carrier position code may be shifted through said program exactly according to circuit's printed and electrical components, shift or cruise thru the entire production line, at the output of which for each finished circuit the respective column is abandoned and substituted by a newly born one, into which a data string of the new carrier position is loaded, which is being deposited, just as the above mentioned endless pilot code, at carrier's line entry, at same time.

Further, by this scheme any shrinking or creasing of production carrier's dimension may be allowed, since every processing step requiring in-register conditions is executed once a locally real time decoded carrier position gated or masked with at least one conditional processing instruction has issued from the CPC as a step enable signal. Since the repetition rate of electrical structures may be randomly selected and then kept locked in to the actual repetition rate for tracking circuit's printface and outline dimensions, a fully auto-aligning production is accomplished, which is not only capable of producing whatsoever kind of customized circuits. More: Carrier materials having widely differing dimensional properties or being already kept on stock preprinted with customer's favorite colors, prints, or logos may be changed within seconds, so that the a line can be run most effectively for full duty, and so that even small customized production lots may be produced by job hopping at a minimum loss of duty time.

The entire circuit design appearing to the viewer (commercial face), including perforations and marginal or circumferential cut lines, may be carried out on an advanced personal computer, preferably under GEM control, e.g. on a machine as is commonly known Macintosh. The resulting graphics instruction set is then downloaded to the CPC, whose program cares both for the properly assignment and assembly of printed and electrical circuit components produced on the carrier in register one to each other, however, at different times, and for controlling the line so as to obtain, within a specifyable statistical deviation, the desired electrical properties of electrical circuits put out at a selectable yield rate (normally depending on output speed).

One of the fundamental ideas of the invention has been exchanging costly high precision raw materials by less precise and less costly ones, which can be recycled, and, as a compensation therefor, and for avoiding out-of-specifications-waste, engaging closed loop computer control of novel processing steps, which most gently and with a practical high speed response can make a continuous effect on product's electrical properties. Such may be, e.g., the closed loop power or duty cycle or frequency control of an RF or MW energy source, or even the pulse power or duty cycle control of a chopped RF corona field.

In combination with a high speed ultrasonic aided post etching routine, said insulatively coated metal layer may be "light printed", just as is known to xerographically deposit a printer toner in any place of a paper, meaning, in an absolutely free, say arbitrary fashion, which is alterable, updateable, and optimizable real-time, at full production speed. Said insulative coating, serving as an etchant resistive pattern, is deposited from a non-conductive raw material either directly or indirectly by aid of controlled light. Said insulative coating also serves for spacing functions, so far as conductive paths should shortlessly face or cross each other in the finished product. Said coating is neither installed idling, nor needs to exhibit costly precision, nor is capable of deteriorating fashions when treated with standard chemical agents for cleaning or recreating such goods. In a cost-saving way, the novel process benefits from the multi-use of specific raw materials for quite different purposes at different times in production, and, for overcoming any need for shortlife mechanical forming tools, the touchless RF and MW electronics processing tool is introduced. In a special embodiment of the process, an expensive laser apparatus having moving beam deflection means is exchanged with a non-moving fully solid state exposure means, and the utilization of solid-state light emitting devices blanks out a need for high power beam focusing means.

In accordance with the present invention the object of further boosting the economy of the process as disclosed in U.S. Ser. No. 07/155,154 is achieved by that as a conductor path pattern forming tool an electronic light (laser, LED-, liquid crystal shutter, or like) printer is used with some modifications made thereon so as to adapt to the continuity of the process and materials of elements working therein. Either a plurality of light printers may be stacked in parallel for providing the metal faces of a plurality of fractional production webs with same or different dielectric patterns once at a time in parallel, or a single wide format light printer may be used for respectively treating a single production web.

The object of even more flexibly fitting circuits with customized face prints in register with circuit's conductive path structure, and to optimize and redesign and particularly to exchange such prints even at full process speed at same freedom which has been achieved for the respective design and exchange of electrical parts of a circuit in accordance with the present invention is achieved by that as a face printing tool at least zone further light (laser, LED-, liquid crystal shutter, or like) printer is used.

Since respective printing tools are commercially available at a high quality and considerable low cost level and come equipped with computerized pattern processing and memory of their own and need just minor modifications and/or little additional control electronics for a continuous and process-synchronizable standalone or multi-in-parallel operation, their implementation in the process as disclosed in U.S. Ser. No. 07/155,154 leads to an integrated and fully computerized process having an improved control performance and having less hardware needs in the mechanical domain.

The object of facilitating the utilization of very inexpensive papers or like in part cellulose based materials as a production carrier, which can be light printed with conventional electronic office light printers, is achieved by that prints applied before etching—and thereby also the printed face of the PW—are subjected to a protective treatment prior to etching. This treatment causes an at least temporary resistance to wetting and thus to an intrusion of an etchant into finished prints and, as the a case may be, into the cover material, which thereby is taken off subject to deterioration or vulneration when etched.

The method according to the present invention may be advantageously utilized in all fields, in which thin, planar, flexible electrical circuits or conductive path constructions should be produced nonstop and quickly according to hopping customer's specifications, either millions by millions, or hundreds by hundreds, or piece by piece.

Hence, the scope of the invention is by no means limited to the production of RF security marker circuits or the like, though the invention was made in course of an attempt to put a solution to a well-known problem in the RF marker based security art. The title of this application makes therefore no restriction to that special art.

BRIEF DESCRIPTION OF THE DRAWINGS

A more complete appreciation of the invention and the attendant advantages thereof will be more clearly understood by reference to the following drawing figures in which like reference numerals represent like parts and in which same reference numerals have been used or filled in, respectively, as currently provided with U.S. Ser. No. 155,154, or previously provided with U.S. Ser. No. 908,901, or more previously provided with U.S. Ser. No. 589,086 and in which FIGS. $1_A$ and $1_B$ are illustrations of a simple electrical circuit construction being of high commercial interest.

Figures 1A, 1B:
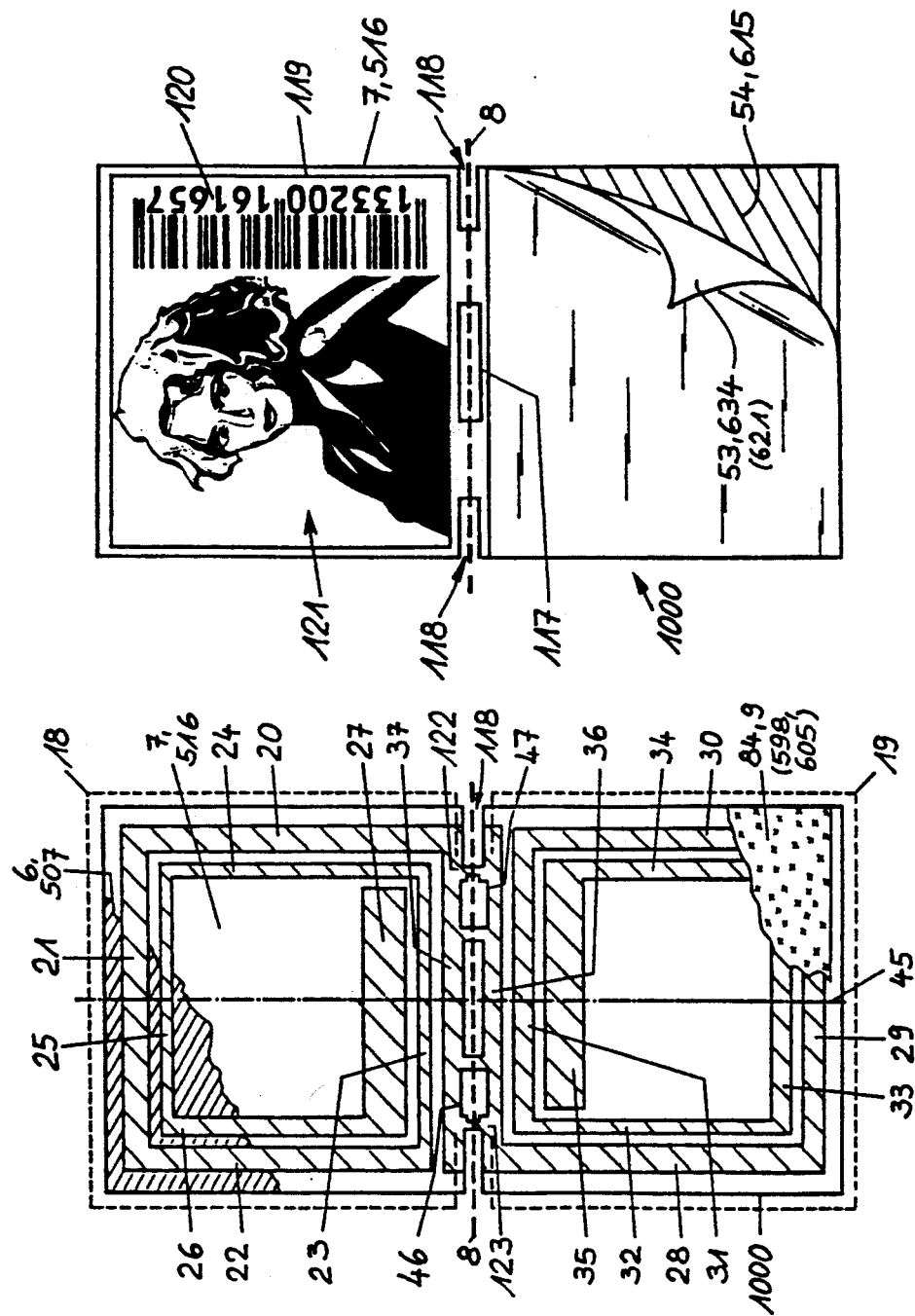
Figure 2:
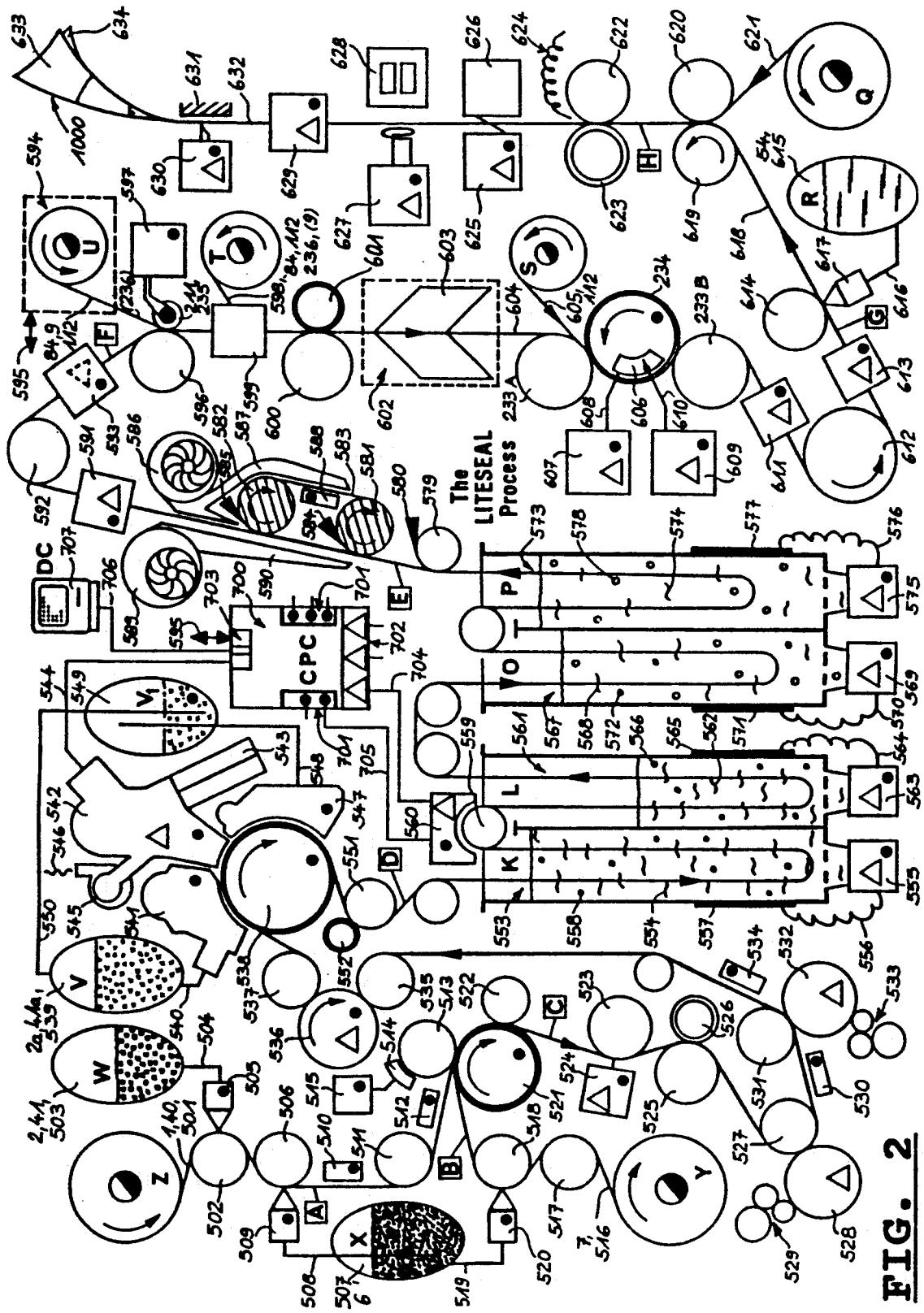
FIG. 2 is a first simplified process diagram, some symbolically indicated processing steps being shown in more detail in the figures to follow hereunder.
Figure 7:
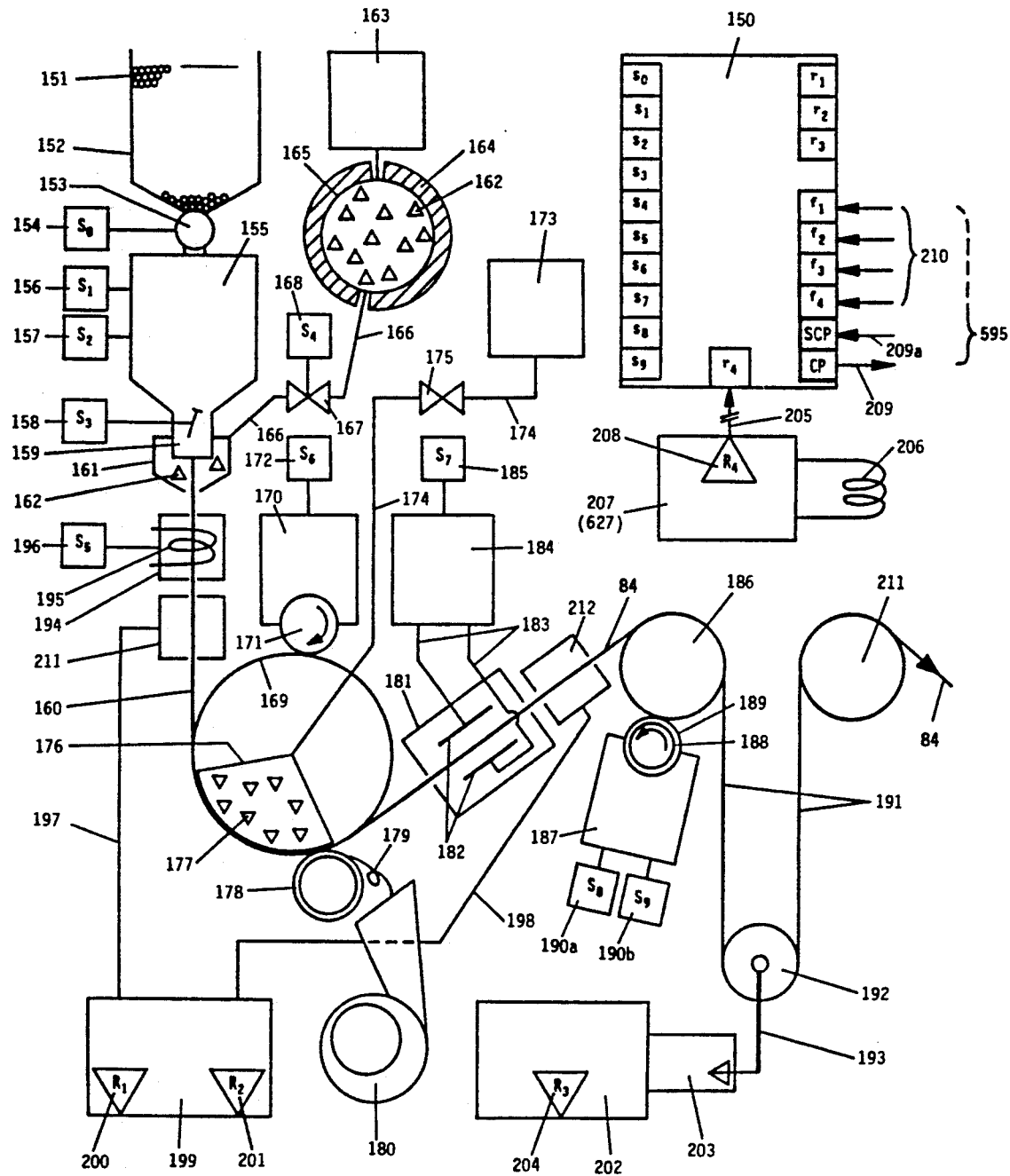
Figure 8:
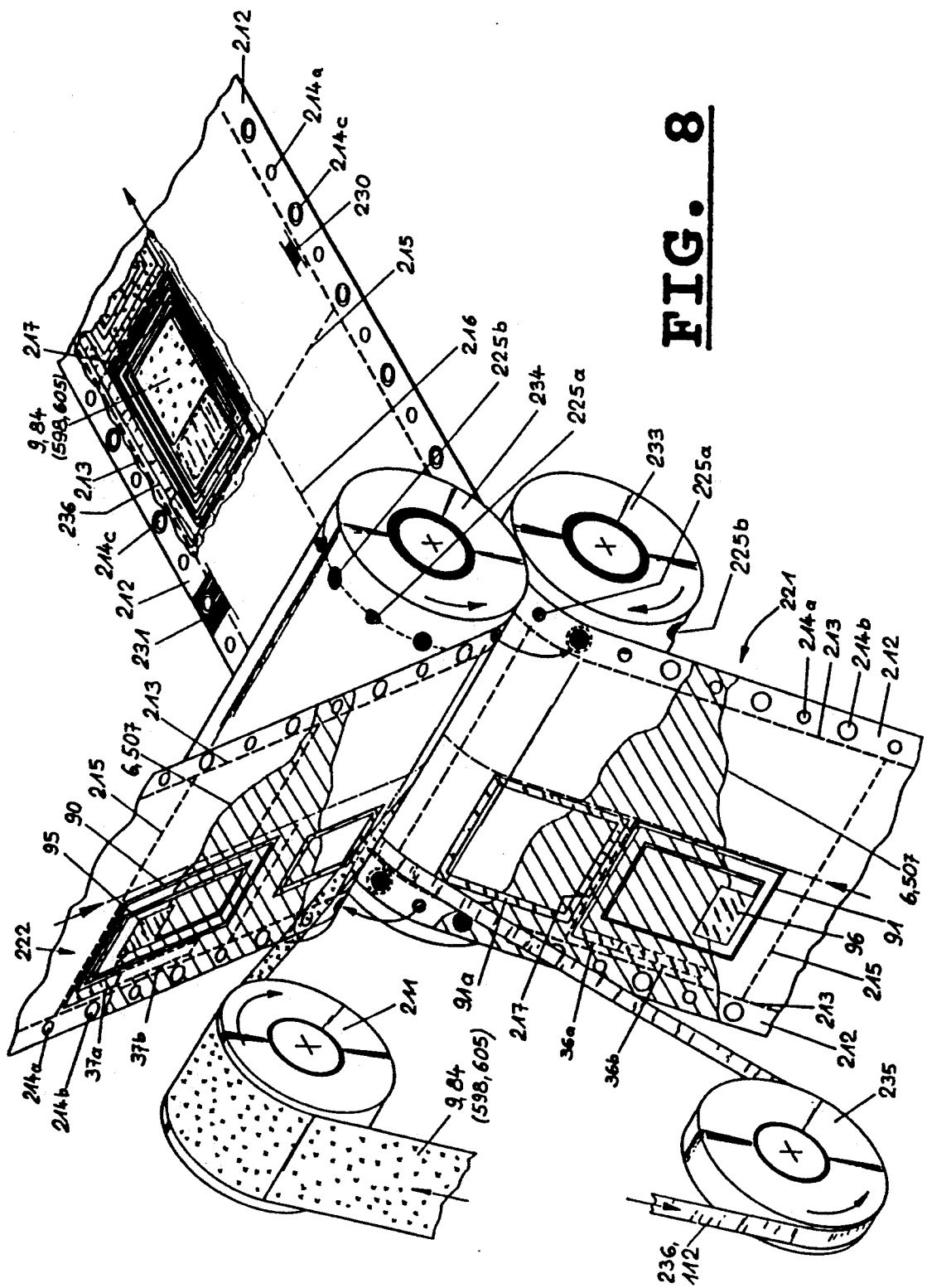
Figure 9:
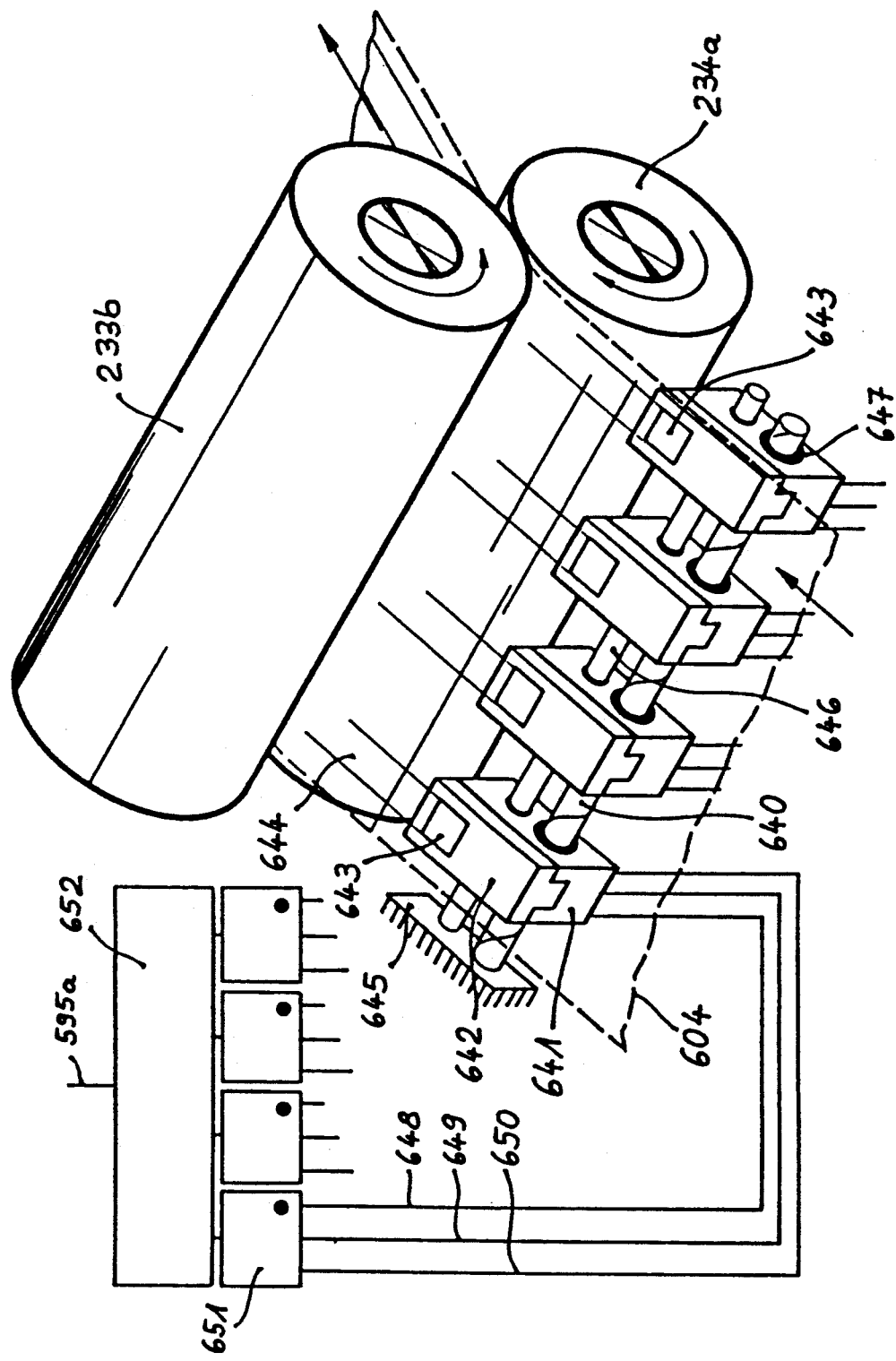
Figure 11:
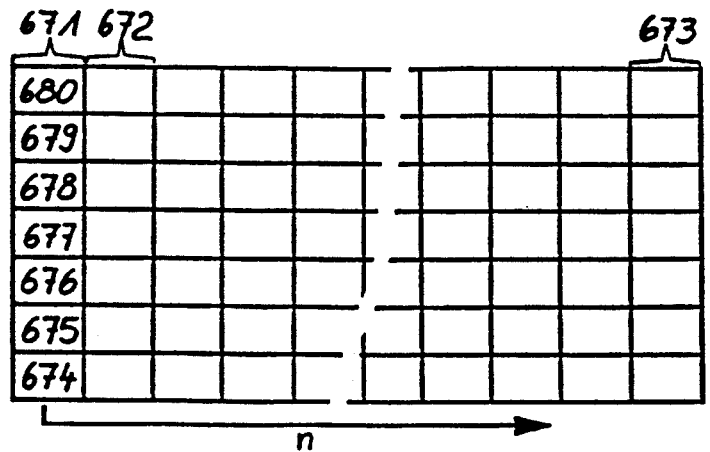
Figure 12:
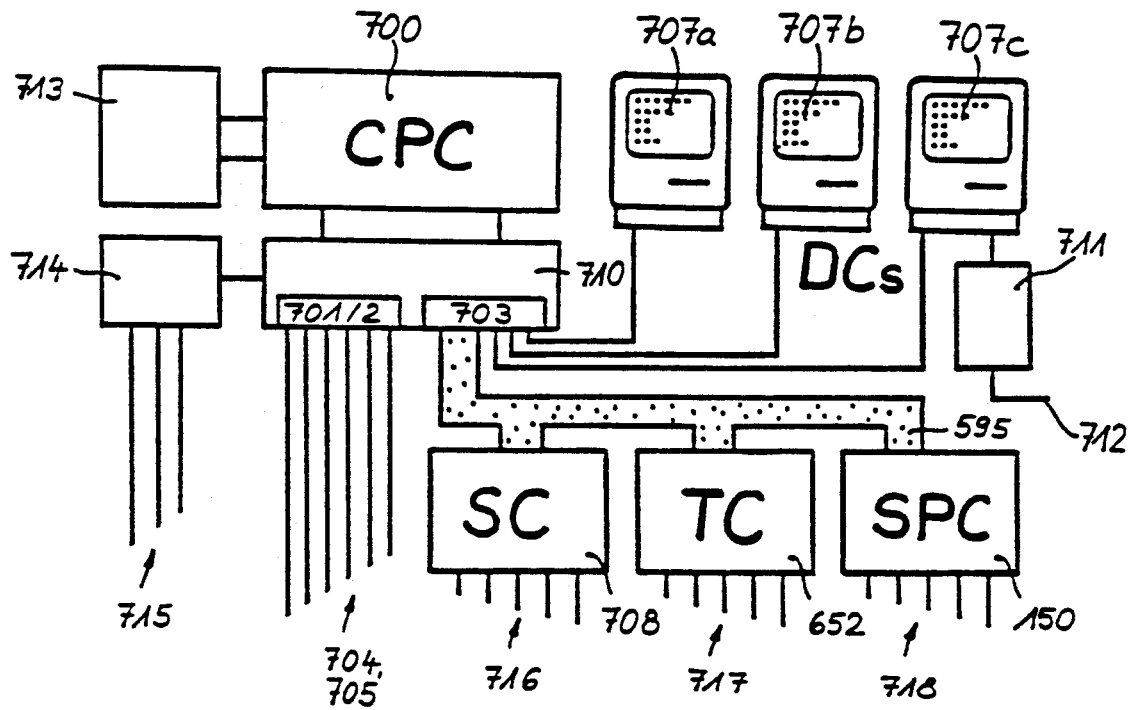
Figure 13:
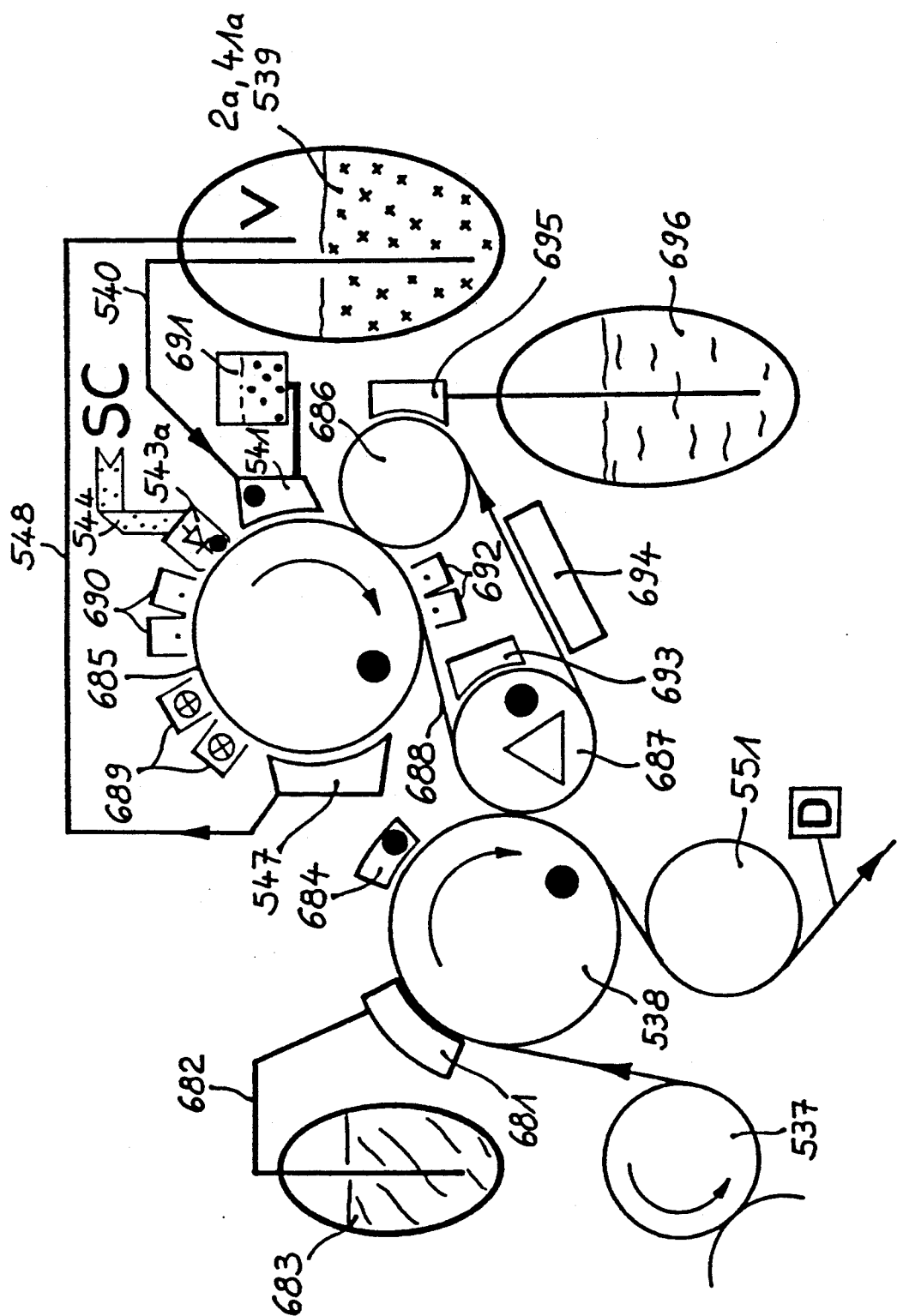
Figure 14:
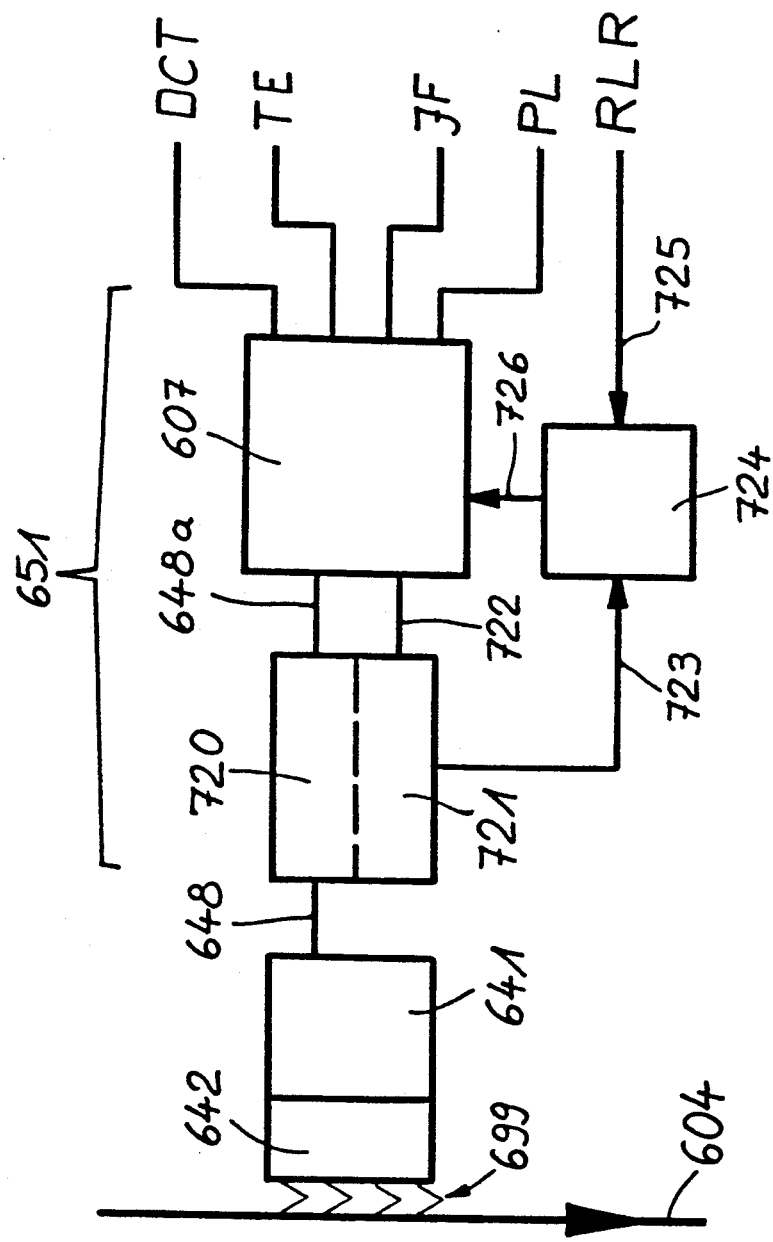
Figure 15:
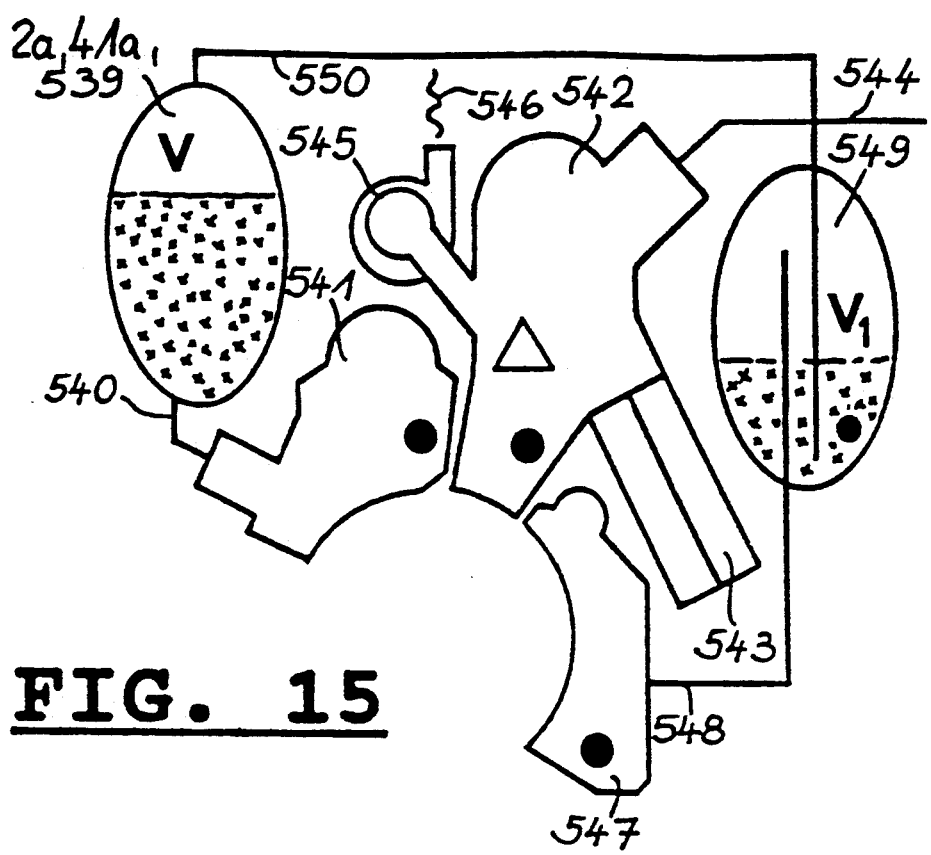
Figure 16:
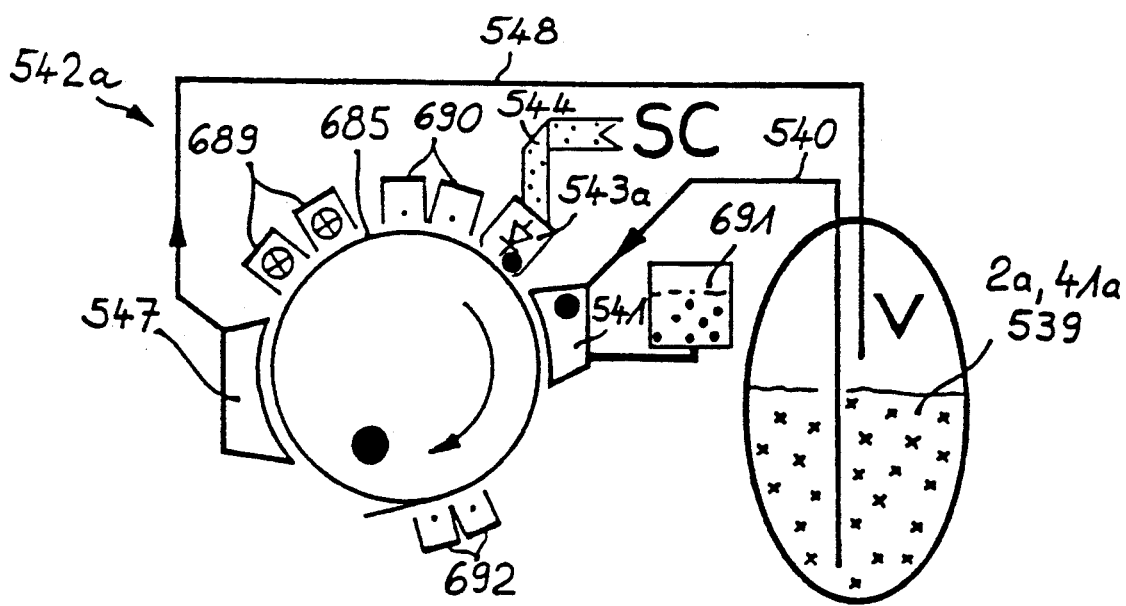
Figure 17:
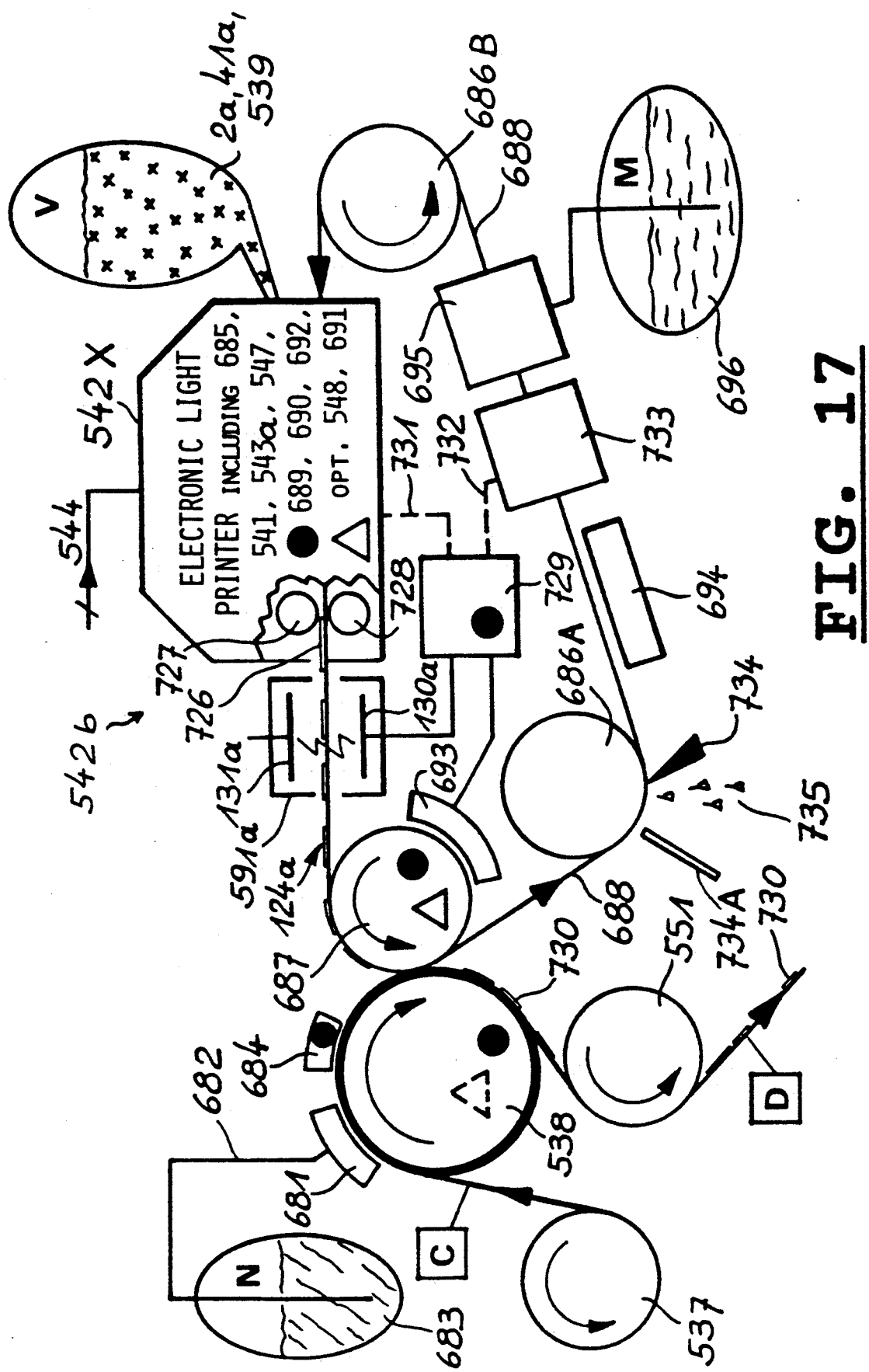
Figure 18:
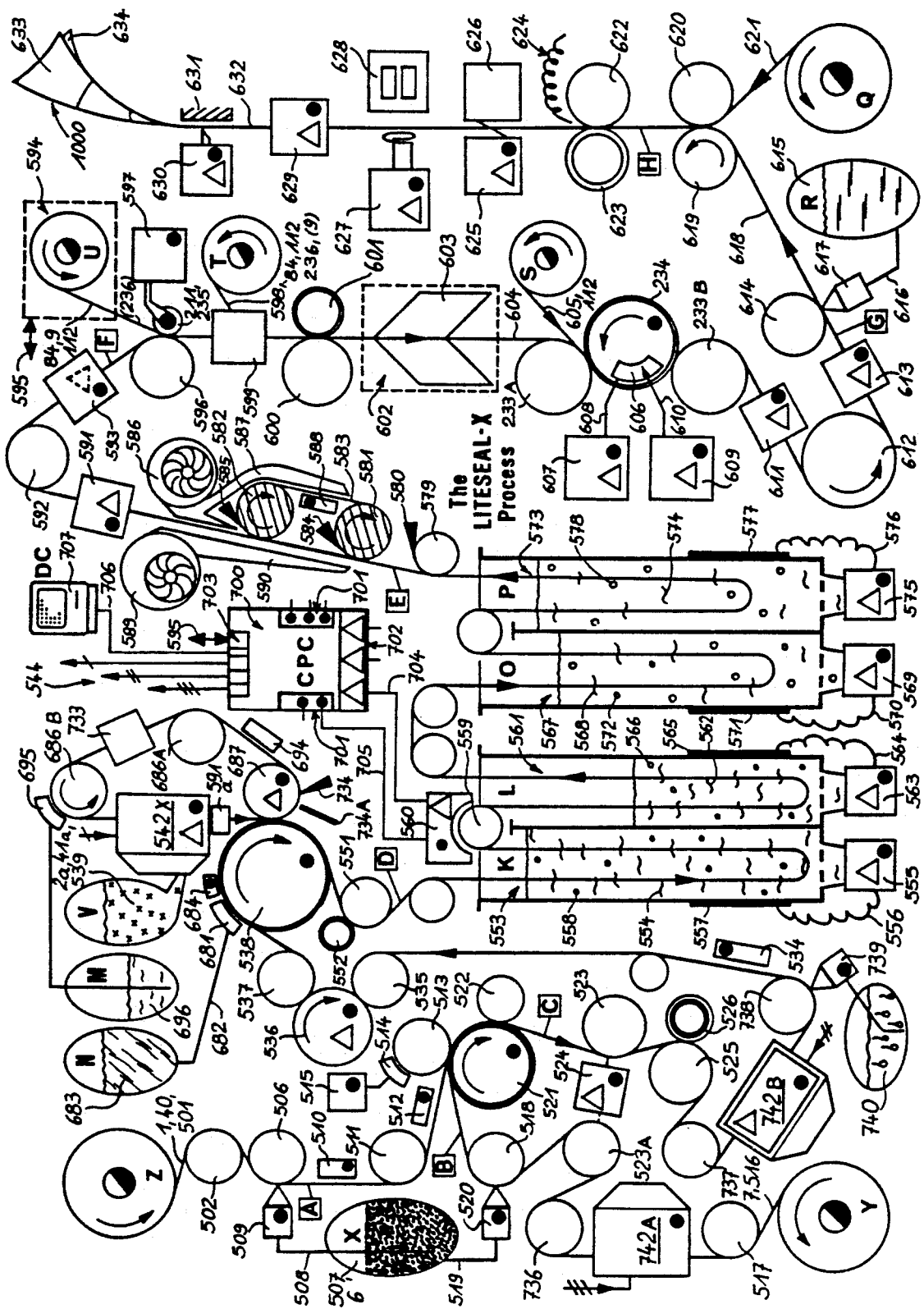
Figure 19:
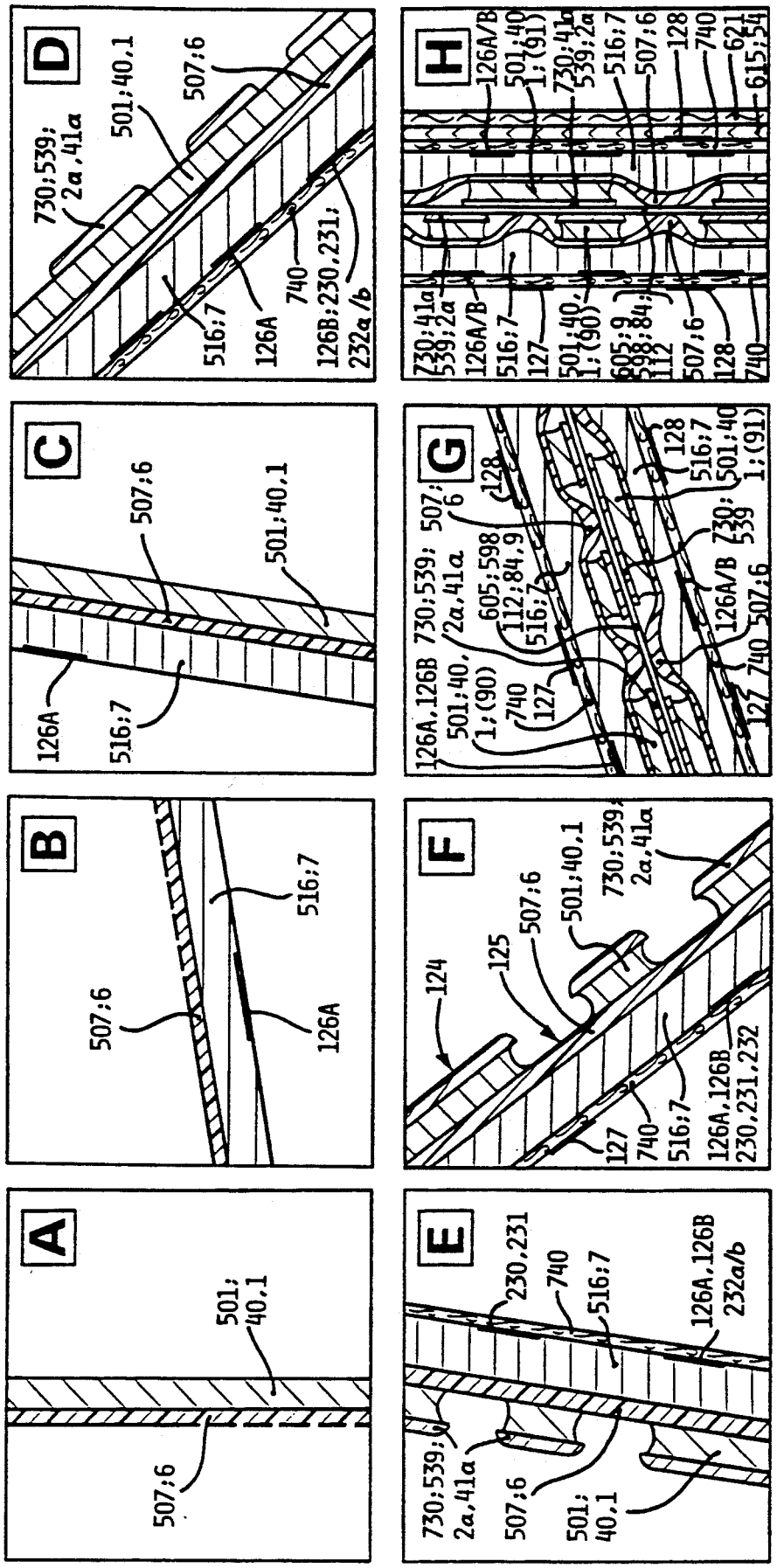

FIGS. $4_A$, $4_B$ and $4_C$ are schematic illustrations of suitable corona stations;

FIG. 5 is a three-dimensional view for explanation of the folding step if folding is carried out in a direct way;

FIG. 6 is a three dimensional view for explanation of the folding step if folding is carried out in an indirect way;

FIG. 7 is a schematic diagram of an apparatus suiting for the on-line provision and feed into the process of a thin dielectric strip having electrical properties on demand;

FIG. 8 is schematic view of a simple linear laminating station;

FIG. 9 is a schematic view of an RF or MW operated tuning section within a more complex laminating station;

FIGS. $10_A$ and $10_B$ are schematic views of a production carrier's s zone submitted to a direct or indirect contacting procedure, respectively;

FIG. 11 is a schematic view of a software shift register as preferably being managed for thru-the-line in-register processing under deviating production carrier conditions along the production line;

FIG. 12 is a schematic view of a bus-oriented network structure for the control of the process line and for receiving and accepting custom designs;

FIG. 13 is a schematic illustration of another insulative patternizing station utilizing low-power low-cost laser or light emitting diode arrangements and an insulative mask pattern transfer scheme;

FIG. 14 is a schematic illustration of an RF or MW energy source which source automatically powers up whenever the production web has reached a proper position for tuning an electrical circuit buried therein;

FIG. 15 illustrates in a blank presentation those parts of the process line according to FIG. 2 which have been substituted by parts shown in FIG. 13;

FIG. 16 illustrates in a blank presentation those parts of the dielectric patternizing station according to FIG. 13 which may be found on a conventional light printer for office use;

FIG. 17 is a schematic illustration of a modified station for printing dielectric patterns on the metal face of the production web by way of fixing dielectric patterns on an insulative transfer sheet in a modified office light printer;

FIG. 18 is a second simplified process diagram in which the parts of FIG. 15 have been substituted by the process arrangement of FIG. 17 and in which respective modifications have been made of the first printing steps in the entrance region of the process according to FIG. 2 bottom left;

FIG. 19 shows, in windows A to H, schematical cross sectional views of the production carrier's multilayer construction in various processing states with reference made to symbols A to H in FIG. 18.

THE PREFERRED EMBODIMENTS

FIGS. $1_A$ and $1_B$ show a simple planar electrical circuit construction 1000 as being of high commercial interest and produced by way of the production method according to the invention. FIG. $1_A$ refers to the "electrical face" and FIG. $1_B$ to the "commercial face" of such circuit.

According to FIG. $1_A$ the circuit consists of a sheet-like carrier material 7, 516, the facing side thereof being coated with a sealing film 6, 507. The carrier material may be a paper-like material, preferably a spunbonded olefin as is e.g. TYVEK, or a novel composite spun polyester and olefin mix bond having tissue-like appearance. It may be liquid-pervious. The sealing film may be a sealable olefin or the like and preferably performs liquid-impervious. A center line 8 appears to symmetrically divide the entire construction into two halves, 18 and 19, referred to as "leaves". On the front face of said sealing film 6, 507 there is provided a flat, multi-turn conductive spiral path pattern assembling from individual path portions. As shown for example two spiral structures are arranged each one of them on a respective leaf; generally, in a minimum count embodiment, the construction may also be reduced to merely a single multi-turn spiral which may substantially concentrate on one of both leaves.

As a respective outset each of the conductive spirals starts with an elongated and substantially two-dimensionally shaped conductor path portion 36 or 37 extending along and short distance from the substantially straight side of the respective other portion 37 or 36, leaving there-between an elongated region in which said conductive path is substantially absent, said region being centered at said center line 8.

Though said central conductive path 36 & 37 is substantially absent along line 8, at least one electrically conductive path 122, 123, in the manner of a bridging portion, may extend across line 8 and conductively connect portions 36 and 37 one with each other. Practically, at least two such bridges may be provided, co-serving for a hinge function in a case in which the construction should be folded about line 8 so that leaf 18 comes to lie on leaf 19, which may be a desire.

The substantial absence of the conductive layer along line 8 provides an elongated zone of broken stiffness of the conductive layer 36 & 37 for defining a line, along which the construction preferably folds with high precision; practically this line may coincide with line 8 shown. If more than one bridging portion 122 and 123 is provided between paths 36 and 37, the arrangement along line 8 may also be understood as a central conductive path 36 & 37 having one ore more preferably longitudinally extending openings 46 and 47 or even marginal notches 118.

Openings 46 and 47 may have any shape; preferably their longest dimension normally extends along line 8 as indicated by a tapered or staggered shape of their outward margins. By way of this scheme, bridging paths crossing line 8 may be designed so that they have a narrowest cross section in the place of line 8, e.g. for ease of folding precision.

However, bridging portions 122 and 123 may not be a restrictive need for electrically connecting conductive path patterns on each side of line 8. As shown hereunder, conductive path patterns being arranged insulated one from each other on respective leaves may also be connected one to each other via a special connecting means, e.g. by way of welding suitably modified path segments 36a and 37a one onto each other, or by means of a special conductor connected to either modified portions 36b and 37b, see FIGS. 8 and $10_B$.

Openings 46 and 47 may be provided merely in the conductive central path 36 & 37. However, such openings may also penetrate both said paths 36 & 37 and carrier material 7, 516, and a sealing layer 6, 507 as well, for simi-larly breaking, along line 8, the inner stiffness or resistance against folding of the carrier material 7, 516. The rear view of the construction according to FIG. $1_B$ illustrates a further opening 117 penetrating the carrier material same as do two additional marginal notches 118 along line 8. Practically more than one penetration 117 may be provided. Thus, in FIG. $1_B$ central path openings 46 and 47 appear to be arranged on either rear of the carrier's zones bridging and crossing line 8.

It may suit to have carrier material 7, 516 additionally perforated or repetitively cut along line 8, so that the stiffness of carrier material 7, 516 present along line 8 is further reduced to an absolute minimum for supporting such fold with top precision. Obviously, such additional perforation or line of repetitive cuts (not shown here) then should coincide with the real center line of the conductive path structure, provided a physical need exists to have, upon folding, whatsoever conductive path portions or patterns on leaves 18 and 19 superpose with high precision, rather than to have merely carrier leaves 18 and 19 superpose.

Said conductive multi-turn spirals assemble from individual paths 20, 21, 22, 23, 24, 25, 26, 27 on top leaf 18 and from respective ones 28, 29, 30, 31, 32, 33, 34, 35 on bottom leaf 19, both spirals wound in an uniform direction (CCW here) when starting at their respective outermost paths 37 and 36 close to line 8. The conductive path pattern may be designed so that, upon folding, respective paths 20 and 30, 21 and 29, 22 and 28, 23 and 31, 24 and 34, 25 and 33, 26 and 32, and 27 and 35 superpose in a substantially aligned superposition. However, the patterns as well may configure quite differently, so that merely two major conductive areas, upon folding, become substantially superposed. If the facing sides of the conductive patterns are provided with an insulative coating, or if at least a spacing insulative sheet or strip 9, 84 (598, 605) is inserted prior to folding over he leaves 18 and 19 onto each other, then such circuit may physically perform as a resonant structure useful as marker means within electronic security systems. Such folded circuit construction may also comprise both such an insulative cover coating of conductor paths and a sheet- or strip-like dielectric 9, 84 (598, 605), thus combining in a sandwich fashion to a composed insulating means.

According to FIG. $1_B$ the two leaf sections of the commercial face of circuit 1000 may be designed quite differently. The respective face of leaf 18 may show a printframe 119 being precisely registered with the rear conductive path pattern and the leaf itself. This printframe may contain readable and coded information 120, and a whatsoever picture print 121 as well, e.g. a trade mark, a shop emblem, advertising graphics, an airways symbol, or just a smart sales promotion girl as shown. The individual components of the printframe may be produced with different techniques, as are offset lithographics or multi-color roto-printing for 121, laser or light printing for 120 and the like, and thus may have been provided at different times of circuit's genesis. The respective face of leaf 19 at least in part may be coated with a self-adhesive layer 54, 615, the latter being protected by a peel-off paper 53, 634 covering a major portion of the face of leaf 19. Once the circuit has been folded as mentioned above, the construction thus may be attached, by means of adhesive film 54, 615, to an article of merchandise or to a ticket or license, so that leaf 18 and its printframe 119 may be steadily viewed as an exhibition part of the commercial face of the circuit utilized like this. In another useful embodiment, adhesive film 54, 615 and peel-off paper 53, 634 (621) may be missing, and a suspension hole (not shown) may be provided through the circuit, so that it may be affixed to fashions or retail goods by aid of well-known nylon hooks (not shown) engaging such suspension hole.

Practically, data 120 may carry price or other information of an article to which such circuit may be affixed. The circuit itself may alarm well-known security systems provided the article gets subject to pilferage without a normal procedure carried out in view of the circuit, such procedure normally being executed when the ordinary customer pays for the buy at cashier's site. For making the circuit counterfeit-proof, it may be printed, beneath adhesive layer 54, 615, with producers trade mark emblem so as to be visible at least in ultraviolet light. In another embodiment, data 120 may comply or correspond with data on a ticket, to which the circuit may be affixed. In another embodiment, no film 54, 615 and peel-off paper 53, 634 may be provided, the carrier 7, 516 may have a tissue or texlike appearance, and the electrical structure may be designed and arranged so that the circuit can be sewn, at least along a specified sewing track, into articles of fashion and merchandise. A desire might further exist to utilize carrier material being resistive against tearing attempts.

Hence, no restriction exists for desirably fitting the commercial face of such circuit for meeting a variety of application needs, whereas a desire might exist to keep a specifically performing electrical structure when combined with same specific customer logo, or when produced for compatibile use with whatsoever electronic security system. Further, a need may exist either to simply tune the electrical construction to specific physical limits, needs or requirements, or even to substitute a specific electrical structure by a distinctly other one, which physically performs quite differently, with same or quite different commercial design of circuit's outer faces.

FIG. 2 shows a practical process arrangement, individual processing stations of which have been arranged just so as it proves useful in a real, practical production machinery. Same as in such real production machinery, not all processing stations necessarily engage with the make of a specific product. However, they maybe provided by installment for being downloaded on demand to a currently configured processing track, or may even be exchanged in view of their succession one to each other at some extent, so far as useful or desirable for highly flexible production.

Hence, in practice, such machinery based processing flexibility in terms of fly-in-fly-out-exchangeable and adaptive processing stations of state of the art fully complies with the computerized and thus programmable cooperation of individual processing steps according to the invention, for producing whatsoever customized circuit design. Hence, a practical realization of the production method should be considered as being allocated in the modern CIM (computer integrated manufacturing) domain.

Figure 3:
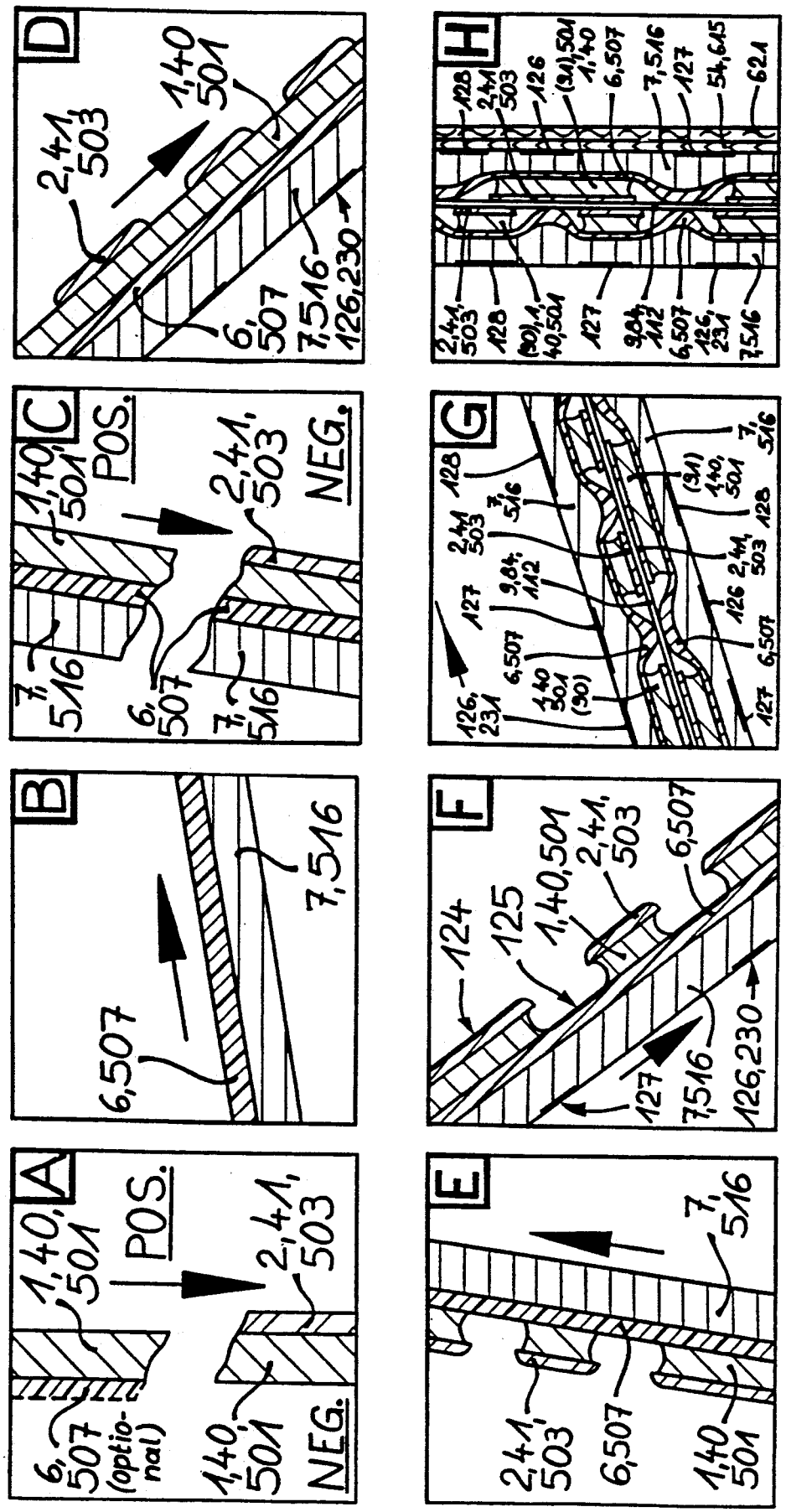
FIG. 3 shows, in windows A to H, schematic cross sectional views of the production carrier's multilayer construction in various processing states with reference made to symbols A to H in FIG. 2.

The following description co-refers to FIG. 3, which schematically illustrates magnified cross sectional views of the production web in different processing states. These states have been identified by letters A to H in FIG. 2. Thicknesses of layers are shown at an enlarged scale.

From roof supply roll Z a metal foil 1, 40, 501 is endlessly fed to a first cylinder 502. Preferably copper or dead soft aluminum may be used, being 30 . . . 50 μm thick and complying with type 1145 specifications. Depending on the method used of patternizing the production web being constructed in a later state, the first face of foil 1, 40, 501 may be subjected to an insulative coating procedure by means of a surface bond extruder 505, which takes in, from supply canister W and via supply duct 504, an insulative material 2, 41, 503, the latter preferably having the appearance of a granulate. Thus, a dual layer compound may leave cylinder 502 to reach cylinder 506, which compound's first face may show,—under certain conditions—an insulative coat, whereas in any case said compound's second face shows a metal 1, 40, 501. Cylinder 506 performs a similar function as aforementioned cylinder 502. From supply canister X and via supply duct 508 an extruder or surface coater 509 takes in a sealing material 6, 507. Once deposited as a coextending thin layer on said second blank face of said metal foil, said sealing material has, resealing and recreation capabilities and performs liquid-impervious so that it can serve for an etching resist backplane function for the metal foil against rear face etching in a later state. Construction A obtained from this processing step is shown in FIG. 3, window A. It may pass a heater 510 or hot-cold-hot zone device 510 for stabilizing the newly deposited sealing film 6, 507. About cylinder 511, the construction may optionally be subjected to a similar treatment by means of a similar heater 512 or hot-cold-hot zone device 512; cylinder 511 might be utilized as a component of such thermally stabilizing arrangement, e.g. by running it as a cold cylinder.

Supply spool Y is arranged at bottom of the machinery, since the cover material 7, 516 has to be exchanged according to whatsoever custom specifications; respective spools Y may be automatically loaded from reeled stock according to current acquisition & demand instructions from CPC 700, initiated from Design Computer (DC) 707. Said cover material performs resistive under the influence of etchants applied in a later state, however, may be etchant-pervious. It may be a spunbonded material, e.g. TYVEK, or a novel spunbonded polyethylene/polyester mix composition, having a tex-like appearance and/or tissue-like properties.

Via cylinder 517 circuit's cover material 7, 516 is fed to a working cylinder 518, on which sealing material 6, 507 may be deposited as well on the first face of cover material 7, 516. For this processing step an extruder or coater 520 is provided alternatively taking in, via supply duct 519, the aforementioned sealing material 6, 507. For production flexibility both devices 506 & 509 and 518 & 520 may be provided. However, depending on the input materials selected and to be processed, and on the patternizing method selected as well, one of both devices normally may be disabled. Mostly the 520 device may work, since being arranged bottomwards for better accessibility and service. However, in a few special cases both coating stations may be in effect, for assembling a specifically performing sealing layer from two individual layers in a later step. Besides performing etchant-impervious said sealing layer is capable of being "waken up" (preferably under RF corona conditions) from surface degradations owing to a previous contact with an etchant. A suitable material tested with proper results has been a certain kind of low density polyethylene (THERMOTHEN). Thus, a dual layer construction B may be obtained behind cylinder 518 as shown in FIG. 3, window B, consisting of circuit's cover material 7, 516 and a thin sealing layer 6, 507 on its first face, this layer being liquid-impervious.

Fractional constructions A and B now meet in a laminating station formed of driven cylinders 513 and 521. At least cylinder 513 may be temperature controlled and conditioned; conditioner 514 and its servo- and control unit 515 are shown. Conditioner 514 may be either an infrared radiator, or an RF inductive device heating up the outermost mantle of laminating cylinder 513 by way of RF eddy current induction heating.

Practically, the latter may be preferred, since that method allows the laminating cylinder being made from a non-conductive material having a low heat conduction and a small thermal heat capacity. In such case, the major amount of useful heat transferred to the thin cylinder mantle may be "consumed" under the lamination touch, or in other words, has to be refed again to laminating cylinder's 513 mantle prior to its next lamination touch of the construction A (The comparison with a fotocopy machine suits well: Heat is applied and taken off just like a toner to and from a photo copier's drum). This construction exhibits an excellent fast thermal response, since the temperature profile around cylinder 513 can be varied even within smallest increments both of revolution, material's advance, and time. Hence, this method of high speed managing the thermal profile of a fast laminating cylinder is most important for trouble freely running such automated production line, wasteless, under computer control, full time, at all. Good results have been obtained from microwave excited cylinder mantles constructed from a twin layer of iron and copper rotably electrodeposited on a glass fiber reenforced and in part structurally foamed and grinded resin cylinder mantle base. No prejudice is made by laminating cylinder's 513 arrangement shown so as to touch the first face of the resulting sandwich construction C; such cylinder as well may be arranged so as to work against cover material 7, 516, depending on a) the thermal properties of the latter, and b) the sealant 6, 507 used, and c) whether or not extrusion 505 is in effect for deposition of insulative layer 2, 41, 503 on first face of metal foil 1, 40, 501.

In a practical machinery, the twin-cylinder arrangement 513 & 521 as a one-piece device may be arranged on a rotable base, which may be computer driven and rotably adjusted in whatsoever suitable position with respect to the entrance cylinders 511 and 518, on demand. This proved useful for compensating for different production speeds, so far as a fine tuning of the respective temperatures of the two feed materials is accomplished by differentially varying and setting the embracing angles (on cylinders) of the feed materials just prior to their laminating touch. According to this scheme, heat transfer time may be precisely tuned and limitted via cold or hot embracing time, which may become a major point of importance if a spunbonded olefin should be used as a cover material 7, 516. The situation shown may be normal when the sealant is applied by extruder 520 on the cover material. If a spunbonded olefin should be used for a circuit's cover face, then cylinder 521 may perform best if controlled and run at a specifically lower temperature than is run cylinder 513, for preventing circuit's a cover face from falling "wet", meaning a change of PW's appearance from a previous opacity to a certain transparentness Cylinder 522 works as a controllably driven post laminating cylinder, just for stabilizing the thus multilayer sandwich laminate C obtained behind cylinder 522 as a production Web (PW), see FIG. 3, Window C.

In processing station 523 & 524 the input reference means for register control and advance management is provided on the PW. Unit 524 may be a grip hole cutting device working against counter cylinder 523 for preparing the PW for known film grip handling. Or unit 524 may be a high speed position code printer for depositing an endless position code (e.g. 230, 231 in FIG. 8; 232a to 232b in FIG. 6) on a specified control track of the PW as preferably utilized under grip-hole-less processing conditions; such endless position code may be electronically tracked for piloting the entire production line. As a refinement, such print may be provided so that it is readable in ultraviolet light. Preferably, the actual code information is real time issued from CPC 700; the triangle symbol stands for that this code—once printed—may immediately be read out and real time fed back to CPC 700 for compliance control just upon printing, e.g. for checking printing quality and performing error acquisition and control. An arrangement of synchronized inkjet printers appeared to suit well for the purpose; however, specific materials may be printed better or may even be zero force impact imprinted or code perforated by use of known laser techniques. Thus, once a reference position is assigned to the web, CPC 700 is fully informed at which times respectively coded places of the PW should arrive in subsequent processing stations under zero deviation conditions, and at which times they really do according to CPC's 700 mentioned software model of the actual PW subjected to full length deviations and step-to-step looping and dislooping conditions.

Now the PW is fed to processing station 526 & 525. 526 may be a rotative clipping or perforating tool working against servo driven cylinder 525, for processing PW's margins for its better and more precise handling in later production steps. After the laminating process, marginal clipping of the PW may be a need for not contaminating the following printing station. This first printing station is briefly symbolized by parts 527 to 534, though this station may configure much more complex in practice, however, in ways known by those skilled in the art. Just a simple two colors printing station is illustrated, having first and second printing cylinders 528 and 532, first and second pressure cylinders 527 and 531, first and second color feed and transfer cylinder arrangements 529 and 533, and first and second drying and/or curing stations 530 and 534, preferably of the combined heat and ultra violet light or processing gas type. Printing cylinders 528 and 532 may be conventional ones, but novel ones, which automatically demand, accept, take in, position, regiser, and throw off for exchange sheeted forms custom designed by laser exposure may suit better within this process line, which has been tailored for hopping designs with a fast response. Such easily exchangeable print forms may be remotely produced at high speed, and then supplied and fed into the printing station by a special and separate line service and support processing machinery not shown. A best fitting to the line and proper results may be obtained from most modern multi-color light printing stations, as will be referred to hereinbelow with reference to FIG. 18. Numeral 126 in FIG. 3 denotes first prints provided in the aforesaid station.

In the present case, the printing station of whatsoever type utilizes printing pastes or inks which are resistive against degradation of print appearance owing to later etching. Depending on the etchant applied, olefin or vinyl or resin based printing pastes or inks may suit, depending on print quality, production speed, and customer's application of the finished product, too. E.g., if chemical agents should be allowed for a stressing the finished product at a low float off deterioration rate, printing pastes and inks should be selected in view of both their pigment fixing and leakage type and rate under conditions of practice. On the other hand, a combined printing and imprinting by laser means of spunbonded cover materials proved to yield a low ink or color/pigment leakage rate under fashions recreation conditions (A refinement for the protection of non-etchant-resistive prints will be introduced in connection with FIG. 18 hereinbelow).

The preprinted PW is fed in an Ω-loop arrangement of three cylinders 535, 536, and 537. Cylinder 535 may be of the non-driven moving type, meaning, that it may perform deviation excursions over a part of the circumference of cylinder 536. Firstly, this is for "swallowing" looping tendencies of the PW between printing cylinders 528 and 532 and the drum 538 to follow. The drives of said cylinders may be servo-controlled in response PW's actual position, for achieving a front to rear register condition for the PW particularly when grip-holeless registered electronically. This dislooping function is not needed when film grip piloting and advancing the PW. Secondly, cylinder 535 is for providing a close touch between the PW and cylinder 536. Such close touch may be necessary, since cylinder 536 is precisely regulated in view of its mantle temperature so as to stabilize and condition the PW on or close to the temperature of drum 538. The margins of the thermally conditioned PW are preferably fine clipped latest on drum's entry cylinder 537, just prior to being conveyed to drum 538. The reason why is explained hereunder.

From input cylinder 537 the printed PW is conveyed to drum 538. Around the circumference of drum 538 there are provided three major processing modules 541, 542, and 547, which all together are needed only in the case of the direct positive method of both etchant resistively and insulatively patternizing the PW. In the direct positive method extruder 505 and its supply is not needed and thus blanked out. The latter is needed, however, in the negative implementation of the method, in which vice versa parts V, 539, 540, 541, 547, 548, 549, 550 may be omitted.

Firstly, the direct positive patternizing method according to the invention will be explained hereunder, since it makes apparent several inherent advantages, particularly over the also positively working reference method according to U.S. Pat. No. 3,913,219.

In section 541 the blank metal face of the foil 1, 40, 501, being part of preprinted construction C, is coated with an insulative material 2a, 41a, 539, which preferably has properties either of a suspension or a powder. However, a homogenous liquid construction may be used as well preferably in cases, in which in a finished product an insulative layer provided in spaces between (crossing over or superposed) conductive paths does not need to exhibit specified dielectric loss properties. That may be in all cases, in which no need exists that produced circuits should resonate. Said insulative material 2a, 41a, 539 is supplied from supply canister V thru supply duct 540.

A suitable powder exhibits specific characteristics in view of meltability, and for filming under melting conditions, e.g. in view of forming a non-porous film, in view of a quick development of a high and unitary affixation to a metal face, and a proper equalizing tendency of its melted surface on a metal base. Further, as a stringent requirement, the film obtained on the metal face from a melting powder must be capable of withstanding the etchant applied in a later production step. Then such desirably patternized film may suit as a substitute for a commonly used etching resist pattern as known from the art of making printed circuit boards. Lastly, such film may have some sealing capabilities, at least after having been subjected to a chemical treatment, e.g. a corona treatment.

The application of a precisely controlled amount of powder per unit area of the metal face on drum 538 may be effected preferably by combined electrostatical and mechanical sputter means under CPC 700 control. The insulative patterns to be generated on the metal face later should develop and exhibit a high affixation thereon, for not being removed and "washed away" under fast etching conditions. Hence, a cleaning apparatus (not shown) may be provided in the entrance region of coating section 541 (preferably in the ascending section of drum 538) for cleaning the metal face of construction C and particularly to remove both residual oil from the generic foil rolling process of foil 1, 40, 501, and other contaminations picked up in prior processing steps. Suitably selecting the dullness of the metal face of said foil may contribute to optimize the affixation of suchlike generated film patterns on the metal face.

E.g., the powder used for being conditioned to a suspension may be a super fine (micro size) powdered polyethylene. For higher process temperatures also a mix of a polyethylene and a polypropylene powder may be used, for obtaining more rugged mask patterns, however, normally trading off with pattern resolution. These materials are most useful if resonant structures should be produced. It has been found out, that a powder mix normally must exhibit a much smaller grain size than needs a one-piece powder, for obtaining satisfying patternizing results. If sufficiently fine, then a powder mix may result in a higher production speed at higher temperatures and a considerable reduction of the waste rate. However, establishing and maintaining an uniform coat in station 541 proved to be more difficult, and thus may require more and finer control. Further, a one-piece powder more easy recycles and recirculates, at less control efforts and costs.

The respective suspension is preferably composed of just such powder and a specific amount of a liquid carrier, which carrier may vaporize, under athmospherical conditions, just under the influence of heat. Depending on process speed, the carrier may contain a certain amount of water, or may be an organic liquid, e.g. a mix of certain alcohols or derivations thereof, and e.g. quickly vaporizing trichlorethane. In any case, such suspension quickly dries up. Most critical in suspension coating is a precise electronic control of the powder to carrier ratio, particularly in the short moment of application and settling on the metal face, and the control of the proper fractional amounts of organic materials mixing to said liquid carrier. A waterless carrier may be applied preferably for electrostatically leveling a thin suspension layer on the metal surface on drum 538, by aid of suitable mantle electrode arrangements and direct and alternating current charging means.

If a suspension is used, then either drum 538 may be CPC 700 controlled for keeping a preset temperature depending on production speed, or a surface heater arrangement (not shown) is provided for vaporization of said liquid carrier either at the exit of station 541, or at the entrance of station 548, entrance & exit defined by drum's revolution arrow. The first or second location of such heater depends on whether the patternizing process should be a fully dry one or may take the insulative material being constituted as a wet paste just being under dry up conditions.

Though a specific portion of the vaporizing liquid carrier may be wasted 546, the major portion of it may be recovered and recycled for efficiency. So may be excess and dried up suspension not used in the patternizing step to follow. However, if chemical additives are utilized for dropping the surface tension of the carrier, then special provisions may be required for reconditioning to such suspension a once dried up and recirculated suspension. Such dried up excess suspension may be recycled and conditioned to a useful suspension either in discoating station 547 or in a separate line supply and support machinery not shown, or at its manufacturer's site. Normally, excess powder from a completely dry patternizing process may be fully recycled due to a steady turn-around scheme for keeping it precisely conditioned for the sputtering process in station 541, symbolized by recycling duct 548, canister $V_1$ for collecting excess material 549, and recirculating pipe 550 feeding supply canister V.

Under circumferential advance on drum 538 (driven under CPC 700 control) the PW then is subjected to a laser writing procedure executed preferably line-by-line in station 542. Writing is effected by way of melting down the meltable component of insulative material 2a, 41a, 539 onto the first face of foil 1, 40, 501. The intensity of the laser light injected into the insulative material 2a, 41a, 539 must be electronically controlled and regulated so that a useful creation of patterns can take place; for this purpose a respective response control apparatus may be contained in module 542. The writing-by-melting procedure may be aided by having the insulative component of dielectric material 2a, 41a, 539 optically doped to the wavelength of the laser light used, that means, to have its absorption loss taking a maximum on or close to the wavelength of the exciting laser light. When using $CO_2$ lasers, optically doping e.g. polyethylene, serving for a major part of material 2a, 41a, 539, may unnecessary, since those lasers put out light on infrared wavelength at such high power levels, that sufficient melting energy may be obtained even at a moderate absorption rate.

A further optimization may be obtained by selecting and carefully tuning the powder or suspension size of insulative material 2a, 41a, 539, to the dullness or surface roughness of first face of foil 1, 40, 501. In the melting down process the laser light is substantially utilized twice, since the metal foil acts similar to a mirror and thus backscatters the a exciting light into the melting layer. An optimization of backscatter conditions is useful for obtaining good equalizing and filming results of the melted down material 2a, 41a, 539. A small amount of insulative material may be vaporized, too, indicated by smoke 546 taken out by exhauster 545.

Writing the insulative patterns is executed preferably in an interlacing line-by-line, or even more complex scheme. Practically, station 542 may configure in various different ways, depending on PW thruput, melting power transfer requirements, and writing speed. A plurality of high power lasers 543 may be provided for doing the job in handshake cooperation.

Pattern resolution requirements directly influence the upper limit of production speed. For economy it may suite to have orthogonally different pattern resolutions, by utilizing elliptical flyspot proportions. In either of orthogonal directions the process may provide quantisized conductor path widths, the narrowest of which just having width ratios as may be obtained from small integers, e.g. 1:2, 2:3, 3:5, and the like.

Switching and deflecting laser beams in a precise synchronization to have their flyspots share, once at a time, into the make of not only one individual circuit, but also a plurality thereof (multi-in-parallel production, PW's width being at least twice or a greater multiple of one circuit pattern a width), is effected by state of the art mechanical and electrooptical shutter and deflection means, among which may be high speed pyramidal mirrors and Q-choppers, driven under phase lock loop computer control. Hence, in the machinery compartment 542 preferably a special Scan Composer SC (not shown) may be comprised, which scan composer manages the patternizing section 542 its own (just see respective SC 708 in FIG. 12 in connection with a column-by-column exposure means 543a in FIG. 13). Hence, line 544 may be provided just for bus communications between CPC 700 and such SC being part of module 542, for the a exchange of longitudinal and track position, register error and current PW speed data, clock and timing pulses, and 'set and modify writing pattern' instructions.

The cooperation of lasers and respective shutter, Q-switch, and crossbeam join elements may be organized in a programmed scheme resulting in balanced flyspot duties for the focused beams. Such proved useful for having a plurality of lasers job share into long duty pulses for subsequently writing long lines, since an optimization of average efficiency of such patternizing scheme boosts economy. Practically, a rack-stack arrangement of four or eight lasers (depending on how many circuits should be produced once at at time multi-in-parallel) may coengage for creating the dielectric mask patterns.

For switching the laser beams so as to assemble the desired patterns specific switching pulse trains may be read out from ROM and RAM of such scan composer. For this, a specific pattern in its normalized standard fashion may be read out from a respective ROM of a ROM bank, and all current corrections to be provided for tuning or for compensating for whatsoever effects may be computed real time and thus fetched from RAM for combining with respectively fixed ROM instructions to the real time pattern of current desire. E.g., a conductive path pattern according to FIG. $1_A$ may be read out line by line from a ROM, and tuned under real time control by adding or omitting laser beam duty lines forming at least one insulative mask portion which defines a respective portion of low-impedance striplines 27 and 35. Changing the width of these conductor strips influences the loading capacitance effective in that resonant structure, and thus its resonant properties.

Another function is directed to said scan composer inside patternizing section 542. As mentioned the position of the PW, and particularly its longitudinal register condition, is read out in various processing stations. In station 542, however, the triangle symbol stands for track register pick up, since the pilot print for position and longitudinal track and hunt control of the PW is averted from station 542, facing drum 538. In station 542 preferably the metal margins of the production carrier are subjected to a track position control.

For this purpose, the margins of the PW have been clipped in processing station 526 & 525, and optionally again fine or precision clipped latest on drum's previous entry cylinder 537. On said cylinder the PW had already been conditioned to drum temperature as mentioned above. Hence, neglectible thermal dimension deviations or drifts may occur between left and right clipped margins of the PW on the short way from cylinder 536 to the place on drum in which these margins are scanned for track position control. In station 542 the PW's track position is read out preferably by means of left and right inductive sensors (not shown) sensitive to the higher conductance of the aluminum layer insulated and spaced (by the thickness of cover material 7, 516) from drum 538. Left and right position signals are being derived and conditioned to a PW track position signal being representative for PW's real track position. This PW track position signal is processed in the SC mentioned above, and utilized for an offset normalization so as to slightly delay more or less said switching pulse trains with reference to a clock signal. Since these pulse trains are written down on the PW parallel to drum's axis, the writing patterns thus may be offset-shifted to the left or to the right face of drum 538 just at an extent, so that they always appear precisely positioned on the PW with reference to its margins.

Under circumferential advance on CPC 700 driven drum 538 the PW enters discoating station 547. In the entrance region, the mentioned drying up apparatus may be installed, provided a suspension coating has been applied In the latter case, for removing unmelted insulative material 2a, 41a, 239, vacuum brushing aided by electrostatical means performs well. In special cases, wet whirl or sputter cleansing may be appropriate, on a water or other base. Such method widely depends on whether or not an etchant resistive pattern perhaps of minor dielectric loss quality has been positively written down from a liquid material which can be removed in its liquid phase merely by aid of a dissolvant, differently to a dry powder or a dried up suspension.

The negative implementation of the process is now described just in view of the distinctions to the direct positive implementation above. Initially mentioned extruder 505 and supply means W, 504 are in action. Thus, an insulative layer or coat 2, 41, 503 is provided on the first face of metal foil 1, 40, 501. Practically, an 8 ... 12 $\mu$m thick polyethylene layer may be affordable. Thermal conditioner 510 may be omitted. Laminating cylinders 513 and 521 may be exchanged with each other. Parts v, 539, 540, 541, 547, 548, 549, 550 are idling, thus blanked out. Patternizing section 542 works as described, however, complementary, by completely vaporizing the polyethylene layer in all places, in which etching is desired to take place. The backscattering function of foil 1, 40, 501 is maintained. In this embodiment, exhauster 545 symbolizes a special apparatus for evacuating the writing zone from vaporized polyethylene for preventing a contamination due to condensation or spurious recoating of already "written off" areas on the metal face of foil 1, 40, 501. Depending on the cover material used, with the negative method a need may exist to have drum 538 cooled or run at controlled room temperature. The latter proved useful when applying spunbonded olefins as a cover material.

The negative method proved to require higher power levels of suitable lasers than does the direct positive method, and in any case implements the disadvantage of an inherently lower speed, comparision based on a 50% metallization of circuit's are. Hence it suits less for applications in which the major area of a circuit should be etched, as being the case in RF resonant structures, e.g. RF marker circuits. Since shuttering means capable of handling higher power laser beams exhibit dramatically reduced shuttering speeds, tighter restrictions exist for production speed limits. On the other hand, the drum scene is most simple in comparision with the positive method, and the vaporizing process is much easier to handle and control. This is because the vaporizing process is a "digital" one, meaning, that the insulative coat should either be left back on the metal face, or should be vaporized completely, whereas the aforedescribed positive implementation has to be considered as a "creative" process in which precise intensity control of laser beams is a stringent need for not overheating the melting and filming insulative material, otherwise it would be vaporized off, and thus fail. However, it is true, that the negative method works with acceptable results in two cases:

1.) Provided, nearly all metal should be left back in the circuit, so that the laser has to serve just for the function of slitting the insulative cover 2, 41, 503 for "writing" blank narrow separation lines on the metal face of the PW, for having just those etched, rather than large conductive areas.

2.) Provided the normalized pattern dot and line resolution may be allowed to be less than usually desired when using the positive method.

In these cases, the simplicity of the negative method makes an advantage, by that coating station 541, discoating station 547, and recirculating apparatus are completely missing, and thus their costs, too, which are usually more than those for extruder 505 and its supply. An electronic laser beam power regulation may also be surplus in this implementation, thus saving more costs. As an add-on, the raw material 2, 41, 503 may be less expensive. Hence, though the optical and electro-optical parts may be more expensive therein, the negative method may be quite a good choice for specific, though restricted applications.

It has been understood, that the patternizing processes according to both the aforementioned direct positive and negative scheme are high economy single revolution drum processes, and so are two other positively working patternizing schemes within the scope of the present invention which are referred to hereinbelow with reference to FIG. 13 and FIGS. 17 to 19.

As a construction D the PW is now conveyed from drum 538 to cylinder 551, which cylinder is arranged just shortly behind drum 358, and prior to etching. In this station, preferably precise longitudinal folding perforations or repetitive cuts are brought in. These perforations or cuts may be provided so that they substantially penetrate either the metal layer or the cover material at a more or less extent, or one of both fully, or both at all by 100%. This process step is provided in this very place of the line, since the still wide PW, wound around drum 358 having a considerable large diameter, arrives on cylinder 551 in the manner of a rigid sheet (since still unetched and thus carrying a continuous metal layer 1, 40, 501) with high track precision, and still on drum temperature, meaning, with a thus low thermal dimensional offset or error of its margins cut just prior to the drum station. This is important, since a respective perforating or cutting tool 552 is provided preferably as an agile one under CPC 700 control in a view of its track position with reference to a fixed nulling position. Said nulling position practically should correspond with one margin of the PW, and the reason why is obvious. Desirably, customized circuits as shown in FIGS. $1_A$ and $1_B$ or in FIGS. 5 and 6 may contain different electrical structures, or have such structures distinctly differently arranged within the overall area of the cover face of the finished circuit, according to customer's needs. Hence, the perforation or cutting tool 552 is provided with a suitable position servo apparatus for being precisely directed and adjusted on whatsoever "customized" track, which customized track corresponds with an imaginary fold line in the insulative pattern written down in station 542. For facilitating a coinciding of whatsoever imaginary fold line and a perforating or cutting track, in a practical machinery track agility of a few tools 552 in parallel may be achieved by way of having such perforating or cutting tools 552 mounted on individual servo driven bases similarly as shown in FIG. 9. In such embodiment, tuning heads 642 are exchanged with respective tools 552 fitting into respectively designed and controlled base drives for thus track variably working against cylinder 551.

Generally, this processing step could be carried out on cylinder 537 as well. However, practical experience proved, that in that place the track stabilizing effect of large drum 538 cannot be utilized at same extent, and folding perforations brought in prior to PW's positively pattern coating in station 541 might dramatically drop coating performance, particularly along and close up to such perforations or cuts, so that heavy failures could result when etching. The negative patternizing method as described above does not encounter this restriction at all, and thus as well may provide such perforating or repetitively cutting taking place on cylinder 537 having at least one respective tool 552 assigned to it.

Normally production is carried out several circuits in parallel. Every one of a plurality of agile tools 552 is capable of being driven into its individual track position under CPC 700 control, according to current job needs. The plurality of respective track positions is computed by CPC 700 on the basis of the current cover design data frame received from DC 707. For this, said design data frame received from DC 707 is combined with both electrical circuit's structure layout data and structure location data in view of its finished arrangement with respect to a covering face print 119, see FIG. $1_B$. Thus, computer automatic and full positional adaption may be obtained of each of said plurality of perforation or repetitive cut lines (as non-materialized components of the multi-in-parallel electrical structure currently created) to whatsoever current custom design needs.

Now the D constituted PW is conveyed to an etching station preferably having at least two sections 553 (K) and 561 (L). Practically, the design of this station differs widely from this schematic view of a tank etching machine, since preferably at least ultrasonic excitement of the etchant is provided. Ultrasonic etching tremendously raises etching efficiency, provided specific foaming 558, 566 conditions of an etchant are utilized. An etchant may be used having an inherent tendency to foam up, as is e.g., $FeCl_3$. However, since an $FeCl_3$ based etchant may be highly aggressive to prints and either permanently deteriorate and dispurge specific cover materials or require a chemical recovery treatment of the PW, other etchants may suit better. Such, however, mostly require special foaming additives and aids; an inexpensive proven one being gelatin. The application of such additives in ironless etchants proved to be advantageous, since the saving of an additional chemical recovery step for an $FeCl_3$—dispurged PW results in less costs, and both a higher thruput and thus output of the line, and a lower degradation rate of a whatsoever print face 119 due to etching.

To each etching section there is assigned a maintenance and supply apparatus 555 and 563, respectively, for recirculating the etchant, recycling the etched off material (by secondary redeposition), for ph, temperature, metal pregnancy and concentration level setting and control, for etching PW length control (to be accomplished by way of pumping in or out a certain amount of the etchant for its level control), and for generating ultrasonic drive power. Via lines 556, 564 respective drive powers are fed to respective arrangements of ultrasonic transducers 557, 565 (may also be provided inside the etching section).

Electrolytically aiding the etching process normally encounters with the use of different etchants in sections 553 (K) and 561 (L) However, without such provision both sections 553 and 651 may utilize different etchants 554 and 562 as well. The same chemical construction may be used, however, at different concentration levels. This is for the following. Apparatus 560 inductively and/or optically scans, under CPC 700 control, at least a specific and at certain spaces repeating test pattern of the partially etched PW conveyed from section 553 (K) to section 561 (L) over (preferably non-conductive) cylinder 559; said test pattern e.g. being a simple dot arrangement along the margins of the PW. On the other hand, a specific conductive path area (e.g. capacitor plates) of an LC circuit may be scanned optically or inductively for the etching state of a plurality of raster openings provided in such conductive area for later influencing the resonant frequency of a suchlike fitted LC circuit. Via line 704, the result of the current state of etching measurement is communicated to CPC's 700 input channel bank 702. As a response, CPC 700 puts out, via line 705, a drive signal for the servo motor driving cylinder 559. By way of this scheme, cylinder 559 may decelerate or accelerate so that the etching PW can be shorted in the higher concentration section 553 (K) and lengthened in the lower concentration section 661 (L). Hence, at a constant length in both etching sections, the PW may be dynamically distributed in the two etching sections working at different etching speeds, according to a lag and lead scheme with respect to the PW construction D entering the etching apparatus and PW construction E leaving the etching apparatus.

Same as all other portions of the PW throughout the process line, also these "loop" lengths of the etching PW are modeled and controlled by CPC 700. For this, when initially feeding the production line with a new cover material 7, 516, rotational position signals from cylinder 536 and 559 and their response delay are calculated so that as a startup condition loops of equal size fit into respective etching sections, which loops then become subject to said automatic distribution under full speed process conditions. By way of this scheme, a high performance of the etching procedure is obtained, at high production speed, for a desired and precisely specified degree of overetching, at a minimum waste. This scheme gives another progressive freedom even for difficult tasks, in which etching has to be carried out at a reduced concentration rate of the etchant, or at a reduced temperature, so that e.g. a delicate cover material or its printed face gets not deteriorated or stressed too much.

For etching conductive paths by aid of non-dispurging ironless etchants it proved useful to additionally support the etching process by known electrolytic polarizing techniques, as is electrolytically anodizing the PW, at least in one of both etching sections, such refinement not shown in FIG. 2. Electrolytically supported etching not only opens a greater variety of usable etchants, a few examples thereof being etchants based on sodium hydroxide, or a mix of hydrochloric and sulfuric acid, or a mix of hydro-chloric acid and an aluminum-chloride solution, provided aluminum as a cunducor path metal should be used; etching speed thus may be highly increased.

As a first advantage, an electrolytically supported etching process mostly can be carried out at considerably reduced concentration of the etchant and/or at a reduced temperature of the working etchant, so that stressings of circuit's cover material may be drastically reduced. Secondly, lower concentration etchants recondition much easier. In an experimental electrolytic etching section, all the same polarizing current used for electrolytically supporting the removal of metal from the PW could be utilized for locally concentrating that removed metal for its effective extraction from the etchant in a simple purification, regeneration and conditioning means for the circulating etchant.

Second advantages may be taken with different techniques of electrolytically aiding the etching process. For obtaining a most uniform etching result, even a merely initial application of an electrolytically polarizing current suited excellent with various etchants. However, it has also be found out, that just periodically applying a positive polarizing current to the PW performs well for obtaining a fast and uniform etching result, especially if combined with an application of suitable foaming and/or ultrasonic excitement aids. Provided a steady and precise maintenance and reconditioning of the etchant is carried out under computer control, then electrolytically duty cycle etching opens a nice and easy way of precisely controlling the progress and state of etching.

Therefore it proved practical to monitor and analyze the inrush slope of the polarizing current in view of its characteristical development over inrush slope time just after the start of every polarizing duty cycle. Such analysis may be performed in CPC 700 in a continuous fashion by Way of a periodical comparison of a new duty cycle inrush slope pattern of the polarizing current with a reference duty cycle inrush slope pattern of the polarizing current observed from all the same etching circuit pattern web, at an acceptable etching result, in the beginning of respective web's processing. Therefore, the trace of such reference inrush slope of a polarizing current may be transient recorded into RAM of CPC 700 for then serving for a reference trace for the continuous control of the voltage and/or duty cycle of a suitable polarizing power supply for providing said current. Similarly, each duty cycle may start with a short period of reversed polarization (having the PW as a cathode) for testing and analyzing the a reverse depolarizing web current for such or similar analyses. Either of said polarizing power supplies thus may be constituted of two independent supplies with reverse polarity, each of them in alternation electronically switching to the production web and a counter electrode means.

On the one hand such refinement of the etching method is useful, since in a foaming etchant the polarizing voltage may be advantageously increased to a value impossible in a non-foaming etchant, whereas the transport function of the etchant for removed metal may be limited and hence requires control. Therefore, monitoring and analyzing a respective polarizing current fits for supporting metal pregnancy control just close to the surface of the PW.

On the other hand, reaching a finished state of PW's etching may easily be detected via a distinct drop or a distinct change of the respective polarizing or depolarizing web current along the PW, so that a responsive voltage drop along the PW then also discriminatingly drops for being easily sensed. It is understood, that for such control the circuit patterns must be provided conductively interconnected one to each other along the PW.

Hence, within the scope of this invention, said maintenance and supply apparatus 555 and 563 may also include whatsoever suitable polarizing power supplies and control electronics for their interfacing CPC 700 as well. Similarly, supply lines 556 and 564 may also represent polarizing current feeders as well, and 557 and 565 may also represent counter electrodes for polarizing the PW in sections K and L as well.

Electrolytically aiding the etching process may either simplify or even make obsolete station 559 & 560, or combine with the latter in a brilliant way, depending on whether or not electrolytically aided etching is also utilized in the second etching section 561 (L). Further, if sections K and L work with with chemically inverse etchants (acid in K against base in L or base in K against acid in L), then station 559 & 560 may be utilizied for minimizing both rinsing and washing time.

Now, the etched PW is fed into a rinsing and cleansing station, preferably having at least two sections 567 (O) and 573 (P) as well, and also run under ultrasonic excitement. This is for intensively removing the etchant even from liquid-pervious cover materials, e.g. from spunbonds as TYVEK, or from other tissue-likes. 568 normally is warm water and a detergent. In the cleansing tanks spill rollers (not shown) may be provided, fitted for engaging with grip holes, so far as provided; touching the surface of the insulative mask patterns on top of etched conductive paths thus may be avoided (for not damaging it), see FIG. 3, window E. 574 is a mix of water and a ionic stabilizer or buffer, if needed, for washing and fine cleaning the PW and preparing the thus disburied sealing layer 6, 507 for recreation. Similar to the etching station, to each cleansing section there is assigned a complex maintenance and supply apparatus 569 and 575, respectively, for recirculating, continuously clearing, and extracting spurious etchant from the cleansing means, for ph, temperature, and level setting and control, and for generating ultrasonic drive power. Via lines 570, 576 respective drive powers are fed to respective arrangements of ultrasonic transducers 571, 577 (may also be provided inside the cleansing section).

Both the etching and cleansing means may be whirled by air 558, 566, 572, 578 applied and suitably distributed by whirl jet means in the output section of respective supply apparatus 555, 563, 569, 575, so as to whirl or support foaming of said means.

After this step, the PW exhibits the E construction shown in FIG. 3, window E, dividing into a first face referred to as the circuit face and a second face referred to as the cover face. This construction now enters the "escalator" section of the production line. 589 is a drying vent, heat controlled, and feeding dry air to the PW's circuit face through a distribution duct 590 over a considerable length of the PW. It serves for non-aggressively drying the etched conductive patterns 1, 40, 503 and the insulative patterns 2, 41, 503 on top, and the disburied sealing layer 6, 507 as well. PW's cover face is subjected to a more complex drying procedure, since a water-pervious cover material may carry a considerable moisture being more difficult to remove. As a first drying means facing roller 579 engages a wiper 580. Porous drying rollers 581 and 582 having PW synchronized drives for being wiped 584 & 585 are being evacuated from their hollow interior, or may carry an endlessly recirculating drying tape 583 which is brought in contact with PW's cover face, and having suction capabilities. The returning section of this tape may be dried by heater 588. Vent 586, heat controlled, provides a dry air flow over PW's cover face and said recirculating tape by means of more complex duct system 587.

Prior to reaching roof pulley 592, the so far processed PW moves through station 591, in which preferably its controlled RF corona chemical treatment takes place. Depending on the circuit materials used, it may be either of the continuous or repetitive type, meaning, having a full duty cycle shorter than a circuit structure's move through it, so that it may be pulsed or triggered from CPC 700 under either computed circuit-in-register or local cover face pilot control, on time for each individual circuit. A suitable embodiment of this station is explained hereunder with reference to FIGS. $4_A$ to $4_C$, later.

All steps to follow now may be flexibly exchangeable one with each other at a larger extent than the previous ones, for meeting different design needs. Practically it suited to have the entire process line cut through roof pulley 592 into a left and a right half, since some portions of the processing machinery on the right half may be imported from the modern paper, card, labeling and tag production domain. In this domain processing stations are available which have standard size and assemble, in a domino fashion, along a suitable transfer machinery, so that a whatsoever right half processing line may easily be tailored and realized for meeting whatsoever custom design requirements.

Station 593 may be a register controlled and actuated second printing station, preferably working with a zero force impact technique. Preferably, laser printing may be applied in this step. E.g., a previously corona treated surface of a spunbonded cover material makes a pretty print surface for many modern printing techniques, since printability is enhanced in this temporary chemically activated state of the cover face. Second prints provided in this station symbolize 127 in FIG. 3, windows F and G. Roof pulley 592 may be provided to have the PW return for a simple exchange of stations 591 and 593, both mounted on a rotable base, similarly as described with reference to laminating cylinders 513 and 521. F represents the corona treated PW having a recreated face 125 of sealing layer 507 and a coronaized surface 124 of dielectric patterns 1, 40, 501, see FIG. 3, window F, and FIG. 5. Provided the corona procedure on the PW takes place just some 100 milliseconds prior to PW's meeting a dielectric strip 9, 84, 112, such strip may also be fed blankly, i.e. without any corona treatment, from a commonly marketed and not prepared or conditioned stock reel U. For such case, 593 may represent such corona station as well, and 591 then may be such zero force impact printing station.

Hence, the PW, conveyed to driven stripping cylinder 596, may be combined, on its circuit face, with an optional dielectric strip 9, 84, 112 of just narrow width, and supplied form said reel U. Such strip may be fed as a tuning strip, insulating tape (for insulating conductive crossovers or the like in the construction once finished) or even as a special dielectric sheet, so far as used. In the latter case insulative mask patterns 2, 41, 503, 539 on paths 1, 40, 105 may predominantly serve for the function of twin-face bonding or sealing conductive paths to such special dielectric sheet 9 or 84 in a later step. For tuning the frequency response of LC circuits, a tuning strip may be fed and shifted in view of its track position by feeding roller 211, 235, actuated by tracking servo 597 addressed from CPC 700 under closed loop feedback control. For the latter, frequency response pickup test set 627 and cooperating shutter means 628 may be integral parts of such control loop. With co-reference made to FIG. 8, such additional material fed onto PW's circuit face may as well be a conductive ribbon or wire 236, tracked by respective deposition roller 235 in a fixed or variable track position, and utilized in a later contacting step.

So far as tuning of a resonant frequency or response of an LC circuit should be provided, it proved practical to provide an RF or MW tuning procedure described later in combination with the substitution of reel U by a sub-process 594 as shown in FIG. 7, which will be referred to hereunder, later. Under CPC 700 control a narrow, dielectric strip may be produced on-line, on demand, and supplied to the PW. Such on-line strip may exhibit currently needed properties. Since such strip is produced real-time and directly fed onto PW's circuit face, rather than being shipped & stocked & reel hooked & handled & loaded & unloaded and the like, it is not susceptible of being damaged, stretched, or the like, and thus may be designed and produced much thinner than any dielectric layer applied in competitive processes of prior art. Since thin dielectric layers make a high capacitance per unit area of capacitor plates or striplines, capacitive metal coverage per unit capacitance may dramatically be reduced. Hence, the method of this invention aims at the make of planar resonant markers having a low X-ray metallization. Since detectivity within well-known security systems of such markers increases the more X-ray metallization is decreased, the method of this invention unveils as a key for consequently solving the task of making such markers exhibit a supreme performance: Electrically and commercially.

From reel T another strip- or tape-like construction material 598 may be fed onto PW's circuit face for further assembly of the electrical structure being made. Station 599 may be provided for this purpose. Owing to the flexible processing scheme mentioned above, such material may be a dielectric strip 84, an additional insulating or tuning strip 112, a full circuit dielectric sheet 9, or optionally aforementioned conductive ribbon or wire 236, e.g. for a later contacting step.

Cylinder 600 and tool 601 to follow may represent distinctly different processing stations, according to said flexibility of the processing line for meeting custom circuit design requirements.

Either a planar contacting station 600 & 601 may be provided for contacting conductive paths 1, 40, 501, thru their thin insulative covers 2, 41, 503, 539 on top, to a conductive ribbon or wire 236 previously fed (on 596 or in 599) onto PW's still full width circuit face (In an early experimental embodiment of the method a sewing machine has been provided in step 600 & 601 for continuously sewing, on a special track, a metal wire into the PW and certain conductive paths thereon, for later warm ultrasonic welding said sewn wire to said paths aided by their completely dislodging, under pressure and heat, said insulative covers). Cylinder 600 and tool 601 may also represent a cylinder pair as are prelaminating cylinders for fixing co-fed strip or sheet materials applied in previous steps. Or they may represent a splitting and/or special grip hole cutting machinery, e.g. for dividing the PW into a plurality of strips each of which carrying at least two or four circuit structures in parallel and/or for preparing additional pilot means on the PW for having it folded next.

Meant is either a direct or indirect folding and/or superposing of the PW, so that electrical circuit components of whatsoever leaf 18 and 19 become superposed in relationship one to each other, between two outwardly disposed layers of cover material 7, 516. This processing step symbolizes 603, and the PW subjected to this procedure symbolizes 602. In either respective step the PW is processed so far that it can be laminated in a next step. Two alternative versions of the fold have been illustrated in FIG. 5 and FIG. 6, however, in a simplified scheme, either figure showing just a primitive single-in-line rather than a multi-in-parallel procedure being carried out. More details are blanked out here and directed to the description of the respective figures. Once splitting PW construction F has been performed in station 600 & 601, a plurality in parallel of divisional PWs may result, as components of construction G after a later lamination step. Hence, no prejudice is made, when in the following "PW" should mean both an individual (divisional) one or the resulting plurality of all such divisional PW strips, since it is obvious, that all processings to follow must be carried out simultaneously, in parallel.

Now PW 604 is fed between at least two heat controlled laminating cylinders 233A and 234. If previously folding has been carried out in the indirect way, then from supply reel S a construction material 9, 84, (598, 605), 112, 236 in the form of an insulative tape or strip or a respective conductive ribbon or wire may be fed as late as just between approaching fractions of PW 604 to meet for superposed lamination, just as illustrated in FIG. 8 showing a planar lamination of PW fractions 221 and 222 between two equally dimensioned lamination cylinders 233 and 234 taking place. In FIG. 2 a slight embracing of lamination cylinder 234 by PW 604 is shown. A practical configuration easier to manage may be that one shown in FIG. 8. However, the configuration shown in FIG. 2 has been used for thermally tuning the resonant properties of LC circuits by aid of RF energy, as an economic solution. A linear (zero embracing) arrangement practically requires a greater number of precisely driven or fly wheeled rollers and cylinders, and thus encounters higher costs. In any case such laminating station is provided with some control electronics for controlling and tuning the accuracy of superposition, especially in the case of an indirect fold of the PW. For this purpose, the pilot means brought in/on to the PW in early station 524 may be utilized. More details referring to such have been directed to the description of FIG. 8.

Thermally tuning LC circuits is achieved by way of heating up at least capacitively effective conductor path portions, and applying controlled pressure so that a thinning of at least one thermoplastic dielectric layer spaced between such conductor path portions is obtained, for thus effecting an increase of their unit area capacitance. Such thinning may be supported by a suitable pattern of a dense plurality of small openings (not shown) in conductive paths particularly provided for such tuning treatment. Such openings may perform the function of small cavities into which an excess fraction of a thermoplastic dielectric layer may escape, and where in part it permanently a may be fixed after the influence of controlled pressure and heat. Suitable conductive paths for the provision of such openings may be capacitor plates of an LC circuit.

Respective openings may be effected by positively not providing or nega-tively removing dielectric layer 2, 41, 539 in respective raster places, by way of a respective control of the line-by-line writing procedure in station 542. In said places such openings then are provided by etching. The positively working patternizing method according to FIG. 13 has proven excellent for providing such openings with high density per conductor path unit area, in an easily programmable and alterable raster fashion. If the density of such raster openings is made sufficiently high, then the resonant properties of an LC circuit may be usefully influenced solely by controlling the degree of (over)etching, meaning, without any additional treatment, since growing by etching the size of such raster openings may significantly reduce the capacitance per unit area between suchlike treated conductive path portions of a circuit.

Obviously, this method of lowering a specific circuit capacitance may shift whatsoever resonance of an LC circuit to a higher frequency. On the other hand, such upshift may be compensated for or even overridden by the inversely working tuning method responsive to said combined application of pressure and heat for inherently downshifting whatsoever resonant responses of an LC circuit to lower frequencies. Hence, a variety of possibilities for tuning up or down an LC circuit may be utilized and combined within the scope of the present invention.

For facilitating a resonance tuning of LC circuits by the application of pressure and heat cylinder 234 has been symbolized as to be hollow. Its mantle is constructed from a non-conductive material (e.g. quartglass), and may cover an RF inductively coupling emitter 606 in its interior. Said emitter may couple to circuit portions either over the full width of PW 604, or merely within a useful track thereof on which specific conductive portions of such circuits expectedly arrive on the mantle of cylinder 234. In the latter case emitter 606 may be servo driven into whatsoever useful mantle track position under CPC 700 control. If merely a narrow track of an LC circuit or even a plurality of narrow tracks of the PW (in case of custom designed multi-in-parallel production) should be subjected to a thermal tuning procedure, then such emitter or a plurality thereof may better arrange outside cylinder 234 thus working as a "tuning cylinder". This is firstly because tracking emitters normally require an arrangement closeup to the circuit construction buried in the PW, and secondly, because in a multi-in-parallel production a sufficiently rigid mantle of cylinder 234 is likely to become too thick for said close arrangement of a plurality of emitters 606 for a sufficient coupling to circuit portions.

607 denotes an RF or MW energy source, preferably in the form of a power generator for the provision of an appropriate output level to be set under CPC 700 control. Additionally, it may be capable of being gated or having its output signal pulse width duty cycle controlled. Feeder 608 connects said generator to said emitter arrangement 606. Source 607 may work continuously, or (triangle symbol) may comprise a reading device for real time reading pilot information from the PW, and upon communication of the read out PW position to CPC 700 may receive (black dot symbol) a processing instruction defining start and stop and thus length of its duty cycle pulse during which said RF or MW power is fed to said emitter arrangement 606, under full PW and electrical circuit's conductive pattern register control. By way of this scheme, a precisely defined amount of heat may be induced, circuit per circuit, into those conductive paths, between which a whatsoever dielectric layer should be thinned under the influence of pressure and heat. 609 represents a servo and its controlling and drive for positioning said emitter array 606 on desired tracks of the PW, by way of actuating connection 610. More details referring to such tuning procedure may be found hereinbelow with reference made to FIG. 9.

PW 604 with just controllably heated up conductor path portions is then laminated between laminating cylinders 233B and 234, under the influence of both controlled pressure and cylinder heat so that PW construction G is obtained shown in FIG. 3, window G.

From laminating cylinder 233B the laminated PW is now conveyed to and around cellar pulley 612 being arranged at bottom of the line, since the processings around and downweb said pulley may call for frequent service or exchange of feed materials according to customer's specifications. Ahead and behind cellar pulley 612 there are provided two respective processing stations 611 and 613, which may be installed preferably on a rotable base so that they may conveniently exchange their location one with each other, just as already described in view of stations 591 and 593.

One of both stations 611 and 613 may be a third printing station, for zero or low force impact printing circuit web G under full circuit-to-print register control. Third prints provided in this station symbolize 128 in FIG. 3. The respective other station is a contacting station for performing a conductive thru-the-cover-connection of conductive paths 36b and 37b to each other, or each one of 36a and 36b to a conductive connecting ribbon or wire 236 applied in a previous step, the first procedure illustrated in FIG. $10_A$, the second one in FIG. $10_B$, a few details referring thereto given with reference to these figures hereinbelow.

A print of either circuit producer's $(e.g.\ iYi)$ or customer's trademark or whatsoever sign may be deposited on circuit's leaf 19 prior to applying a covering self-adhesive film 54, 615 over such print. By this means, such circuit may be made counterfeit proof at a certain extent.

Prints of whatsoever commercial interest may be provided on PW's cover face, according to customer's specifications, e.g. coded and/or readable data 120, or a custom designed frame pattern for later filling in data of merchandise or passenger's airline's flight data, on remote site.

In this well accessible cellar station customer's desires and needs for most modern face designs of circuits may be met. Even dewdrop roses high quality film shoot printing is facilitated here, since even without grip holes the PW is kept and handled and advanced under full closed loop register control by steadily calculating its CPC 700 software model. When applying film printing, 611 would be the contacting station, and 613 would preferably be the printing station, since film printing does not encounter force impacts which could affect or destroy internal electrical contacts made in a previous step. The film thus might cover and hide contacting collars 657, see FIGS. $10_A$ and $10_B$. Similarly, transfer film laser printing, and other most modern methods of face finishing may be applied, too: All these features may be taken, because this novel process has put the PW under register control.

Now the PW is conveyed to a working cylinder 614, on which one of its two faces optionally may be coated with a self-adhesive film 54, 615. For this, thru pipe 616 a suitable coating extruder 617 is fed with an adhesive material 615 fed from supply canister R. The thus processed PW 618 then is conveyed to and fed between driven soft laminating rollers 619 and 620, for being combined with a peel-off paper or siliconized film to protect previously applied adhesive film 54, 615, and to serve for a substitute or additional production carrier function in later processing steps (e.g. in stations 625 & 626, 627 & 628, and 630 & 631). The construction of the PW obtained after this step symbolizes H and is illustrated in FIG. 3, window H.

The PW now passes four stations, which may be exchanged one against each other in view of their succession. Working cylinder 622 and working tool 623 may represent a waste clipper and perform edge clipping or dewasting of the PW construction H, or a marginal shape cut of each individual circuit at least in the direction along PW's advance, such cut either including peel-off paper 621 or not. E.g., no more needed marginal film grip perforations, track and hunt pilot prints and the like at least in part may be cut away from the PW in this station. 624 represents whatsoever removing clipping waste. Contrarily, circuit's shape cutting transversely to the direction of its advance may be directed to a later step in a case, in which no additional peel-off paper 621 (substituting production carrier's transport function and thus maintaining longitudinal registering) has been provided, so that an inter-circuit cover connection is still maintained for the next step.

Process step 625 & 626 represents an arbitrary design perforation and universal shape cutting machinery. Preferably, it is capable of assembling and providing on the PW perforations or cut lines under computer control for any desired design, for separating the PW into individual circuits, or for tearing off individually prepared sections from each circuit once finished. Suspension holes or eye holes may also brought in to the circuits in this station.

E.g., larger "eye holes" may be useful, provided such circuits should be affixed on a video cassette or the like, without disabling the drive mechanism from driving the cassette. Suspension holes may be useful for having such circuits affixed to fashions by aid of well-known nylon hooks. In such case, the self-adhesive film 54, 615, 615 and peel-off paper 621 may be missing, and a sealing reenforcing strip 621 could be comprised in the H construction of the PW so as to reenforce such later suspension hole against tearing out.

Already mentioned frequency response pickup test set 627, in combination with a usefully adaptable shutter means 628, performs a normalized swept response test measurement of finished LC circuits appearing as a planar high order endless LC bandpass filter. Such test may include an automatically scanning of LC circuits, resonance peaks and/or comparing their swept responses with a limit value scheme during LC circuits, approaching and passing a exciting and pickup antenna. The latter may be provided exchangeable for meeting different frequency requirements of different LC circuits produced. The acquired sample date are sent to CPC 700, processed, and returned in the form of control and compensating values and instructions fed into the process, for suitably addressing individual stations, the processing in which makes a considerable and useful effect on respective resonant properties, as are 505, 541, 542, 560, 561 or 593, 594, 597, 607, 609.

Station 629 may be provided for marking with a stamp or fourth print 129 all circuits which might be out of first class specifications or defective. It may also serve for repetitively printing on such circuits a coded or readable brand or serial number, and for excluding defective circuits therefrom. A serial number print may be provided with a registered position on circuit's face by having an individual local sensor scanning a residual pilot means still accessible on the PW. The serial number may be taken from cell 675 of CPC's 700 PW modeling column shift register as shown in FIG. 11. However, both print execution and count increment instruction preferably may be issued by CPC 700 once the current circuit's test result met specifications in the previous step, so that out-of-specifications-circuits are blanked out from a serial number or whatsoever fourth print 129.

The tested PW is now conveyed to a final cutting apparatus 630 which may work against cutting base 631 This apparatus either transversely perforates or cuts the PW between subsequent circuits in a computed and/or locally read out and acknowledged in-register position with its print face and electrical circuits contained. As a result, a web may be obtained, consisting an endless and favorably transversely perforated peel-off strip 634 which strip carries, in succession, self-adhesively fitted circuits 633. Circuits, cover material either may be left uncut at a minimum extent in at least two places between each other, or may be fully cut or even dewasted for lateral spaces between each other, so that such circuits can be peeled off as individuals or automatically attached to objects by means of known rolling dispensers. On the other hand, if no peel-off paper or film 621 has been applied, or if it has been applied for then being fully cut together with the PW, then individual circuits 1000 may be obtained just as shown in a still unfinished state in FIGS. $1_A$ and $1_B$. In this station residual pilot means may also be cut away from finished circuits.

FIG. 3 making reference to FIG. 2 selfexplains from the foregoing. Arrows show PW's direction of advance, and an additional dielectric sheet or strip 9, 84, 112 is shown, rather than contacting means, in windows G and H. Production carrier's 7, 516 pillow effect so as to partially flush conductor path thicknesses has been emphasized.

FIGS. $4_A$ to $4_C$ show useful arrangements for corona treating the etched and dried F construction of the PW. F is fed thru a corona discharge zone arranged between electrodes 130 and 131. Depending on whether or not the etched circuit patterns are connected one to each other across and/or along the PW, a more or less shielding effect by the circuit patterns themselves may encounter, somewhat related to the shielding effect of grids in amplifier tubes. Hence, if connected, a grounding path 136c may be provided terminating into (parasitic) ground resistor 136b. For not damaging the thin dielectric cover layer 2, 41, 503, it may suit to have electrodes 130, 131 excited in a more or less unbalance with reference to ground. This may be achieved by an output transformer of the corona power source 132 having combined secondary windings 134 consisting of $w_1$, $w_2$, and 135, consisting of $w_3$, wherein $w_1$ to $w_3$ normally may represent unequal numbers of turns. Secondary 134 is shown tapped, the tap point fed from secondary winding 135, having its other end grounded via ground resistor 136a. Amplifier 133 of source 132 may be fed by an RF drive signal via input 140 and a level control signal via input 141. Servo amplifier 137 may perform a comparator function and compare the unbalance voltage drop across ground resistor 136a and a control voltage applied via input line 139 and issued by CPC 700. As a response to the actual and the desired voltage drop across ground resistor 136a (representing the web current) servo amplifier 137 may influence, by way of suitable means 138, the mutual magnetic coupling factor of windings 134 and 135 both with respect to each other and the corresponding primary, not shown. Such arrangement facilitates a controlled and limited closeup corona treatment of layer 2, 41, 503, for temporarily creating sealing capabilities in a thin surface layer 124 thereof. Such arrangement may suit as well for cases, in which electrical circuits are produced non-connected to each other. E.g., servo amplifier 137 may also compensate for temporary deviations of the PW from its desirably ideally stretched track through the corona field, e.g. due to varying strains in the direction of its advance.

FIG. $4_B$ shows a practical arrangement of two corona stations in succession, either one having a substantially plane electrode 131A, 131B, and a respective distinctly differently constituted counter electrode 130A, 130B, electrodes 130A and 130B and 131A and 131B being arranged on different sides of the PW. The counter electrodes 130A, 130B preferably may be of the peaking type, as may be needle or wire electrodes. For the excitement of the corona zones individual RF power generators 146A and 146B are provided, each of them being controlled via respective Corona Enable lines $CE_A$ and $CE_B$ driven by a control apparatus 147. The latter receives on its Hop Corona line HC a signal for differentially timing the repetitive duty cycles of said RF power generators.

FIG. $4_C$ shows a schematic diagram of a more universal corona apparatus 146 for being utilized according to FIG. $4_B$. A first RF power generator 133a receives a Corona Enable signal CE, a first corona power Level set signal LV, and, thru a hybrid device 142, an RF drive signal RF. A second corona power generator 133b receives same Corona Enable signal CE, a second corona power Level set signal $LV_2$, and thru said hybrid device 142 a respective RF drive signal having a selectable phase offset with reference to means, 133a respective RF feed signal, said offset responsive to a Phase Offset signal PO driving said hybrid device 142. Further, generator 133b may employ an input for receiving a Corona Duty Cycle signal CDC, for duty cycle chopping the output power of generator 133b. Power generator 133a feeds an output transformer 144, preferably having a tapped secondary winding, the ends of which being connected to corona electrodes 130 and 131, respectively. These electrodes may be of different surface types. Power generator 133b feeds a respective output transformer 145, the secondary winding of which being connected to said tap point of transformer 144 and to ground via resistor 136a, respectively. Its voltage drop with reference to ground is fed to a detecting means 143, for detecting a Web Current WC for being fed back to CPC 700, e.g. for responsively adjusting the Corona Duty Cycle signal CDC or power Level set signals $LV_1$ or $LV_2$, respectively. Detector 143 may be of the synchronous type, hence receiving the driving RF signal RF, too, as a phase reference.

So far as conductive circuit patterns are produced with an endless connection between each other, the aforementioned apparatus thus may utilize the metal paths of the electrical circuit as a reference electrode, which thus may be switched or chopped in alternation with respect to said corona electrodes. By this a controllably different corona treatment may be achieved of the disburied sealing layer 6, 507 and the dielectric pattern 2, 41, 503, by hopping, in a modulating manner, the effective corona field mainly either through non-metallized areas, that means through production carrier 7, 516 and resealing layer 6, 507, or onto dielectric patterns 2, 41, 503, according to a chopping duty cycle signal. By way of this a controlled recreation or generation of temporary sealing properties of thin surface layers 125 and 124 is achieved, see FIG. 3, window F.

This way of locally controlling the corona treatment cares for not damaging or overheating thin dielectric mask pattern 2, 41, 503, and for precisely influencing the degree of recreation of the resealing capability of sealing layer 6, 507, which previously has been exposed to the etchant. For higher speed or better control of a high intensity treatment at least in part an inert gas or another gas besides the oxygen in the air may be supplied to co-engage in an airmix, not shown here. Thus, a more stable jam-sealing surface of insulative mask 2, 41, 507 (just necessary a short period of time up to lamination occurs) may be obtained.

FIG. 5 shows a first procedure 602 of folding the PW 603. The explanation given shows a single track operation; in a practical machinery for economy at least two, preferably four or more circuit patterns may be superposed in parallel. The PW may be folded many ways, e.g. in the center line of full width 50% by 50% (for obtaining any number of circuits in parallel) or in lines at 25% and 75% of full width 25% by 25% (for obtaining even numbers of circuits in parallel), or the like. When small volume producing on divisional PWs (behind 601 at least two divisional PWs), each divisional PW carrying four a finished (folded) circuits in parallel proved to be an economical choice for making resonator circuits according to FIGS. $1_A$ and $1_B$ having a 42 mm×42 mm size, and exhibiting an 8,5 MHz resonance. Folding perforation 8 halfens the PW, consisting of cover material 7, 516, sealing layer 6, 507 and dielectrically coated 2, 41, 503, 539 and coronaized 124 conductor paths 1, 40, 501 on top. The latter substantially form a central conductive path 36 & 37, respective first and second spiral paths 90 and 91, and respective capacitor plates 95 and 96. Short circuit loops 90a and 91a are also provided. A dielectric strip 9, 84, 598, 605 is affixed to the still plane construction, so as to cover capacitor plate 95 and a portion of said conductive spiral paths 90. On a marginal track 212 (separated from circuit pattern areas on the web by severing perforations 213) repetitive grip holes 214 are provided, for transporting the PW. Normally, this perforation is provided in a later state, same as are other perforations indicated and symbolizing 215, 216, 217, and 218, after folding and laminating has been carried out. Evidently, upon folding, dielectric strip 9, 84, 598, 605 insulatively separates crossovers 99 of conductive paths 90 and 91, for preventing short circuits between the latter.

FIG. 6 illustrates a second method 602 of folding; for simplicity just a respective single track PW 603 is shown. Still plane PW 602, as a one-piece device 220, is conveyed, about tapered cylinder 223, to driven cutting cylinder 224, pilot humps 225a of which engage with grip holes 214a along at least PW's margins. Rolling cutting knife 226 separates, along cut line 8, PW 220 into two respective halves 221 and 222. On the carrier material 7, 516, sealing layer 6, 507 is indicated, same as location of respective circuit pattern leaves 18 and 19. Different types of pilot prints 230, 231 and 232a to 232d are shown, applied preferably in station 523 & 524 in FIG. 2. For later superposition and register control of divisional webs 221 and 222, these prints preferably may be separated, along line 8. Whereas divisional web 221 is feed directly to the next processing step, divisional web 222, after having passed detaining roller 227, is turned by 180 degrees and taken over between cylinders 228 and 229 for being conveyed to the next processing step. Marginal tracks 212 and perforations 213 have same meaning or function as referred to in FIG. 5.

FIG. 7 diagrammatically illustrates an apparatus 594 for the online provision of a dielectric tape or strip 84 according to FIGS. 33A and 40, which strip exhibits precise electrical properties on demand. Such strip may be desired for serving or coserving for the function of a capacitor's dielectric, so as to obtain, as an output of the production line, resonant frequencies of finished electrical circuits which come to lie within a predetermined range between limits of tolerance. The apparatus configures and works as follows:

From supply canister 152 a conveying apparatus 153 takes in a dielectric raw material 151 preferably provided as a granulate. Practically, polyethylene or polypropylene as obtained under special conditions of polymerization and commercially available on the markets suited well for this purpose. Conveying apparatus 153 is controlled by servo apparatus 154 ($S_0$) which is governed from control channel $s_0$ of a Sub-Process Controller (SPC) 150. Granulate 151 is fed into small and quickly responding high pressure extruder 155. Via channels $s_1$, $s_2$, and $s_3$ of SPC 150 servo apparatus 156 ($S_1$) for controlling the extrusion temperature, 157 ($S_2$) for controlling the extrusion pressure, and 158 ($S_3$) for adjusting the movable extrusion slot die 159 as an extrusion tool are addressed. Said movable slot die allows the extrusion of a substantially narrow dielectric tape 160 having a selectable thickness in the practical range of 10 to 40 $\mu$m. Slot die's construction and its extrusion thruput are selected so that a production of said tape is possible at high speed. Both speed and desirable recrystallization properties of the dielectric tuned to later processing needs are supported by freezing tape 160 upon leaving the extrusion die by submitting it to a low temperature cooled gas 162 supplied into a special cavity 161. For this purpose a gas cooling apparatus 163 may feed liquefied air or nitrogen to a thermally insulated 164 supply tank 165. Via duct 166 and valve 167 cooling gas is supplied to the extrusion die, which supply is controlled by valve servo 168 ($S_4$) governed from channel $s_4$ of SPC 150. The freshly extruded tape is drawn off by cylinder 169. It is obvious, that the thickness of tape 160 in a first approximation is defined by extrusion temperature, extrusion pressure, slot width of the extrusion die and draw off speed resulting from cylinder's 169 revolution speed. If the tape is drawn off at a speed higher than the extrusion speed, stretching of the tape in the slot die's output region and the short extrusion temperature drop region (following the die) may be achieved. For a precise stretching all of the aforementioned four values are governed and combined under computer control. A stretched polyethylene tape generally offers a better tuneability when submitted to a microwave procedure in a later step. Preferably, at least a circumferential track of cylinder 169 is porous, that means air-pervious. Cylinder 169 is rotated at an adjustable and controllable circumferential speed by means of drive unit 170, e.g. by having the revolution speed phase locked to a timing signal received from SPC 150. Practically, a flywheel 171 may be arranged between drive unit 170 and cylinder 169 for a high short term constancy of revolution speed. Drive unit 170 is controlled by servo 172 ($S_6$) from channel $s_6$ of SPC 150. A depressurizing pump 173 supplies, via duct 174 and a settable valve 175, air 177 with low pressure to a stationary low pressure cavity 176 mounted inside cylinder 169 at a fixed position with respect to said cylinder. Said stationary low pressure cavity is designed so that merely a slight air suction is obtained through the air-pervious portion of the revolving cylinder mantle over a circumferential zone having a circumferencing angle less than the embracing angle of tape 160. Thus a perfect adhesion of tape 160 on cylinder 169 is achieved within said stationary angle of circumference. Just prior to tape's 160 leaving cylinder 169 a marginal clipping of tape 160 may be performed, at zero force to the tape, by means of rotary knifes 178 working against cylinder 169; clipping waste 179 may be taken off by a vacuum apparatus 180. After clipping, tape 160 passes an apparatus 181 in which it gets subjected to a high frequency corona discharge procedure taking place between two suitably designed electrodes 182. The design of this apparatus is in accordance to known art. Said electrodes 182 are connected, via lines 183, to a high frequency energy source 184. The latter is controlled in view of the intensity of the discharge field by means of servo 185 ($S_7$) from channel $s_7$ of SPC 150. Since tape 160 has a small practical width, this energy source needs to put out just a moderate power. By coronaizing, the tape's surface is chemically modified under the influence of air oxygen with respect to its radicals so that in a subsequent step the tape is capable of being laminated on surfaces both of metal and olefins with a particular high adhesion power, at a considerable low pressure and temperature. Further, in this state it may be easily electrostatically charged. Such electrostatical charging may support the tape's track stable adhesion, without special fixing means, when it joins the moving production carrier prior to the laminating step. 84 denotes the dielectric tape after clipping and coronaizing. If tape 84 should be very thin, then a turn around cylinder 186 may be provided and driven by a particular drive unit 187 via a flywheel 188 and a slip friction clutch 189 directly acting on cylinder 186. In connection with a low moment of inertia of cylinder 186, this arrangement may provide a constant strain force on tape 84 subjected to the corona treatment between cylinder 169 and cylinder 186. Via channels $s_8$ and $s_9$ of SPC 150 servos 190a ($S_8$) and 190b ($S_9$) are addressed for the adjustment of RPM speed and/or the friction moment of the slip friction drive. For this purpose the strain force applied to tape 84 may also be sensed, this detail, however, not being set forth here. Behind cylinder 186 tape 84 may feed a loop 191 loaded by a suspension pulley 192 to which a mark 193 may be fixed. From non-driven tracking pulley 211 tape 84 is finally conveyed to the production carrier, e.g. in a latest state just prior to the laminating step as illustrated in FIG. 8. Loop 191 may be useful for maintenance of a constant revolution speed of cylinder 169 even in a condition in which slight deviations of the production carrier may occur. By means of loop 191 the dielectric tape 84 is prevented from overstretching, so that it can be installed on the production carrier with a defined thickness between e.g. capacitor plates 95 and 96, see FIGS. 5 and 8. Setting the width of slot die 159 responsive to current process requirements may be aided by the utilization of high frequency measuring techniques for continuously measuring, as a material coefficient, the thickness to dielectric permittivity ratio of moving tape 160 or 84, respectively. For this purpose prior to tape's 160 entry into measuring cavity 211 it may be fed through a first cavity 194 in which it is warmed up and stabilized at room temperature by means of a heating apparatus 195. Said heating apparatus is controlled via servo 196 ($S_5$) from channel $s_5$ of SPC 150. Measuring cavities 211 and 212 are connected via transmission lines 197 and 198 to a measuring apparatus 199, which apparatus communicates current samples of measured values via two digital output ports 200 ($R_1$) and 201 ($R_2$) to input channels $r_1$ and $r_2$ of SPC 150. A measuring apparatus 202 preferably having an optically or inductively based linear position sensor 203 further transmits, via its digital output port 204 ($R_3$), the position of mark 193— and thus the conditional state of loop 191—to input channel $r_3$ of SPC 150. Executing twice said measurement on the moving dielectric 160 or 84 in cavities 211 and 212, respectively, allows a particularly reliable control of the coronaizing step under a specific strain force to which the dielectric is subjected thereby. Via line 205 an averaged mean value of the resonant frequency of finished produced circuits may be fed back from the end of the production line to input channel $r_4$ of SPC 150. Respective resonant frequency samples are fetched from digital output port 208 ($R_4$) of a suitable test apparatus 207, which apparatus inductively picks up the resonant frequency response from finished circuits by means of at least an inductor loop 206. Said apparatus 207 may either be identical with apparatus 627 shown in FIG. 2 or provided extra. SPC 150 may also import suitable resonant frequency data from CPC 700 performing as a receiver to own response pickup test set 627 and 628.

It is understood that the first and main function of SPC 150 is to on-line provide a dielectric layer for being installed between capacitively reacting conductive paths or capacitor plates of electrical circuits having desired resonant properties. Thus, SPC 150 allows a desired resonant frequency to be obtained within predetermined limits of tolerance, independent on the speed of the main process. In connection therewith, not only dielectric tape's thickness, but also its thickness to permittivity ratio may be influenced for compensating for deviations of raw material parameters of granulate 151. Secondly, in the manner of a compensatory response, also an independency on whatsoever deviations of thickness and/or dielectric permittivity of said etchant resistive and insulative mask patterns may be effected, which patterns are constructed in respective light station 542 or 542a on the first face of metal foil 1, 40, 501. Thus a minimized out-of-frequency-waste of electrical circuits may be achieved, provided such circuits should exhibit close tolerances of at least one resonant frequency. Thirdly, SPC 150 may care for the delicate "acceleration run" up to full production speed of the entire production line, mainly by short response controlling slot die 159 and extrusion pressure of extruder 158.

Advantageously SPC 150 is provided extra, that means besides CPC 700, for being exclusively assigned to the apparatus according to FIG. 7, since the described extrusion process takes a quick acquisition and processing of many measured and controlled values and their fast translation into control instructions as well. The fabrication process shown in FIG. 7 may be run in a self-controlled manner at its own speed by "clocking" the speed of the main production line, or, contrarily, may be slave clocked from CPC 700, the respective connection between both being symbolized by numeral 595. Thus, SPC 150 either feeds, via channel 209 being part of 595, a timing signal (clock pulse "CP") to CPC 700, which timing signal may be derived from the speed of advance of dielectric tape 160 or 84, or from cylinder's 169 revolution speed, respectively. Or SPC 150 receives from CPC 700, via channel 209a being part of 595, a slave timing signal (slave clock pulse "SCP"), which is derived from the production carrier speed, for precisely tuning the speed of tape 84 in response to the speed of the main process. It is obvious, that parts 186 to 193 and 202 to 204 may be omitted, if the response time delay of the entire process 594 is kept sufficiently small, so that, once the corona treatment has taken place, tape 84 then may be fed either around tracking pulley 211 (in this case preferably driven by a similar slip friction clutch) or even directly to the production carrier. If microwave tuning is utilized within a later laminating procedure and the laminating temperature thus can be selectively increased and controlled in the region of circuit's capacitor plates or low-impedance-striplines, then parts 197 to 201 and 211 and 212 may also be omitted, particularly in case of a suitable design and/or outline of such plates or striplines. SPC 150 may comprise further input-, output-, or bidirectionally operable channels 210 ($f_1 \ldots f_4 \ldots f_V$) for the acquisition or interrogation of control or measuring values either from external process stations or from CPC 700. Practically, SPC 150 is provided as a microprocessorized circuit having a proper I/O channel capacity for the combination of all important parameters and values by means of software deposited in its own ROM.

The production step according to FIG. 7 may be substituted by simply feeding, from supply spool U, a dielectric tape 84 as commonly marketed and having, at a high uniformity and constancy, exactly defined properties, particularly in view of its thickness and dielectric permittivity. Though in subsequent production steps various measures can be taken for obtaining a desired resonant frequency, both out-of-frequency-waste and production costs of resonant electrical circuits can be minimized by on-line influencing and tailoring on demand the dielectric properties of a narrow dielectric tape or strip on-line supplied to the process.

FIG. 8 shows a simplified laminating procedure to which divisional webs 221 and 222 according to FIG. 7 are subjected. For simplicity, the feed of materials 236, 9, 84, 112, 598, 605 in stations 211, 235, 597 599, 233A and supplied from spools U, T, S has been incorporated with the intake step of the laminating process. Laminating cylinders 233 and 234 are heated and driven and take in therebetween divisional webs 221 and 222 by aid of pilot humps 225a engaging grip holes 214a arranged in succession along divisional webs, margins. Said pilot humps 225a comb in respective cavities 225b of the respective counter cylinder, arranged on its circumference, centered between pilot humps. For allowing such combing, larger mask holes 214b are provided along divisional web's margins, so as to alternate in succession with grip holes 214a and superpose one kind the respective other kind upon lamination. Divisional webs 221 and 222 basically have same construction as shown in FIG. 6 and 39; however, said central conductive path 36 and 37 here assembles, upon lamination, from two spread portions 36b and 37b (for directly contacting one to each other according to FIG. $10_A$ to follow) or 36a and 37a, respectively (for indirectly contacting one to each other according to FIG. $10_B$ to follow). Exemplary, from pulley 235 a contacting ribbon 236 is fed between these portions. Similarly, an additional insulating tape 112 could be fed from that pulley, e.g. for supporting dielectric strip's 84 insulating function within the electrical circuit. In view of perforations 213, 215, 216 and similar short circuit loop 91a reference is made to FIG. 6. Cut and non-cut pilot prints 23 and 230 are shown, serving for position and advance control functions for the two divisional webs 221 and 222 to be combined to an unitary construction. A practical way of feeding predetermined amounts of heat to such cylinders has been described in a more recent Patent Application of applicant. However, RF inductive mantle heating has proven to be a favorite method, not only because of its fast response.

This refinement further facilitates individual partitions of suitable laminating cylinder mantles being assigned different amounts of heat, both axially, and circumferentially, in register with circuits to arrive thereon.

Inductive partition heating, i.e. positioning predetermined heat partitions on cylinder mantles, may be achieved by having a respective inductive power source gated or keyed in dependency on read out pilot prints 230, 231 or in a synchronized relationship with a periodical scanning of said column shift register model run in CPC 700 for grip-hole-less position management of the PW (the circuit column corresponding with circuits entering the laminating station may be change-of-state interrogated for continuously triggering a new partition heating duty cycle). Such "hot spot cylinders" may either enhance or make obsolete separate RF or MW tuning devices, as follows.

As a counterpart of a "tuning lamination drum" as referred to in FIG. 2, FIG. 9 shows an universal laminating tuner as preferably being provided within a more complex laminating station just in the intake region between two laminating or post-laminating cylinders.

233b and 234a represent such driven laminating cylinders, preferably controllably heated. PW 604, preferably upon folding as explained, passes over a row of transversely arranged coupling windows 643 capable of emitting RF or MW energy. These windows are arranged on tuning heads 642. Said tuning heads 642 may exchangeably fit into supply and base drives 641 as indicated, for suiting the current tuning needs. Each of said base drives comprises a servo driven tracking nut 647, circumferencing and engaging a threaded control shaft 640 penetrating all units and being fixed to a base plate 645. An electronic ruler bar 646 is provided in parallel, also penetrating all units and also being fixed to base plate 645. Upon servo driven revolution of said tracking nuts 647 each unit may shift its track from whatsoever current home or job position to a new job position, according to the current desire. Therefore a servo electronics (not shown) incorporated in said base drives 641 reads the respective track positions from electronic ruler bar 643. A data link 595a is provided for connecting local Tuning Controller (TC) 652 with CPC 700, so that the latter's current track instructions may be received for the definition of tracks 644 on the PW, which desirably should get subject of a thermal tuning procedure to follow. TC 652 may operate individual track supplies 651, each one of them incorporating an individual RF or MW source for powering said coupling windows 643, motor drivers for controlling said nut driving servo motors, and track position acquisition detectors. Such arrangement features a very fast response, and allows cylinders 233b and 234a being driven at a considerable low temperature, being of importance when e.g. a low density spunbonded olefin cover should be used.

Practically two types of selectively heating up conductive path portions between PW's cover faces may be utilized. The RF method may effect the heating up of metal areas preferably in their marginal zones, along their circumferences. The establishment of a resonance condition is no need in this procedure. The MW method may effect a more patternized heating up of metal areas, meaning, not only in their marginal zones along their circumference. Hence, the MW method may be used to heat up specific strip lines, characterized by a considerable small area in comparison to their circumference. The MW method works more effective, if the emitter arrangement is designed as a coupling resonator, a temporary component of which is made (by virtue of capacitive/inductive coupling) a currently registered conductive area or path which desirably should be heated up.

Another advantage may be taken from an RF or MW energized heating up of conductive paths. So long a circuit portion to be heated up, on its move over cylinder 234 (FIG. 2) or tuning head 642, has not yet reached said emitter arrangement 606 or coupling window 643, a heavy mismatch of said emitter arrangement 606 or coupling window 643 to whatsoever RF or MW power source 607 may encounter. Hence, such emitter or coupling window may be fed, on duty frequency, with a steady quiescent RF or MW power level, and transmission line 608 or 648 may be controlled by means of a dropped in directional coupler 720 for monitoring the forward and return RF or MW power level or return loss. As soon as emitter arrangement 606 or coupling window 643 gets capacitively/inductively completed by circuit's metal area to appear in an early cylinder or window position for being heated up, a high return loss previously monitored significantly drops. A suitable discriminator being combined with source 607 or being part of 651 may communicate the event of the expected minimum or an otherwise specified return loss drop value (e.g. for blanking out unwanted heating excitements due to minor loss drops caused by narrower conductive paths) either to CPC 700 or TC 652, for being returned the appropriate power up level instruction for the RF or MW power source, and/or the start time and duration of its duty cycle heating burst issued to emitter arrangement 606 or coupling window 643. Hence, an automatically registered circuit-to-circuit synchronization of the tuning procedure may be obtained, without any reading out of whatsoever pilot information from PW's cover face. Thus, a considerable simplification of the moving part section of such station may be achieved.

FIG. 14 shows a schematic diagram of a such like refined and completed RF or MW power source 607 comprised in track supply 651. 699 symbolizes the air gap through which tuning head 642 couples to the PW 604 and conductive path areas to be heated up. The RF or MW energy source may have four inputs for receiving job instructions from TC 652. A first line DCT is for receiving Duty Cycle Time. A second line TE is for receiving a Tuning Enable instruction. A third line JF is for selecting the Job Frequency, on which the heating up procedure should take place. A fourth line PL selects the appropriate job Power Level. 720 symbolizes a directional coupler dropped in between the output line 648a of RF or MW source 607 and the input line 648 of base drive unit 641 connecting to tuning head 642. Via line 723 the return loss signal of directional coupler is fed to a discriminator 724, the second input line 725 of which being fed with a Return Loss Reference signal RLR from TC 652. Via line 726 the output of discriminator 724 feeds RF or MW power source 726 with a ready signal, which may be AND-combined with the tuning enable signal TE internally of source 607 for defining the auto-start of the programmed duty cycle time interval as explained above. Shortly before the RF or MW source 607 powers up a transmission gate 721 may be triggered via line 722 for shorting and/or protecting the directional coupler 720 and/or the input of discriminator 724 from saturation or damage under power up, overload or accidental mismatch conditions.

In view of the embodiment shown in FIG. 2, utilizing emitter arrangements 606 in the form of a MW resonant structure normally requires a close up provision of such arrangements to the PW on cylinder 234. Hence, such MW emitter arrangements preferably may be provided over the outer circumference of such tuning cylinder. MW tuning on cylinder's or drum's mantle gives another advantage. The mere outer mantle of the tuning cylinder, meaning a layer of specific thickness, needs to be just low- or non-conductive. For a multi-in-parallel circuit production cylinders 234 thus may be designed for low cost, basically like commonly used laminating cylinders as known from the art of producing normal tags and labels. They have just to be fitted with a suitable mantle of proper shape.

A variety of revolver exchangeable emitter arrangements 606 or tuning heads 642 may be provided for different tuning applications. From such revolver a currently suitable emitter arrangement 606 or tuning head 642 may be disparked (by parking a previously used one for exchange) and automatically loaded and dropped in tuning cylinder's 234 tuning base or the respective base drive 641, thereby providing an automatic connection to source 607 or track supply 651, respectively. Each emitter arrangement 606 or tuning head 642 may be fitted with a whatsoever data carrier (e.g. a bar code or ROM) for setting both its optimum operating frequency and power level in source 607 or track supply 651, and detection sensitivity of an optional directional coupler dropped in line 608 or 648, for best results with the respective emitter arrangement or tuning head. Hence, such data may be electronically deposited so as to be overridden or updated upon demand by CPC 700 or TC 652 instructions. Such data may also be carried with the respective emitter arrangement or tuning head as characteristic fields of values, for various different standard circuit design applications, for which such values once have proven best. According to such standard data being combined with the current real-time tuning job data received from CPC 700 (due to closed loop control of finished circuit's resonance response picked up by response test set 627) or TC 652, the source 607 or track supply 651 may be preset in view of its frequency and/or output power level, e.g. via JF and PL lines as indicated in FIG. 14.

Figure 10A:
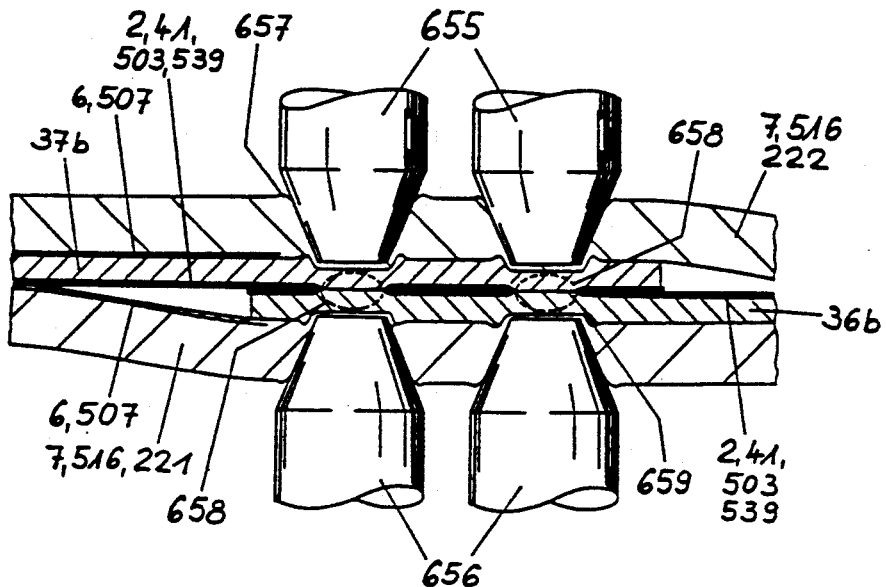
Figure 10B:
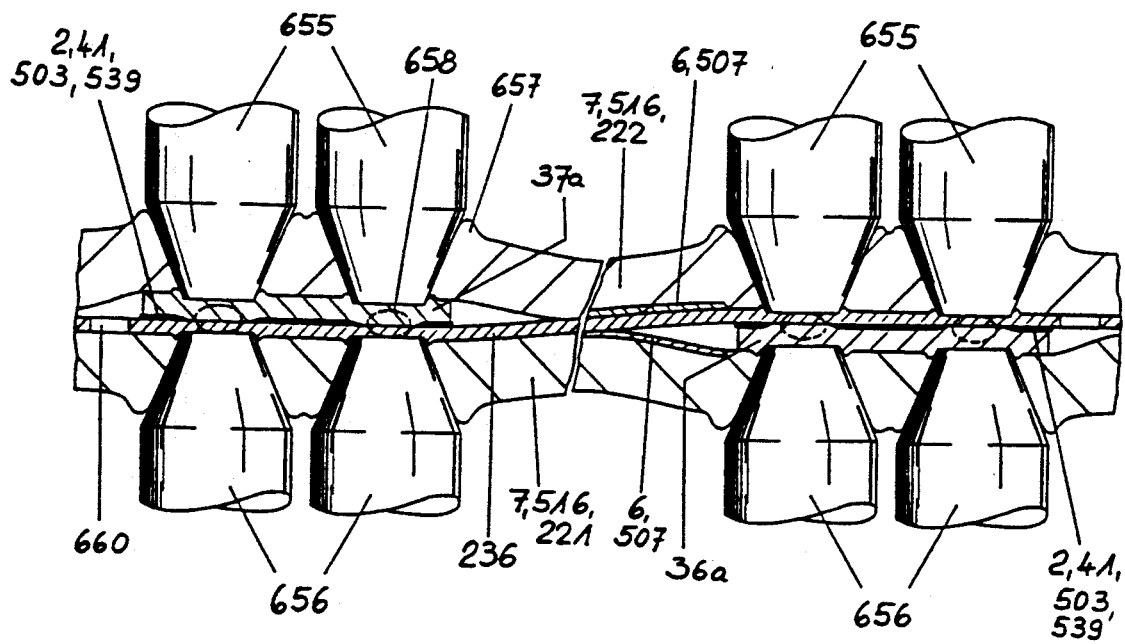

FIG. 10$_A$ illustrates the connection of overlapping conductor path portions 36b and 37b to each other in the G construction of the PW, as being carried out preferably in stations 611 or 613. A "buried" welding of said path portions 36b and 37b to each other is effected in a penetrating manner thru cover material 5, 516 or web faces 221 and 222, respectively. For simplicity, sealing layer 6, 507 has been illustrated as a component of the cover material; thus, in any case, the welding procedure is carried out through said sealing layer. A junction of conductor path portions 36b and 37b is shown having two welding zones 658. Preferably, the welding takes place between upper and lower welding tips 655 and 656 acting against each another. A well-known excitement of the welding tips by ultrasonic energy may support the welding process. Though cold welding methods suit for this step, additionally heating up the welding tips proved useful for suitably dislodging dielectric layer 2, 41, 503, 539 from welding Zones 658, under the influence of pressure and heat. Such heating up may offer a further advantage, provided covers 7, 516 or respective 221 and 222 not only should be compressed between welding tips and conductor path portions to be connected to each other, but also should be somewhat displaced for a reenforcement of the circumferences of such welding dot zones thru which welding tips previously penetrated said covers. E.g., TYVEK or polypropylene spunbond covers allow both welding to each other conductor path portions and—simultaneously—a circumferentially melt-sealing in all the same step said covers around welding tips' penetration zones, provided the welding tips are suitably preheated. This way of connecting allows the welding pressure to be raised beyond flow yield of conductor paths, thus leading to highly reliable contacts.

If finished circuits should be subjected to extensive rolling or arching stresses for use, then respective conductor path portions 36a and 37a may be designed better in a non-overlapping scheme, for having them electrically connected to each other by means of an inserted conductor in the form of a ribbon-, wire- or tape-like contacting means 236.

FIG. 10$_B$ shows the simultaneous execution of two conductive welding junctions in an electrical circuit by means of such conductive connecting ribbon or wire 236; such ribbon may be transported by suitably engaging grip holes 660 provided therein. Meltable production carrier's welding collars 657 around heated welding tips 655 and 656 are shown. In the welding cross section 658 the insulative layer 2, 41, 503, 539 has been indicated as being fully displaced.

FIG. 11 shows a typical structure of a software shift register 670 as preferably being managed by CPC 700 for maintenance of an in-register condition under whatsoever production carrier's longitudinal deviation conditions over the entire production line. Such management preferably suits for a grip-hole-less advance management of a production carrier. A plurality of individual shift registers may be provided and updated in parallel for individual tracks of circuits. With each advance increment of circuit size of the production carrier a position reference value is loaded into a position cell 674 of the respective register column 671 newly born. A pilot print applied to the production carrier in station 523 & 524 (see FIG. 2) is made in compliance therewith, thus at least in a coded form representing that positional value.

Between stations 523 & 524 and 630 & 631 the PW length is taken as a constant ("machinery length") and divided by the size of the circuits to be produced in the direction of the PW, for obtaining the number n of circuits being in production once at a time, and together making up the full PW length. The production length may vary, depending on the number of processings to be carried out, according to customer's specifications and circuit requirements. Every processing station may automatically send identification data on its presence in the production line to CPC 700 for the auto-calculation of the actual processing length.

For every circuit to be produced cell 675 is filled with a circuit number, which may later serve for its serial number print. In cell 676 a reference time or a reference measure of production carrier's length is entered, which time or measure is the actual one in the moment of initially depositing said piloting position print on the production carrier. In cell 677 a measure of deviation is entered, which measure defines an error between the calculated instance of time or length of production carrier's advance and the currently decoded one—based on production speed, position readings in a recent and a current processing step. In cell 678 a calculated instance of time or length of production carrier's advance for reaching the next location for position reading may be filled in. In cell 679 a layout exchange flag may be set. In cell 680 a failing track flag may be set.

Upon advance of the production carrier by a circuit's size increment previous column 671 is shifted one step to the right as new column 672 and so on, up to its getting abandoned as column 673 when the finished circuit leaves the process after n steps. Thus a steady update of these columns by current values, on columns' travel through a suitable program, gives a complete model of production carrier's or web's position thru the entire production process. This model simply if/then triggers all instructions issued by CPC 700 for processings to take place in register either to the commercial or the electrical face of circuits being made.

FIG. 12 illustrates an useful network structure for the control of the entire production line and for receiving and accepting custom designs. CPC 700 may be a commercially available computer of VAX to VAX$^2$ workhorse power level. Preferably, it may either incorporate or interface a special I/O interface or sequencer 710 tailored to the needs of the process line, and driving and supervising I/O channel banks 701 and 702. Said interface or sequencer may also care and compensate for speed limits and delay times of the data exchange and transfer to remote processing stations, which in a practical machinery suit to be connected to I/O banks 1701/1702 of interface or sequencer 1710 in a point-to-point scheme (e.g. 704, 705, in FIG. 2), rather than in a bus scheme.

A separate mass storage device or non-volatile memory 713 may be provided for depositing and keeping finished or modified designs of both electrical and commercial faces of circuits, from where they may be quickly fetched on demand. Via output lines 715 a power-up drive module 714 controls all driven cylinders. This unit particularly cares for the initial startup management of the process line to full production speed.

A special bus port 703 and data bus 595 (see also FIG. 2 and 595a in FIG. 9) may be provided for having CPC 700 linked to other computers engaging with the method, e.g. SPC 150 (see FIG. 7), SC 708 incorporated in light stations 542 or 542a (see FIGS. 2 and 13), and TC 652 being part of a tuning section (see FIG. 9). Their respective I/O lines 716, 717 and 718 control or drive relevant tools of processing sections they are assigned to. As indicated in FIG. 2, one or preferably a few DCs 707a, 707b, and 707c may be linked to CPC 700 thru port 703, too. Suitable machines may have capabilities and power level of well-known Macintosh. Via modem 711 DC 707c may receive remotely produced custom designs communicated via the telephone line 712.

On such DCs GEM software may be utilizing for completely paperless what-you-see-is-what-you-get-designing both commercial and electrical faces of circuits to be produced, or for altering or adapting previously finished designs, or for receiving customer's software specifications of whatsoever desired circuit. In these design stations all parameters of a customized circuit may be defined and selected, as are type of cover material, type of adhesive and peel-off fitting, circuit's web position, si(length, width), margins, shape, tearing off sections, layout of POS printable data fields, severing and/or tearing off perforations, cuts, openings, eye holes, suspension holes, notches, standard or customized grip holes, circuit or resonator type, selection of its frequency response limits, defining its location on circuits real estate, folding yes or no, defining fold lines, selection of customer's logo, printframe, construction and assignment of prints 126 to 129, sewing track provided yes or no, fashion of sewing track print, Trademark print, and so on.

FIG. 13 explains an alternative embodiment of a suitable patternizing station 542a which—for enhanced economy—may even apply novel low-power thus low-cost light emitting diode arrangements by utilizing an insulative mask pattern transfer scheme. It exchanges some rather costly optical and electrooptical components of units 541, 542 and 547 for cheaper ones, and may be taken advantage of in cases in which a suitable production carrier 7, 516 takes a higher heat, without damage or degra-dation. Basically, the machinery works similar to the drum region of a well-known photo copy machine or like a more novel laser printer for office use. Hence, commonly known and cheaply available laser beam deflection, switch, and shuttering means may be imported from the office laser printer domain, as are e.g. low-power data pulse switched and/or shuttered lasers and co-engaging rotating mirror arrangements for mediating a line-by-line exposure. More: A line-by-line by continuous multi-in-parallel column-by-column exposure of a light sensitive drum mantle may be achieved by means of a non-moving single-in-line (single row) arrangement of a plurality of light emitting diodes addressed and driven under computer control, e.g. engaging more than 100 (e.g. 180) light emitting diodes per row inch. Such row may be given the shape of a bar mounted close to a drum mantle in parallel to its axis. Hence, such "light emitting solid-state bar" construction of an exposure device may boost simplicity and performance of such machinery to an unprecedented degree, especially in view of longlife reliability.

Four major distinctions to the known art of light printing work in this station:

(1) Instead of a complex and specifically carbonized toner powder as usually applied in light printers a carbonless, nonferromagnetic, non-conductive, however meltable powder 539 is applied, said powder developing on a metal surface suitable filming—and once filmed—suitable etchant resistive properties.

(2) A non-conductive mask pattern formed of said powder is transferred to and deposited on a highly conductive metal surface, rather than on an insulative paper face, for filming on said surface under a melting condition.

(3) As a pattern transfer carrier, an endlessly recirculating tape is used which endless tape has insulative properties and a high dimensional precision.

(4) The process is carried out in a free formatted fashion continuously, meaning, that said metal face to be patternized with an etchant resistive mask coat is fed endlessly from spool, meaning, not cut as a sheet.

Drum 538, entrance cylinder 537 and cylinder 551 are same or alike those as described with reference to FIG.

2. As a major distinction to FIG. 2, coating station 541 and discoating station 547 have been shifted from driven drum 538 to a new driven drum 685, the mantle of which is provided with a semiconductive coat having a conductance highly sensitive to light exposure. At least one erasing light source 689 is provided, which source (cross sections shown) preferably longitudinally extends over the full mantle width of drum 685 in parallel to its axis. 690 represent corona stations (cross section shown) each of them comprising at least a thin wire connected to a high voltage source and extending over the full mantle width of drum 685 in parallel to its axis. Next station 543a may be a bar or row (cross section shown) formed of a plurality of single-in-line arranged light emitting diodes (just one of them symbolized), this bar also longitudinally extending over the full mantle width of drum 685 in parallel to its axis. A buslike connector 544 may interface said bar of LEDs to an exposure drive output of SC 708 (see FIG. 12), and therefore may be connected at least to some of its output lines 716.

541 is a coating station. Via supply duct 540 this station may be fed from supply canister v with a powdered insulative material 2a, 41a, 539. A second supply of powdering station 541 with a carrier material 691 may also be provided. For example such carrier may be a dry and powder-like material and may have ferromagnetic properties, and perform insulatively, too, by means of a special surface coating. The material for such insulative surface coating may be chosen according to triboelectrical series requirements so that moving friction of said carrier 691 mixed up with insulative powder 2a, 41a, 539 effectively charges the latter.

Basically, within the scope of this refinement a wet carrier in the form of a highly insulative organic liquid may fit as well and thus may also be provided for this purpose. However, since wet suspension coating requires much more service and control and may be more difficult in view of recirculating waste and excess insulative powder 2a, 41a, 539, the simplicity of the dry powder mix embodiment makes a major practical importance, so that the following description mainly refers to the latter. Hence, without a prejudice made, in view of the dryness of a liquidless coating, in the following 541 is referred to as a "powdering station" and 547 is referred to as a "dispowdering station".

Around cylinders 686 and 687 an endless, insulative tape or web 688 is provided, so that it is in touch with drum 685. In the touching region at least one further corona station 692 (cross section shown) is provided, comprising at least a thin wire connected to a high voltage source and extending over the full mantle width of drum 685 in parallel to its axis. The last station on the trip around drum's circumference is already mentioned dispowdering station 547, which may be connected with supply canister v thru recirculating duct 548.

An infrared heating device or inductive device 693 is provided for inductively heating the mantle of cylinder 687. 694 is a continuously working maintenance station for steadily keeping endless tape 688 in a proper working condition. 695 may be a special coating station for preparing and maintaining, on the surface of endless tape 688, an ultra thin silicon oil film. The respective silicon oil 696 may be fed from a special supply canister. On drum 538 both residual oil from the generic foil rolling process of foil 1, 40, 501 and other contaminations may be removed from the surface of the PW by means of a cleaning station 681, which station may be supplied with a cleaning agent via duct 682. Another heating device 684 for heating the metal face of the PW under CPC 700 control may be arranged in parallel to drum's 538 axis and over its mantle just shortly spaced from cylinder 687.

At least all dotted mechanical parts may be driven under CPC 700 control. Preferably a solid state exposure device 543a may be exclusively connected to a drive channel 544 formed of output lines 716 of mentioned SC 708, the latter communicating with CPC 700 via data bus 595, see FIG. 12. The rotational position of cylinder 687 may be encoded and thus fed back to 708 for a precise downweb pattern scale control by way of cylinder's 687 position encoded triggering the start of the column-by-column line exposures.

In more detail the arrangement works as described hereunder. In the following a positive (negative) voltage/charge may be exchanged for a negative (positive) one, without making an effect on the function of the arrangement. However, depending on the light sensitive semiconductive material used for the mantle construction of drum 685, and depending on the working principle of powdering station 541 and the materials used therein for insulatively coating drum 685, one of either polarities usually may offer a distinct advantage in practice.

On driven drum 538 the metal face of the PW is cleaned and heated to a specific temperature, prior to reaching cylinder 687. Corona stations 690 comprise a thin wire (cross section shown) extending in parallel to drum's 685 axis in short distance from its mantle and connected with assumably a positive high voltage. Due to electrostatical influence these corona stations effect a specific negative (positive) charge per unit area on drum mantle 685. After a short circumferential advance, drum mantle 685 gets subject to an exposure means, for example symbolized by light emitting diode bar 543a. The individual light emitting diodes are supplied with a driving pulse pattern via drive bus 544, so that they can be excited for exposing—in a fixed column-by-column scheme—the drum mantle, if compared with station 542 in FIG. 2. The drive pulses for said plurality of light emitting diodes are organized so that areas corresponding with later conductive paths are not exposed by light emissions. (The light emitting diode bar may be substituted as well by a suitably switched or shuttered low power laser in cooperation with moving pyramidal mirror deflection means, these details known to those skilled in the art of laser printing paper). The light exposure causes a heavy increase of conductance of the semiconductive mantle, so that the negative charge of the drum surface quickly drops in all places in which exposure has taken place.

By way of frictional interaction with the (suitably surface finished) moving carrier powder 591 the fine insulative powder 2a, 41a, 539 supplied from canister V is triboelectrically provided With a specific positive (negative) charge in powdering station 541. Thus charged insulative powder 2a, 41a, 539 is then brought in contact with drum mantle 685. This may be effected by means of a well-known magnetic brushing apparatus engaging with the ferromagnetic properties of the less fine ferromagnetic carrier powder 691 as a distributed brushing means, which means constantly recirculates, rather than being taken over by the drum. Hence, under the electrostatical force of all negatively (positively) charged surface portions of drum mantle 685 the positively charged insulative powder 2a, 41a, 539 is affixed thereto. As a result, an insulative powder pattern is created on drum mantle 685, which pattern precisely corresponds with those regions on the metal surface of the PW, which should be prevented from etching in later state.

Shortly behind cylinder 686 endlessly recirculating tape 688 gets in touch with drum mantle 685, thus trapping the insulative powder pattern between both. The respective wires of corona stations 692 are fed with a negative (positive) voltage considerably higher than the negative (positive) charge of drum mantle 685. Therefore, under the influence of the responsively effected reverse electrostatical field, the still positively (negatively) charged powder patterns are released from drum mantle 685 and pulled towards the more negatively charged wires of corona stations 692, and thus deposited on endlessly recirculating insulative web 688.

This taking over takes place in a zone just before the recirculating insulative web 688 departs from drum mantle 685. After departure, the electrostatical force on said powder patterns of the negatively (positively) charged corona wires is still in effect at least for a short advance of web 688 (once departed from drum mantle 685) so that these patterns are safely disabled from again returning to drum mantle 685.

An additional means (not shown) may be provided for at least in part discharging the powder patterns in safe distance from the drum. On web 688 the powder pattern is transported onto precisely heat controlled cylinder 687, and under the latter's revolution is then brought in contact with the preheated metal surface of the PW on drum 538. No need exists for the powder pattern still on web 688 on cylinder 687 for already melting or even filming there prior to its touching the PW on drum 538; however, a sufficiently heating up of the pattern material on cylinder 687 proved to be useful for obtaining good transfer results and high quality films having a high pattern resolution. Both drum 538 and cylinder 687 are controlled in view of a predetermined pressure against each other. Under the influence of controlled pressure and heat the powder pattern trapped between web 688 and the metal surface of PW's foil 1, 40, 501 melts and films on the latter, leaving a non-porous insulative film pattern there.

Both a specific dullness of the surface of PW's metal foil 1, 40, 501 and the removal of residual rolling oil in cleaning station 681 cause a specific affixation of the melting pattern to said metal surface. This affixation is much higher than the affixation developed between melting patterns and the endlessly recirculating web 688, owing to the latter's steady conditioning in station 694 and coating with an ultra thin silicon oil film 696. Excess insulative powder 2a, 41a, 539 is wiped off and removed from drum mantle 685 and recirculated for reuse into supply canister V via recirculating duct 548. Since after wiping drum mantle 685 still may be more or less pattern charged, the latter passes at least one erasing light source 689. Drum's exposure by the respective erasing light quickly drops the resistance of semiconductive drum mantle 685 at a sufficient degree so that all residually charged mantle portions of drum 685 are fully discharged.

Behind this erasure things start from the beginning as described. The D construction of the PW obtained from this process is exactly the same as already described with reference to FIG. 2 and co-reference to FIG. 3, window D. The other process sections and stations are left untouched, except an optional provision of an chemical additive in the rinsing and cleansing section 567 (0) or 573 (P) for sufficiently removing residual silicon oil 696 from insulative patterns 2, 41, 539 prior to their corona treatment for preparing sealable surfaces 124 thereon.

The only critical and, since mediumlife, service replaceable part in this arrangement is the endlessly recirculating insulative web 688. It should be produced as thin as possible and with a very high dimensional precision. Further, it should exhibit a low dielectric constant, a high durability even at temperatures up to 180°. . . 200° C. and under moderate pressure conditions, and offer a non-porous face. A specially woven KEVLAR web having a thin TEFLON surface finish appeared to suit for this purpose and to reach an affordable lifetime. In laboratory experiments, a siliconized vellum paper was successfully utilized as a shortlife substitute therefor, such paper being well-known from the production domain of self-adhesive label stamping.

Encouraging results taken from an experimental machinery (extensively applying well-known parts as being available from the photo copier domain) let assume that such patternizing station 542a could be produced at considerable less costs as do encounter with the production of a thruput-competitive positive patternizing station as described with reference to FIG. 2.

This is particularly because a suitable non-moving and longlife light emitting diode bar as an exposure means is available from the desktop publishing printer domain and can be driven by a relatively cheap single board controller, which may be cost-savingly run under direct GEM control of a personal computer like the Macintosh. In cases, in which less pattern resolution may suffice, other exposure means may be applied as well, e.g. a row of liquid crystal shutters for shuttering exposure light from a steady exposure light source. Their inherently low shuttering speed may be somewhat compensated for by a multi row shutter arrangement (multi-in-line-shutters) being capable of shuttering a few subsequent pattern lines in parallel once at a time.

Generally, the pattern resolution achieved on drum mantle 685 may be much higher than the respective one on drum 538 when applying the direct positive method. However, a specific degradation of pattern resolution usually encounters with the melting transfer of the insulative pattern from web 688 onto PW's metal surface. Anyway, the practically pattern resolution obtained in any case may suffice even for the make of high precision resonant circuits, since in this embodiment whatsoever conductor path pattern modifications for tuning resonant properties may be made with more freedom and most simply onscreen of an easy to handle personal computer, which personal computer easily downloads the current pattern instructions to a suitable controller of the kind as incorporated in desktop publishing and laser printers. E.g., influencing the resonant properties of LC circuits by freely providing capacitively effective conductive paths or plates with a plurality of raster patternized openings (which may easily be modified or exchanged from a DO's 707 GEM desktop) is a most powerful feature utilizable with this indirect method of conductively patternizing the "electrical" face of a cover material.

In this method of indirectly light-depositing an etchant resistive mask pattern on PW's metal surface more cylinder drives and some additional position pickups may get necessary for synchronizing several moving surfaces. However, the overall efforts for this type of machinery appear to be more in the domain of less costly medium precision machinery, in comparison with the high precision machinery needed in a laser station according to FIG. 2 for a direct positive patternizing a metal surface with an insulative and etchant resistive material.

In either positive method of insulatively patternizing a metal surface by aid of light the patterns serve for the function of conventional etchant resistive patterns. Therefore, as a prior condition, they have to be constructed from a sufficiently etchant resistive raw material, such raw material preferably being applied as a powder. Provided such etchant resistive pattern should merely serve for an insulative function in the finished circuit, a variety of raw materials may suit for the purpose.

E.g., in such cases a vinyl or whatsoever thermoplastic resin based powder of suitable melting properties may suit. For obtaining rugged patterns, the filling of a resin with a non-meltable component may offer several advantages. Such filling material may exhibit considerably worse insulative properties than does exhibit the meltable component, and make a considerable effect on the triboelectric potential of the latter taken alone, so that such material may be triboelectrically "tuned" with ease at a certain extent, for optimum performance.

If however besides suitable etchant resistive properties a low dielectric loss of such pattern should be a stringent need for circuit's proper performance, then a suitable raw material may be chosen from a considerably restricted variety of powder materials.

A most suitable insulative powder for the mass make of resonant electrical circuits would be a super fine polyethylene powder, because of its low melting temperature and superior dielectric quality. At the time of respective experiments, available polyethylene powders were found to be just fine enough (about 3 ... 5 μm) for the direct positive patternizing method described with reference to FIG. 2. However, owing to a grain size not sufficiently fine enough, said powders merely in part performed for full satisfaction in an experimental machinery according to FIG. 13. So the industry is challenged to provide at least super fine polyethylene powder for such novel applications.

For higher process temperatures, a mix of a polyethylene and a polypropylene powder may suit better, however, normally trading off with pattern resolution. Such powder mix may also facilitate the make of well per-forming resonant structures, which preferably should fit between more rigid cover materials either for obtaining circuits with a card-like appearance or for providing an enhanced protection against mechanical stresses, e.g. when such circuits should be provided for industrial or clinical use. As already pointed out with reference to the drum station in FIG. 2, a powder mix normally must exhibit a smaller corn size than needs a one-piece powder.

If of sufficiently fine grain, then a powder mix may result in a higher production speed at higher temperatures and a decrease of the waste rate. However, establishing and maintaining an uniform pattern coat in station 541 may be more difficult, and thus may require more and finer control. Further, a dual-piece powder recycles and recirculates with less ease.

Noteworthy, this effective positive method of indirectly (transfer) patternizing may encounter some limits in view of usable cover materials and prints thereon, since they have to take and withstand a higher heat than have those utilizable with the direct patternizing method applying coherent light for a mere local melting of an insulative material. E.g., a TYVEK cover without special fitting may be critical to handle in comparison with the previously described direct patternizing method. However, already mentioned novel polyethylene/polyester mix spunbonds, polypropylene spunbonds as commercially available now, and polypropylene/polyester mix spundbonds as already released for laboratory tests perfectly fit for this novel application.

It is noteworthy that both the draw-in and initial processing section at least up to drum 538 and the post etching processing section starting behind drying cylinder 581 of a LITESEAL production line may assemble from modular high precision labeling machinery building blocks as produced by the Ferd. Rüesch AG in Spitalgasse 8, St. Gallen, Switzerland. Building blocks of their collection have been used with excellent results in the evaluation of some processing steps. Respective modules facilitate a plurality of processing tracks to be stracked and run in parallel and suit well for even higher grade computer controlled processing as is now now described, as follows.

In course of the description of FIG. 13 it has been pointed out that in accordance with the invention inexpensive parts of known photo copy machines or laser or other light printers could be used for economically substituting some expensive optical and electro-optical components utilized with the first positive production method, for thus saving costs.

Starting from this view as an outset three further improvements may be introduced to the process.

A first further improvement is achieved by that as a conductor path pattern forming tool an electronic office light (laser, LED-, liquid crystal shutter, or like) printer is used with some modifications so as to have it adapt to the continuity of the process. Either a plurality of light printers may be stacked in parallel for providing the metal faces of a plurality of fractional production webs with same or different dielectric patterns once at a time in parallel, or a single wide format light printer may be used for respectively treating a single production web. By way of this further refinement the maximum temperature of the PW can be reduced. This is a point of importance when cover materials 516, 7 should be used which for example tend to alter their appearance, as may be for example from opacity to transparency under the influence of pressure and heat, just as pointed out in connection with FIG. 2 when making reference to the cooperation of cylinders, 521 and 513. An attractive and hi-fashioned material standing for such materials may be TYVEK.

A second further improvement is achieved by way of respective modifications in the initial printing section of the process, say prior to the PW reaches patternizing drum 538. These modifications lead to a considerably increased flexibility with respect to circuit's fitting with customized prints, and particularly with respect to optimizing, redesigning, and to exchanging prints at process speed under full register control at all the same freedom and convenience which has been achieved for the respective design and exchange of parts of the "electrical face" of a circuit.

This feature is achieved by that, as a face printing tool, at least one further electronic light (laser, LED-, liquid crystal shutter, or like) printer is used with some modifications so as to have it adapt to the constant flow continuity of the process. For depositing same or different prints on "commercial faces" of a not yet into several fractional webs divided PW once at a time a single large format light printer is used. Depending on whether a print is provided in a yet non-metallized or already metallized state of the PW light printing may be of the conventional or transfer type.

A third further improvement is achieved by that as a cover material, and thus as a production carrier very inexpensive papers or at least in part cellulose based paper-like materials can be used, which, although not resistive against etchants per se, may anyway undergo etching without damage and at at a large scale facilitate custom designed printing of the cover material by aid of inexpensive and most powerful black-and-white and multi-color light printing techniques as known e.g. from office and desktop publishing environments.

This feature is achieved by that prints applied before etching—and thereby also the printed face of the PW—are subjected to a protective treatment at least prior to etching. This treatment causes an at least temporary resistance to wetting and thus to an intrusion of the etchant into finished prints and, as the case may be, into the cover material 516, 7 thru its non-metallized second face, which thereby is no more subject to potential deteriorations or damages when etched, since sealing layer 507, 6 deposited thereon counter works as an etchant impervious backplane on the first face of the cover material 516, 7.

The aforesaid improvements are explained hereunder with reference to FIGS. 15 to 19, as follows.

FIG. 15 illustrates those (already described) parts of the process line according to FIG. 2, which, in the station according to FIG. 13, have already been substituted by less expensive parts.

FIG. 16 illustrates in a like blank presentation those parts of the dielectric patternizing station 542a according to FIG. 13, which may be found on a conventional light printer. Exposure of light sensitive drum 685 by means of a bar of light emitting diodes 543a should be considered as an example without restricting or limiting the scope of the invention, since e.g. an exposure by means of a laser beam subjected to the deflection effect of pyramidal mirror means or the like would perform same. One may see that the fixing station normally provided on such apparatus for fixing a toner powder picture on the face of a paper sheet is not among these parts, since in the step according to FIG. 13 the respective "fixing" of an insulative powder pattern took place on drum 538, under the pressure of cylinder 687.

Before this background FIG. 17 illustrates a further refined patternizing station 542b for achieving the aforesaid first further improvement of the process.

Patternizing drum 538, entrance cylinder 537, and perforating or cutting cylinder 551 have been aforedescribed in connection with FIGS. 2 and 13. 542X is a conventional, say commercially available electronic light printer, which printer contains parts 685, 541, 543, 547, 689, 690, 692, and, as the case may be, 548 and 691 as an option, just as described hereinabove in connection with FIG. 13. However, the light printer may be somewhat modified so as to print endlessly and thus adapt to the continuity of the process and—as the case may be, depending on the properties of the insulative powder to be printed—may run its internal fixing rollers 727 and 728 preferably at a somewhat higher temperature than usually provided for paper printing. Therefore, simple additional cooling means may be provided for managing an increased heat dissipating and transfer within such printer, said means not shown. An insulative powder 539, 41a, 2a, is provided in a supply canister V from which it can be fed to the printer. The printer receives printing data via data line or bus 544 from digital port 703 of CPC 700.

The printer does not print as known—from a black toner powder— dark image elements on paper, but prints—from said insulative powder 539, 41a, 2a,—insulative mask patterns 726 on an insulative, heat resistive, dimensionally stable and rigid Transfer Web 688 (TW), which endlessly recirculates thru the printer. Behind the printer the TW 688—together with insulative mask patterns 726 thereon—is being fed thru a corona station 591a. Behind the corona station the insulative mask patterns exhibit a coronaized surface 124a.

Behind the corona station TW 688 together with insulative mask patterns 726 thereon runs about CPC 700 heat and pressure controlled counter laminating cylinder 687, thereby getting in pressurized contact with the metal layer 501, 40, 1 of the PW, which is fed about patternizing drum 538. Numeral 730 denotes insulative patterns which have already moved from web 688 onto the metal face of the PW.

Cleaning station 681, duct 682, cleaning agent 683, CPC 700 controlled heating device 684, infrared or inductive heating device 693, maintenance station 694, and coating station 695 are similar to or identical with respective ones of FIG. 13, and hence not further commented on here.

Differently to FIG. 13 previous cylinder 686 is here split into a dewasting cylinder 686A and a printer input cylinder 686B. 734 is a cleaning or dewasting blade for removing, about dewasting cylinder 686A, unlaminated pattern waste 735 from TW 688. 734A denotes a waste shield for waste collection. In canister M an ultra thinly applicable liquid or fluid is provided for influencing and thus controlling the affixation power of patterns 726 against the TW 688 when subjected to fixing (i.e. pressure and heat) between 727 and 728 and laminating between 538 and 687. A duct feeds the liquid or fluid material 696 to coating station 695, which works here cylinderless. 733 is a new maintenance station in which web 688 is subjected to a certain treatment so that the next treatment in coating station 695 makes a desired effect, this detail being referred to hereinbelow.

729 denotes a local station control electronics comprising an RF power source for feeding energy to the electrodes 130a and 131a of corona station 591a and for providing and controlling supply energy for the heating device 693. As an option this apparatus may also comprise control means for interfacing, thru dashed lines 731 and 732, respectively, with the light printer 542X and maintenance station 733, e.g. for measuring or controlling a temperature inside the printer, or for controlling a certain maintenance or working treatment of web 688 responsive to such temperature. At least all dotted mechanical parts may be driven under CPC 700 control, respective line connections to I/O banks 701 of CPC 700 not shown. The triangle symbol stands for feedback connections with I/O bank 702 of CPC 700 for the purpose of general PW position and dielectric pattern to print register control, as explained in detail hereinabove. Both drum 538 and cylinder 687 are controlled in view of a predetermined pressure against each other. The construction of drum 538 and cylinder 687, e.g. an outfit with pilot means 225a and 225b for zero circumferential offset is not repeated here, since in view of the foregoing (see text referring to FIG. 8) understood by those skilled in the art.

The function of not shown parts 685, 541, 543a, 547, 689, 690, 692 and optionally 548, 691 inside the conventional light printer are referred to as aforedescribed in connection with FIG. 13 and hence not repeated here. It is noted, however, that the insulative powder must be carefully selected and tuned in view of its triboelectrical characteristics to the "toner section" of such printer, for matching with electrostatical parameters which have become used in light printers. A powder made from a pure insulative material may not sufficiently perform on a normal office printer without modifications made in its coating section, so that mix powders which contain different insulative materials have been found so as to lead to a higher triboelectrical performance and efficiency and thereby also to less maintenance needs and to longer photo drum lifetimes.

TW 688 in FIG. 17 has the equivalent transporting function of TW 688 of FIG. 13, and therefore recirculates endlessly thru the light printer 542X in a respective manner. However, though hence denoted by same numeral 688, the properties of the present TW 688 must differ somewhat from those of the TW 688 in FIG. 13, as will be detailed hereinbelow.

The patterns formed of insulative powder 539, 41a, 2a and deposited on the TW 688 are thus—already between such printer's heated fixing rollers 727, 728—being fixed on the TW, for thus leaving the printer already as a more or less compact and coextending ("one-piece-filmed") pattern 726 which—since at least at a certain degree adhering to the TW 688—can be corona treated between the corona electrodes 130a, 131a of the subsequent corona station 591a, i.e. before being applied to the metal face of the PW on drum 538. The respective corona treatment effects the aforementioned momentary chemical/physical alteration of a very thin surface layer 124a on top of insulative patterns 726, thereby causing an increase of said patterns, bonding or laminating power to whatsoever metal face, particularly to a dull aluminum face, for example. Depending on the chemical composition of the insulative powder 539, 41a, 2a, such affixation increase stems from a quickly working chemical radicalization process in the insulative pattern material when subjected to the influence of both oxygen (or a like effective process gas) and electrostatical discharge energy, as explained hereinabove. It is noted, that—depending on the material from which the insulative powder 539, 41a, 2a is made—an intense corona treatment may suffice to bond insulative path patterns to the metal face of the PW even at normal room temperature. It is hence appreciated that the capability of having insulative patterns once printed undergo a corona treatment prior to their connection to the metal face of the PW may dramatically reduce at least heat requirements (practically also pressure requirements) for etchant-resistively patternizing the metal face of the PW.

In the embodiment according to FIG. 13 corona treating insulative patterns could not be applied, since the patterns approached drum 538 as powder patterns, so far cylinder 687 was not run at a considerably high temperature. Firstly, electrostatical forces in a corona field on the individual powder grains of the patterns had completely destroyed the patterns. Secondly, coronaizing prior to laminating makes a practically useful effect only on flat and leveled surfaces of a coextending insulative material which does not alter its physical structure or composition too much in the period between coronaizing and deposition on the first face of a metal 501, 40, 1, the latter not being true for a powder which has to be melted and filmed, say to be brought in a more compact state.

Differently therefrom, the modification according to FIG. 17 allows electrostatical forces to be applied on the insulative patterns on TW 688, since they interim adhere thereon, owing to fixing. As a result thereof, insulative patterns 726 approach patternizing drum 538 with a geometrically stable shape, so that they can be taken over by the metal face of the PW with much more ease and precision, as follows.

When becoming trapped between patternizing drum 538 and its counter cylinder 687—precisely speaking: between the metal face of the PW about patternizing drum 538 and the TW 688 about counter cylinder 687—the such treated, say "prefilmed" insulative patterns 726—under the influence of pressure and heat "change their web", by that they instantaneously bond to the blank metal face of the PW about cylinder 538. Further, they may more or less finish or complete filming there, in this instant of time. Once the insulative patterns 726 bond to the metal face of the PW they denote 730, and, in a mirror fashion, now can perform as etchant resistive mask patterns which define outline and structure of conductive paths 90, 91 to be formed in the wet processing step to follow. Obviously, in any case, for this function, the insulative powder 539, 41a, 2a should exhibit properties similar to those which have already been described in connection with FIG. 13; for more details reference is made to that text hereinabove.

It is hence understood, that printing, and thereby interim fixing insulative patterns 726 in an already more or less filmed state to the TW 688 prior to their transfer on the PW, may result in a higher transfer quality and less transfer waste.

Like the insulative web in the embodiment of FIG. 13 the TW 688 should be as thin as possible. It should have an at least same or even better dimensional precision particularly under a repetitive pressure stressing and temperature fluctuating conditions. This is because a good part of the just one-time (event) temperature and pressure stress to which the PW in FIG. 13 is subjected (when trapped between hot drum 538 and cylinder 687) is now directed to TW 688 and converted—due to its continuous recirculation—into a periodical stress on the latter. This can be understood as follows.

For fixing between rollers 726 and 727 the electrostatically formed insulative powder patterns onto the TW 688, a first pressure is applied to the TW 688 at a first, considerable high temperature (normally higher than the normal fixing temperature for office printing). Between drum 538 and cylinder 687 a second pressure is applied to the TW 688 at a second increased temperature. Hence, whereas the insulative web 688 of FIG. 13 has only one temperature/pressure stress event per recirculation, the TW 688 of FIG. 17 has two, one in the printer and the other one on cylinder 687. However, since split into two events, the stress intensity may be flattened or at least leveled in the embodiment of FIG. 17, however, traded off with a double stress frequency. Hence, TW 688 must have good long term stress characteristics in view of its dimensional precision under repetitive pressure and heat.

In laboratory tests a certain type of high density vellum paper was used as it is known as a carrier sheet in the production of self adhesive plastic stickers, and it performed satisfactorily with a meltable insulative mix powder after it had been considerably de-siliconized by treatment with trichlorethane and post-treated with a polytetrafluoroethylene suspension. A very thin sheet made from a woven KEVLAR fiber flushly filled with high-density polytetrafluoroethylene (TEFLON) has been tested same so as to meet all requirements for a very long expectable duty cycle time. However, at the time of experiments, such experimental material was available as a sheet only and had not yet been delivered as an endless tape loop.

From the foregoing it is firstly understood, that both the material at least of the upper fixing roller 727 of light printer 542X and the material or composition of the insulative powder 539, 41a, 2a and particularly its affixation characteristics in a filming state and the surface and affixation characteristics of the TW 688 must be selected for a good match to each other, so that the freshly fixed—however, not yet coronaized—insulative patterns 726 adhere to TW 688 better than they do to the upper fixing roller 727, and contrarily—once coronaized on the TW 688—develop a much higher affixation power against the metal face of the PW about drum 538 than they do in this instant against TW 688 about cylinder 687. This matching requirement is the reason for the newly introduced maintenance station 733 for a steady pre-conditioning of the TW 688 so as to have it accept in station 695 an amount of affixation controlling liquid or fluid 696 not greater than necessary for optimized downweb affixation conditions. In a certain light printer employing both a fixing roller 727 having a surface made from polytetrafluoroethylene and means for providing thereon an ultra thin silicon film, it proved useful, for ensuring—in the very moment of melting and fixing of the insulative powder—an adhesion power of the thus resulting insulative (film) patterns 726 greater against TW 688 than against said polytetrafluoroethylene surface of said fixing roller, to replace a silicon fluid feeding wick provided on that printer by a faster one. This need arose since a fixing temperature needed higher than usual caused a drastical increase of silicon fluid consumption and thus involved an exhausting feed capacity of the standard wick rated and provided for printing normal office paper.

It is secondly understood, that the application of pressure and heat enough already in the fixing station of the light printer 542X for providing patterns in a film-like state already on the TW 688, considerably reduces pressure and particularly temperature needs between drum 538 and cylinder 687, owing to the aforementioned affixation boosting effect of the corona treatment in station 591a, which greatly facilitates the transfer of insulative patterns 726 from the TW 688 to the metal face of the PW.

As a result, the refinement according to FIG. 17 opens the process for a much greater variety of materials to suit as a cover material 516, 7 and its production carrier function, including materials which could not or could only at a restricted scale be used with the refinement according to FIG. 13, due to their susceptibility to deterioration under pressure and particularly heat too high. That, how, and why said variety of utilizable cover materials may further widen by virtue of the third improvement of the process will be explained hereinbelow in connection with FIGS. 18 and 19.

FIG. 18 gives an impression on a respectively modified Process line having the above refinement implemented. Differently to FIG. 2, canister W, surface bond extruder 505, supply duct 504, and insulative material 2, 41, 503 have vanished; canisters N for 683 and Canister M for affixation control liquid or fluid 696 have taken the place of canister W for the first described negative version of the process. The most important parts of FIG. 17 are shown; dewasting blade 734 and waste shield 734A in this case are shown so as to work on counter cylinder 687 of patternizing drum 538. Treating the TW 688 with affixation control liquid or fluid 696 is shown as being executed on printer input cylinder 686B. The corona station 591a is provided very close to the lamination touch region of both PW and TW.

One may see that the refinement of FIG. 17 leaves the other process sections and stations basically untouched, maybe except an optional provision of an chemical additive in the rinsing and cleansing section 567 (0) or 573 (P) for sufficiently removing residual affixation control liquid or fluid 696 from insulative patterns 730, 539, 41a, 2a prior to their corona treatment in station 591 for preparing sealable surfaces 124 thereon. One may also recognize that light printer 542X receives its printing data from extended digital port 703 of CPC 700, which is in communication with DC 707.

Said second further improvement of the process according to U.S. Ser. No. 07/155,154 is causally nexed with a redesign of the initial printing section of the process as described in connection with FIG. 2., as one may see from bottom left of FIG. 18.

Without a prejudice made in view of an additional utilization of whatsoever other kind of printer numerals 742A and 742B denote CPC 700 controlled light printers as known from office use and map or printed circuit board layout environments, respectively. Light printer 742A is a conventional one, capable of computer controlled light printing electrically non-conductive sheet materials with usual black or colored toner means. Printer 742B is of the same, however, transfer type which can print sheets which exhibit a non-conductive first face, however, a conductively backplaned second one. This distinction is denoted by the frame symbol on the housing symbol of printer 742B. For example, such printer 742B may internally work similar to the arrangement of FIG. 17, however, printing black or colored information by means of a usual toner, rather than insulative patterns on a transfer medium. The printers are each provided with print data via respective lines or busses 544 from digital port 703 of the CPC 700. At least one of both printers may be in effect.

Associated with said printers are new processing path cylinders 736 and 737. 736 works as an output cylinder of light printer 742A and 737 works as an input cylinder of electronic transfer printer 742B. A second counter cylinder 523A has been provided about which the still blank cover material 516, 7 is fed so as to pass grip hole cutting or high speed position code printing device 524, which, according to its triangle symbol, has a PW position readout capability. Cylinder 738 acts both as an output cylinder of electronic transfer light printer 742B and as a working cylinder in cooperation with a surface coating device 739 to which a treatment material 740 is fed. Curing station 534 here is preferably of the combined heat and processing ventilation type.

One may see that the aforesaid refinement of the input printing section of the process leaves the other process sections and stations substantially untouched, except the case of a potential shift to behind the etching section of whatsoever step of perforating the PW within a track that could be provided with insulative patterns 730 on drum 538. Reasons for such further modification are in connection with surface coating device 739 and will be explained at the end hereinbelow.

For understanding of how the refined input printing section of the process works, co-reference is made to FIG. 19, which shows in windows A to H respective processing states of the PW as have already been explained in connection with FIG. 3.

Since not provided with whatsoever pilot means in the beginning, the cover material 516, 7 (as a startup production carrier) is firstly printed asynchronously in printer 742A. At least a marginal track of the respective print 126A (FIG. 19, window B) may represent reference marks: which once deposited on the cover material 516, 7 can be read out in station 524 both prior to and after heat stresses have been applied to the cover material 516, 7 or PW, respectively, in stations 518/520 and 513/521/522. The difference in terms of time between the time delay calculated by CPC 700 on the basis of the PW speed and the actual time delay after which reference marks arrive on either reading position of station 524 gives a measure of the actual (real-time) working length of the production carrier between the printing line in printer 742A and the reading lines of the reading device in station 524 on cylinder 523A and cylinder 523, wherein the reading on cylinder 523A is predictive so as to allow a separation and discrimination of effects due to heat in the printer 742A and to heat in stations 518/520 and 513/521/522. It is important to see that any alteration of the production carrier in view of its longitudinal dimension under the influence of printing pressure and heat in printer 742A, of coating heat in station 520, and of laminating pressure and heat between cylinders 513, 521 and 522, is included within any currently read out working length.

The aforesaid stresses are among the most severe ones for the cover material 516, 7, which is being released from considerable stress burdens not prior to cylinder 522 (since then being supported by the countersealed metal foil 501, 1, 40). Though the main reference means for piloting the PW thru the process line is applied as late as on cylinder 523, say once the cover material 516, 7 has stabilized under the aforesaid stressings and is supported by metal foil 501, 40, 1, registered prints 126A (in printer 742A) and 126B (in printer 742B) with respect to each other can be applied to the second face of the cover material 516, 7 in locally offset printers 742A and 742B, respectively, thanks to the continuous monitoring scheme of position mark entries and position mark readings on/from the cover material 516, 7 and PW, respectively, and the shifting of respective position data thru said aforedescribed shift register model of the PW which is opened with the first (asynchronous) position mark print instruction once fed back from printer 742A.

For those skilled in the art from the foregoing and from the explanations given in connection with the preceding figures it is understood, that at least three electronic light printers 742A, 742B and 542X may cooperate in a register synchronization scheme along the PW under CPC's 700 line print instruction versus PW position acquisition control.

These printers execute prints which all may have been designed on DC 707 by the aid of graphics and/or desktop publishing software construction sets. It is understood, that the speed of the PW is limited by the printing speed of the printers, and that the printers should exhibit the same printing speed. Therefore, little modifications are made on the printers, and a common clock signal is fed from CPC 700 and utilized by all printers, for thus facilitating a simple PW in-register print assignment and register control, which means, that from the shift register model of the PW according to FIG. 11 all instants of time are being derived and set for starting, in different working places of the process, "electrical face" and "commercial face" related print frames which in the once finished product superpose.

Since PW's position is being either controlled or read out in stations 524, 742B, 536 and at least in one of stations 542X and 687, this further refinement of the process thus accomplishes a real time chance-of-print feature which introduces the overall what-you-see-is-what-you-get (WYSIWYG) circuit design capability in constant flow process conditions at arbitrary process speed, say without any accelerating or decelerating the PW, reading without respective out of register waste.

To this end, said second further improvement firstly reduces the problem of registering an "electrical face" of a circuit with the "commercial face" thereof to a continuous high speed closed loop comparison of a system clock with position count values obtained from the real PW and assigned to register cells of said recirculating shift register model of the PW in the memory of CPC 700. Secondly, said improvement imports and switches on the WYSIWYG working philosophies from the desktop publishing domain into the domain of complex processing technology concerned with the customized make of arbitrarily definable electrical products.

On bottom left of FIG. 18, downweb of transfer light printer 742B, there is shown the aforementioned surface coating device 739 which works against printer output cylinder 738, for example. This device either coats or impregnates the freshly printed face of the production web with a transparent and highly water-repellent material 740 which develops a protective effect and/or a high resistance against wetting of prints 126A and 126B and the cover material 516, 7 beneath.

Preferably, the material 740 may have properties which cause colors of the cover material and/or prints applied thereon to appear even more brilliant, or say enhanced. For example, a suitable 740 may be low material density polyethylene which is applied in a very thin layer. On the other hand, another kind of useful material 740 may have impregnating properties with respect to the cover material 516, 7. Such material may be applied in a considerable amount most of which in a moderately heated condition firstly diffuses into a layer of certain thickness beneath the second face surface of the cover material 516, 7, particularly if the latter initially exhibits a certain absorptive capacity, as the case may be with paper- or card board-like materials.

A such like material 740 may be based on a wax, silicon, or polytetrafluoroethylene suspension basis, or a mix thereof.

Curing station 534 develops a moderate heat, and thereby supports in a first step a propagation of the impregnating material 740 from said surface to a greater depth in the cover material also behind prints. A suitably directed surface ventilation of the printed face of the PW supports such. Since subsequent cylinders 536, 537, drum 538, and counter cylinder 687 are also kept at an elevated temperature, this propagation effect continues and may reach its maximum on drum 538, when the cover material 516, 7 is trapped between the heated cylinder mantle and the aluminum foil 501, 40, 1. Since vaporizing into the atmosphere of the impregnating material 740 in this condition is prevented even under the influence of considerable pressure and heat, a rather homogenous impregnation of the entire thickness of cover material 516, 7 may be achieved. By virtue of this scheme, a very effective and reliable impregnation of the cover material 516, 7 is attained, the effect of which may be the better the greater the diameter of drum 538, the greater the embracing angle of the PW in view of that drum are selected, so as to to keep a certain area of the cover material 516, 7 sufficiently long trapped between drum 538 and its backplane metal foil 501, 40, 1.

What now can be utilized is, that the PW, upon leaving drum 538, appears not only with etchant resist patterns on its metal face thereof, but also with a cover material rear face which exhibits, in the proper instant of time, excellent etchant-repellent properties, which prevent the cover material 516, 7 both from an intrusion by the etchant 554 and a permanently visible surface degradation, once rinsed and dried.

The following further advantages are harvested.

Lowcost paper can be used as a cover material 516, 7, either blank, or at a certain extent already pre-impregnated. Since paper suits perfectly for light printing, this third improvement shakes hands with the second one of light printing the commercial face under CPC 700 central process control. Appropriately preimpregnated and in station 738, 739 reimpregnated paper as a cover material and production carrier may be even used with an $FeCl_3$-based etchant, if quickly rinsed. And, since a suitably selected and impregnated paper cover may exhibit—after etching—a considerably greater stiffness than does e.g. more costly TYVEK of same thickness, a perforating tool 552 may be shifted downweb behind roof pulley 592. An increase of etching performance is the result, and, so far further prints should be applied, these may be applied in station 593 prior to a respective perforation of the PW takes place, meaning, in a state in which perforation notches and burrs in the cover face cannot impair a print. If a superposition of conductive patterns is by direct folding as shown in FIG. 5, then a stiffness as great as possible of a cover material 516, 7 is a desire, for achieving a precise fold. A low density single side filled paper of 100 to 130 gramms weight per squaremeter performed excellent with circuits according to FIGS. $1_A$ and $1_b$ having aluminum paths of 45 $\mu m$ thickness and a 20 $\mu m$ insulative coat on top.

FIG. 19 selfexplains in view of the foregoing and the description of FIG. 2 and FIG. 3 hereinabove, so that a detailed description may be obsolete. Same as in FIG. 3 all layers are shown at a considerably enlarged thickness scale. The insulative patterns which have been light printed and transferred on top of the metal foil 501, 40, 1 symbolize 730 in accordance to FIG. 17. The layer 740 has been indicated as a surface layer covering prints 126A (executed in printer 742A) and 126B (executed in printer 724B), as may for example be an ultra thin low density polyethylene coating.

If 740 should symbolize an impregnating material, then most of it may be considered as being absorbed in horizontally hatched layer 516, 7, which is the cover material serving the function of a production carrier as becomes apparent from windows A and B. Whereas prints 126A and 126B are protected by layer 740, prints 127 applied in station 591 or 593 and prints 128 applied in station 611 or 613 ride on that layer 740. Window symbols A to H repeating in the process diagram of FIG. 18 make a clear correlation of how the PW is constituted in different places along the processing track.

From the foregoing, the power and inherent advantages of the novel method are easily understood:

(1) In Lichtblau's prior art method, etching of an an 8 $\mu m$ and a 50 $\mu m$ aluminum layer once at a time encounters a speed bottleneck and waste problems. Further, upon etching a dimensionally unstable and filigree production web encounters severe handling problems, resulting in dropouts and waste. These drawbacks have been fully overcome by the present invention.

(2) Lichtblau's prior art method further wastes money in the form of a dielectric layer having high precision and being spread over the entire area of an electrical circuit. This layer is present in all places in which previously metal has been removed, and in which said dielectric is left back idling and surplus. As taught in some of applicant's co-pending Patent Applications, such circuits suiting as markers for electronic security systems should carry a lowest metallization as possible, if X-ray viewed, for best performance. Hence, that prior art reference method runs off waste optimum, if just the product should be designed optimum, according to physical laws. The positively working methods of the present invention perform inversely:

a) A minimum dielectric layer may be exclusively provided on metal paths, which layer further does not need to be top precise, since raster pattern etching and thermal induction tuning is applied.

b) Less dielectric material thus encounters less metal, thus a lower metallization. A lower degree of average metallization raises process efficiency with this invention, since less dielectric has to be patternized, reading as a higher production speed.

c) Thus, in the present method not maximizing, but minimizing waste shakes hands with a low metalization, for making—in a new costs-performance intercept point—novel planar RF markers circuits for the RF EAS industry.

(3) For extracting the utmost performance output from a minimum material input, the present invention teaches the scheme of utilizing raw materials (539; 41a/41, 2a/2; 507; 6) at least twice, for different purposes, at different times, for unprecedented economy.

(4) In Lichtblau's prior art reference method the circuit pattern dimension along the web must have been a precise multiple of the circumference of the printing cylinder providing respective etchant resistive mask patterns. Hence, if circuits should have been produced endlessly for automated roller dispensing, then in that prior art the webstream dimension of respective circuits was tied to a few integer fractions of printing cylinder's circumferential dimension.

a) The present invention abandons this crucial restriction avoiding the customized make of such circuits, by virtue of a process that works continuously with an absolutely free and designer specifyable format.

b) This feature is earned by having allocated the reference means for register position not on a part of the never selling production machinery, but on that very part, which continuously sells away with profits.

c) This part is circuit's cover material utilized as a production carrier, which production carrier meets its purchaser just with a face finish according to his personal desire, rather than being invisibly and idlingly concealed in the circuit and thus being disabled from performing any useful marketing and sales promotion function for the product.

(5) Hence, since producing out-of-register has been overcome, and since custom design has been introduced, new marketplaces open for their world-wide intrusion with thin planar electrical circuits of whatsoever shape, which nicely go one way with a pretty commercial face.

The method according to the present invention may be advantageously utilized in all fields, in which thin, planar, flexible electrical circuits or conductive path constructions should be produced nonstop and quickly according to hopping customer's specifications, either millions by millions, or hundreds by hundreds, or piece by piece.

Hence, the scope of the present invention is by no means limited to the production of RF resonant marker circuits, though the invention was made in course of an attempt to put a solution to a well-known problem in the RF marker based security art. In this respect, one has recognized that the invention was born from a spirit to cancel well-known drawbacks and restrictions of well-known processes by virtue of a novel thinking for making products according to customer's desire by the control of fingertips and a screen of a machine like the Macintosh.

To this end, it must not be overseen, that within the scope of this invention selfspeakingly is the make of whatsoever planar electrical circuit, and particularly of a planar resonant circuit useful as security marker means, by use of whatsoever method according to prior art, and particularly by use of a prior art method the description of which is incorporated by reference with the information disclosure statement below the title of this application for Patent, if such prior art method is altered or modified or adapted such, that an etchant resist pattern, or an electrodeposition resist pattern, or a combined electrodeposition and etchant resist pattern, is being provided on a metal face, by way of directly or indirectly positively shaping and/or constructing such resist pattern on demand from an insulative powder by aid of a continuously controlled light exposure cooperative with electrostatical means and the influence of at least one of pressure and heat.

Hence, by no means will an import of both spirit and scope and the teachings disclosed hereinabove, or parts thereof, into prior art methods, establish a patent claim of others.

What is claimed is:

1. A method of forming an inductive/capacitive (LC) circuit, said method comprising the steps of:
    (a) forming, by aid of light printing an electrically nonconductive material, two substantially identical, conductive multi-turn spirals (37, 20-27, 36, 28-35, 5) each turn of which forms a substantially closed loop;
    (b) positioning said spirals on opposite surfaces of a dielectric layer, with each spiral being oppositely wound with respect to the other when both are viewed from the same side of said dielectric layer, opposing portions of each spiral being positioned in substantial registery with opposing portions of the opposite spiral, respectively;
    (c) providing a conductive connection between at least one predetermined portion (36, 37) of each spiral with an opposing portion of the other spiral, the resulting circuit thus assembling from a series of concentric path loops exhibiting both distributed inductive and capacitive components.

2. The method according to claim 1, the steps (b) and (c) of positioning and connecting further comprising the step of
    (d) adhering two connecting spirals (37, 20-27, 36, 28-35, 5) to the same face of a dielectric sheet (11) having a certain thickness and folding said sheet back upon itself proximate to the connection between the spirals such that the conductive paths of said spirals become positioned in substantial registry with each other, and with at least a double thickness of said dielectric sheet (11) therebetween.

3. A method of forming an inductive/capacitive (LC) circuit, said method comprising the steps of:
    (a) forming, by aid of light printing an electrically non-conductive material, two substantially identical, conductive multi-turn spirals (90, 91, 5) each turn of which forms a substantially closed loop, the innermost turns terminating into respective capacitive plates (95, 96);
    (b) positioning said spirals and capacitive plates on opposite surfaces of a sheet-like dielectric layer, with each spiral being oppositely wound with respect to the other when both are viewed from the same side of said dielectric layer, individual portions of each spiral being positioned in the lateral spaces between respective portions of the other spiral so as to interlace, and with both capacitive plates in substantial registery,
    (c) providing a conductive connection between at least one predetermined portion of each spiral with an opposing portion of the other spiral, the resulting LC circuit thereby exhibiting both concentrated inductive and concentrated capacitive components.

4. A method of constructing planar electrical circuits of arbitrary design and flexible shape, comprising at least the steps of:
    (a) continuously providing a flexible, insulative substrate having a first and a second face;
    (b) continuously providing a continuous metal foil having a first and a second face, said first face being blank,
    (c) continuously providing a sealing layer depositable at least on one of said first faces of said substrate and said metal foil;
    (d) continuously bringing in an at least touching superposition said first faces of said substrate and metal foil and said sealing layer spaced therebetween, thereby forming a connectable combination;
    (e) continuously connecting said combination, in a manner to form an at least tri-layered flexible sandwich construction having the sealing layer as its central component, by activating said sealing layer;
    (f) continuously controlling light in at least one first light printer, for continuously positively shaping and depositing, under the influence of at least one of pressure and heat, from a meltable powder a plurality of planar insulative film paths on said second face of said metal foil of said at least tri-layered sandwich construction, said plurality of insulative film paths forming at least one repetitive etchant resistive film pattern (each of which) having an outline defining the outline of at least one repetitive conductor path pattern to be successively provided on said substrate;
    (g) continuously etching the thus insulativley film-patternized sandwich construction;

(h) continuously drying the etched construction;

(i) repetitively providing severing cuts or perforations in the construction for facilitating its division into individual planar electrical circuits.

5. The method as defined in claim 4, further including, prior to step d., the step of (k) bonding said sealing layer to one of said first faces.

6. The method as defined in claim 4, further including the step of l. continuously depositing application specific prints on said second face of said substrate.

7. The method as defined in claim 6, wherein said continuous deposition of application specific prints is effected by continuously controlling light in at least one second light printer, for continuously creating and depositing, under the influence of at least one of pressure and heat, from at least one toner powder said prints on said second face of said substrate.

8. The method as defined in claim 7, wherein both said depositing of a plurality of planar insulative film paths on said second face of said metal foil and said depositing prints on said second face of said substrate are carried out under computer control at a defined register relationship to each other, so that in every finished circuit at least one conductive path pattern is arranged at a well-defined register superposition with at least one print.

9. The method as defined in claim 4, further including, prior to step g., the step of m. treating at least one face of said substrate with at least one of a coating and an impregnating material so as to develop at least one of a protective effect and a high resistance against wetting of said substrate.

10. The method as defined in claim 9, wherein said at least one of a coating and impregnating material is selected to have the capability of at least one of diffusing into said substrate;

repelling a liquid;

enhancing the brilliancy of prints once deposited on said substrate.

11. The method as defined in claim 4, further including, prior to step g., the step of n. treating said sandwich construction with an etchant repellant so as to protect at least said second face of said flexible insulative substrate from agression or degradation under the influence of the etchant.

12. The method as defined in claim 11, wherein said treating with an etchant repellant includes at least one of the steps n.1. bringing in contact said flexible insulative substrate and an etchant repellant impregnating means to thus etchant resistively impregnate at least at certain part of its thickness said substrate;

n.2. covering said second face of said flexible insulative substrate with a liquid impervious film.

13. The method as defined in claim 4, further including the steps of o. prior to step f. continuously providing an insulative transfer sheet;

p. within step f.

p.1. continuously light-printing from said powder said plurality of planar insulative film paths on said transfer sheet;

p.2. continuously bringing in an at least touching superposition said second face of said metal foil of said sandwich construction and said transfer sheet such, that said planar insulative film paths become trapped between said second face of said metal foil and said transfer sheet, thereby forming a laminatable combination;

p.3. continuously laminating the laminatable combination under the influence of at least one of controlled pressure and heat;

p.4. continuously removing said transfer sheet from said sandwich construction, thereby leaving said planar insulative film paths on said second face of said metal foil of said sandwich construction.

14. The method as defined in claim 13, wherein said transfer sheet configures as an endlessly recirculating web loop.

15. The method as defined in claim 13, further including the step of q. continuously treating said transfer sheet, together with said planar insulative film paths light-printed thereon, in at least one corona field, prior to step p.2..

16. The method as defined in claim 4, further including, after step g., the step of r. continuously recreating the sealing capability of said sealing layer in all places in which the metal has been removed, by chemically treating the construction, so that recreated portions of said sealing layer can be activated a second time.

17. The method as defined in claim 4, further including, after step h., the step of s. continuously recreating the sealing capability of said sealing layer in all places in which the metal has been removed, by subjecting the dried construction to at least one corona field, so that recreated portions of said sealing layer can be activated a second time.

18. The method as defined in claim 4, further including, after step h., the steps of t. continuously providing at least one insulative tape usable to form an insulative strip;

u. continuously positioning and depositing said insulative strip over at least part of the area of the etched and dried construction so that said insulative strip covers at least part of said planar insulative film and conductor paths of any circuit in generation.

19. The method as defined in claim 4, further including, after step h., the steps of v. continuously bringing into an aligned superposition equal faces of the dried construction such, that at least first (e.g. upper) and second (e.g. lower) individual paths of said at least one planar conductor path pattern become mutually aligned in a predetermined relationship to each other and spaced from each other by at least the double width of said planar insulative paths, so that at least first and second conductor paths become trapped between said flexible, insulative substrate having thus outwardly disposed its second face, and so that at least one capacitance is formed between mutually superimposed first and second conductor paths;

w. in at least one step continuously laminating said superposed construction by at least once activating said sealing layer for a second time.

20. The method as defined in claim 4, further including the step of
    x. continuously providing on said sandwich construction, along at least one desired line in the direction of its advance, through at least a first layer of said sandwich construction, repetitive perforations, or—at certain repetitive spacings—respective repetitive cuts, or repetitive openings, in which the respective layer is substantially absent.

21. The method as defined in claim 20, further including the step of
    y. continuously providing through at least a second layer of said sandwich construction—and substantially centered at the center line of perforations or openings or cuts through at least a first layer of said construction—distinctly differently shaped perforations, or repetitive openings, in which the respective layer is substantially absent.

22. The method as defined in claim 4, further including the step of
    z. continuously positioning and depositing an endless conductive means over defined portions of said insulative paths on said at least one conductor path pattern.

23. The method as defined in claim 19, further including, prior to step v., the step of
    aa. continuously providing at least one insulative tape usable to form an insulative strip;
    bb. continuously positioning and depositing said insulative tape over at least part of the area of the etched and dried construction so that an insulative strip covers at least part of said planar insulative film and conductor paths of any circuit in generation, so
        that after said mutually aligned superposition of equal faces of said construction certain respective first and second portions of said first an second conductor paths are spaced at least by a tri-layered sandwich composition of said insulative paths and said additional insulative strip per circuit, so
        that the greatest effective thickness of an insulative layer is substantially provided in certain flat spaces between at least first and second mutual alignment opposing first and second conductor paths, rather than in their lateral spaces.

24. The method as defined in claim 23, wherein
    said additional dielectric strip has a critical temperature for plastification which is higher than the respective temperature of said insulative path patterns, and wherein
    said additional dielectric strip substantially maintains its dimensional shape under temperature and pressure conditions under which said insulative paths laminate and thus bifacially bond said additional dielectric strip to certain respective first and second portions of said first an second conductor paths.

25. The method as defined in claim 4, wherein
    said sealing layer is formed of an insulative material and composed and constructed to perform etchant impervious.

26. The method as defined in claim 4, wherein
    said sealing layer has resealing capabilities under the influence of at least one of pressure and heat.

27. The method as defined in claim 18, including the step of
    cc. extruding said additional insulative tape from a thermoplastic material on demand prior to its deposition on said at least one insulative path pattern.

28. The method as defined in claim 4, wherein
    etching is performed at an extent, that respective conductive paths are narrower than masking insulative paths covering their face top.

29. The method as defined in claim 6, wherein
    the step of continuously depositing application specific prints includes at least the step of
    dd. continuously printing coded or identifying information on said second face of said substrate, which print appears readible at least in a special (e.g. actinic light.

30. The method as defined in claim 19, wherein
    at least one of controlled pressure and controlled heat is applied in the lamination step w. for sealing said sealing layer a second time.

31. The method as defined in claim 19, wherein
    step w. includes the step of
    ee. feeding the construction between at least first and second laminating cylinders having at least one of a controllable pressure against each other and controlled temperatures.

32. The method as defined in claim 19, wherein
    at least one of controlled pressure and controlled heat are applied in the lamination step for thinning the average thickness of at least one insulative layer at least in part spacing at least part of first and second conductor paths.

33. The method as defined in claim 19, wherein
    predominantly capacitively effective portions of said first and second conductor paths are provided with a plurality of etched openings being arranged on said portions according to a raster scheme.

34. The method as defined in claim 19, further including the step of
    ff. selectively injecting a certain amount of heat into predominantly capacitively effective portions of said first and second conductor paths to thereby influence, under defined pressure in at least one lamination step, the effective average thickness of at least one insulative layer spacing certain superposed portions of said first and second conductor paths.

35. The method as defined in claim 34, wherein
    said selective heat injection is effected by at least one high frequency electromagnetic energy field emitter to which the construction is subjected and which can be fed with high frequency power from a high frequency power source.

36. The method as defined in claim 34 , further including the step of
    gg. passing, at least one of shortly prior to and when laminating pressure is applied, said construction said at least one selective heat injecting device which is supplied with operation power at least between certain instants of time.

37. The method as defined in claim 36, wherein
    said at least one selective heat injection device is designed and arranged so that it is capable of injecting heating power to an arbitrarily selectable track of said construction.

38. The method as defined in claim 35, further including the step of
  hh. duty cycle controlling said high frequency energy source for repetitively switching it on and off for responsively injecting that specific amount of heat into said capacitively effective conductor path portions which amount is useful for reaching and maintaining a desired radio frequency response of finished circuits.

39. The method as defined in claim 38, wherein said duty cycle control is accomplished in response to sample values of at least one typical radio frequency response acquired from finished circuits, which sample values are put in as actual values to a closed servo loop for duty cycle control.

40. The method as defined in claim 35, further comprising the step of
  ii. changing at least one of
    the location,
    the orientation,
    the polarization
    of said electromagnetic energy emitter responsive to sample values of at least one typical radio frequency response acquired from finished electrical circuits and put in as actual values to a closed servo loop for controlling said change.

41. The method as defined in claim 35, further including the steps of
  kk. feeding said construction on a non-conductive combined tuning and laminating cylinder having the shape of a hollow tube and being heated up to a base temperature;
  ll. having said construction pass on the circumference of said cylinder said at least one electromagnetic energy emitter being arranged in at least one of the interior and the exterior of said hollow combined tuning and laminating cylinder;
  mm. laminating the heated and selectively heated up construction between said combined tuning and laminating cylinder and at least a second cylinder under controlled pressure and heat.

42. The method as defined in claim 34, further including the step of
  nn. controlling said base temperature at least responsive to cylinder revolution speed.

43. The method as defined in claim 19, further including the step of
  oo. subjecting the construction to an at least repetitive connecting process for at least one conductive connection per circuit of at least one first conductor path portion of a first conductor path pattern to at least one second conductor path portion of a second conductor path pattern.

44. The method as defined in claim 22, further including the step of
  pp. subjecting the construction to an at least repetitive connecting process for at least one conductive connection per circuit of at least one conductor path portion to said endless conductive means.

45. The method as defined in claim 4, further including the step of
  qq. continuously depositing on at least a part of one face of the laminated and etched construction an adhesive layer;
  rr. continuously covering at least said adhesive layer with a continuous peel-off strip;
  ss. continuously rolling up the resulting sandwich composition to a supply roll for the self-adhesive disposal of individual electrical circuits.

46. The method as defined in claim 4, further including the step of
  tt. providing in the construction at least one opening per individual circuit.

47. The method as defined in claim 19, further including the step of
  uu. melt-sealing the face covers (i.e. the outwardly disposed substrate) of said construction along the margins of finished electrical circuits so that a welding seam for enhanced tear resistance is effected along at least a part of the outline of planar electrical circuits.

48. The method as defined in claim 4, wherein said meltable powder contains an olefin component.

49. The method as defined in claim 13, wherein said transfer sheet is heated up to a predetermined temperature at least within a certain embracing angle on the circumference of at least one cylinder prior to the laminating touch with said metal face of said sandwich construction.

50. The method as defined in claim 13, wherein said metal foil of aid sandwich construction is heated up to a predetermined temperature within a certain embracing angle on the circumference of at least one cylinder prior to the laminating touch with said transfer sheet.

51. The method as defined in claim 13, wherein said metal foil of said sandwich construction—by way of electromagnetic induction—is heated up to a controllably predetermined temperature prior to the laminating touch with said transfer sheet.

52. The method as defined in claim 13, wherein said transfer sheet is made subject to a coating with an ultra thin layer of a substance, which substance layer effects a much lower affixation of said insulative film patterns to said transfer sheet than becomes active between said insulative film powder patterns and said metal face of said sandwich construction.

53. The method as defined in claim 4, further including at least one of the additional steps of
  vv. providing perforations at least in said substrate;
  ww. cutting notches at least in said substrate.

54. The method as defined in claim 4, wherein the structure of said substrate is based on a spunbonded polymer.

55. The method as defined in claim 4, wherein said substrate is constructed on the basis of a tissue-like compound formed of a spunbonded polymer reenforced by at least one of a composite spunbonded and mixbonded polyester component.

56. The method as defined in claim 4, wherein said sealing layer is made from polyethylene.

57. The method as defined in claim 13, wherein said endlessly recirculating web is based on an aramide fibre.

58. The method as defined in claim 4, after step e. further including the step of
  xx. continuously providing said at least tri-layered sandwich construction with suitable pilot means for a repetitively precise transportation and later aligned superposition of equal faces of said construction.

59. The method as defined in claim 58, wherein said pilot means include at least one of at least one opening per electrical circuit cut into at least said substrate;
at least one line of perforations provided along said substrate;
grip holes provided along said substrate.

60. The method as defined in claim 6, prior to step 1. further including the steps of
yy. continuously providing position prints on said substrate, and
zz. depositing said application specific prints on said substrate in a repetitive registration with respect to said continuous position prints previously provided thereon.

61. A method of construction planar electrical circuits of arbitrary design and shape and comprising conductive paths to form at least one conductor path pattern arranged on an insulative carrier sheet, said method comprising at least the steps of:
(a) providing a substrate having a first and a second face and—at least over part of its thickness—being insulative;
(b) providing a printing substance having properties and shape to replace the material and constructive function of a printing toner within an electrophotographic printing system;
(c) defining and positively forming, by way of an electrophotographic printing process, from said printing substance at least one mask pattern, the outline of which defining the outline of said at least one conductor path pattern to be generated;
(d) utilizing said mask pattern for forming, on at least one face of said substrate, said at least one conductor path pattern;
(e) finally shape-cutting the thus obtained construction to obtain individual planar electrical circuits having conductive paths on an insulative carrier sheet.

62. A method of constructing planar electrical circuits of arbitrary design and shape and comprising, on the first face of an insulative sheet, conductive paths to form at least one conductive pattern, and further comprising, on the second face of said sheet, an application specific preparation, said method comprising at least the steps of:
(a) providing a sheet having a first and a second face and consisting of various layers and being—at least over part of its total thickness—insulative;
(b) at least one time application specifically treating said second face of said sheet;
(c) providing a printing substance having properties and shape to replace both material and constructive function of a commonly known toner within an electrophotographic printing system;
(d) defining and positively forming, by way of an electrophotographic printing process, from said printing substance at least one mask pattern, the outline of which defining the outline of said at least one conductive pattern to be generated;
(e) utilizing said mask pattern for forming, on the first face of said application specifically treated sheet, said at least one conductive pattern;
(f) at least one time further application specifically treating the thus obtained construction;
(g) finally shape-cutting the thus obtained construction to obtain individual planar electrical circuits.

63. The method as defined in claim 61, wherein said printing substance configures as a triboelectrically chargeable powder that can be fixed to form a compact film under the influence of at least one of pressure and heat.

64. The method as defined in claim 61, wherein the step of forming said at least one conductive pattern includes the step of
etching the patternized substrate.

65. The method as defined in claim 61, wherein the step of forming said at least one conductive pattern includes the step of
subjecting the patternized substrate to an electrodepositing process.

66. The method as defined in claim 65, wherein one of the two faces of said substrate is conductive and patternizing is carried out on the conductive face.

67. The method as defined in claim 61, wherein prior to step (e) the so far obtained construction is subjected to at least one further production step for providing an application specific preparation of said circuits.

68. The method as defined in claim 62, wherein said printing substance configures as a triboelectrically chargeable powder that can be fixed to form a compact film pattern under the influence of at least one of pressure and heat.

69. The method as defined in claim 62, wherein step (b) of at least one time application specifically treating said second face of said sheet includes at least one of the following additional steps:
At least one time printing said second face;
applying a protective material to said second face for thus making at least one of
said second face liquid repellant and
said substrate liqid impervious.

70. The method as defined in claim 62, wherein said electrophotographic light printing process is carried out on an intermediate carrier (688), from which carrier said mask pattern in a second step is transferred onto said first face of said sheet.

71. The method as defined in claim 62, wherein step (f) includes at least one of the following additional steps:
drying, and
corona treating (591), and
printing (593), and
connecting with a film print (611, 613), and
coating (614, 616) with an adhesive (615), and
covering with a protective layer (621, 634).

72. The method as defined in claim 62, behind step (e) further comprising at least one of the following steps applied to the first face of said sheet:
covering with a dielectric sheet (9, 84, 112), and
covering with a strip- or tape-like insulative material (9, 84, 112, 598), and
depositing thereon a conductive ribbon or wire (236), and
superposing said at least one conductive pattern to at least another corresponding conductive pattern on a respective other first face of a respective other sheet so that said both conductive patterns become insulatively spaced from one another and oppose each other in a defined alignment with respect to each other.

* * * * *